(12) United States Patent
Kamimura et al.

(10) Patent No.: US 11,393,812 B2
(45) Date of Patent: Jul. 19, 2022

(54) SEMICONDUCTOR DEVICE AND METHOD OF MANUFACTURING SEMICONDUCTOR DEVICE

(71) Applicant: FUJI ELECTRIC CO., LTD., Kanagawa (JP)

(72) Inventors: Kazuki Kamimura, Matsumoto (JP); Motoyoshi Kubouchi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 349 days.

(21) Appl. No.: 16/224,796

(22) Filed: Dec. 19, 2018

(65) Prior Publication Data

US 2019/0206860 A1    Jul. 4, 2019

(30) Foreign Application Priority Data

Dec. 28, 2017  (JP) .............................. JP2017-253184
Nov. 22, 2018  (JP) .............................. JP2018-219144

(51) Int. Cl.
*H01L 29/861*   (2006.01)
*H01L 29/66*    (2006.01)
(Continued)

(52) U.S. Cl.
CPC ...... *H01L 27/0664* (2013.01); *H01L 21/8249* (2013.01); *H01L 29/0623* (2013.01); *H01L 29/407* (2013.01); *H01L 29/66136* (2013.01); *H01L 29/66348* (2013.01); *H01L 29/7302* (2013.01); *H01L 29/7397* (2013.01); *H01L 29/8611* (2013.01); *H01L 29/8613* (2013.01); *H01L 21/2253* (2013.01); *H01L 21/266* (2013.01); *H01L 21/26513* (2013.01); *H01L 27/0635* (2013.01)

(58) Field of Classification Search
CPC ............. H01L 29/8725; H01L 29/7397; H01L 29/8611; H01L 29/66136; H01L 29/66348; H01L 29/7302
See application file for complete search history.

(56) References Cited

U.S. PATENT DOCUMENTS 4,079,407 A * 3/1978 Hutson ................. H01L 21/764
                                                    257/120
4,689,647 A * 8/1987 Nakagawa .......... H01L 29/0834
                                                    257/140
(Continued)

FOREIGN PATENT DOCUMENTS

JP      2011114027 A    6/2011
JP      2012129504 A    7/2012
(Continued)

*Primary Examiner* — Sophia T Nguyen

(57) ABSTRACT

A semiconductor device including a diode region provided in a semiconductor substrate is provided, the diode region including a base region of a first conductivity type exposed on an upper surface of the semiconductor substrate, a cathode region of a second conductivity type exposed on a lower surface of the semiconductor substrate, an intercathode region of a first conductivity type exposed on the lower surface of the semiconductor substrate and alternately arranged with the cathode region in a predetermined direction, and a floating region of a second conductivity type provided above the cathode region and above the intercathode region.

8 Claims, 40 Drawing Sheets

(51) Int. Cl.
  *H01L 29/739* (2006.01)
  *H01L 29/73* (2006.01)
  *H01L 27/06* (2006.01)
  *H01L 21/8249* (2006.01)
  *H01L 29/40* (2006.01)
  *H01L 29/06* (2006.01)
  H01L 21/225 (2006.01)
  H01L 21/266 (2006.01)
  H01L 21/265 (2006.01)

(56) References Cited

U.S. PATENT DOCUMENTS

| | | | | |
|---|---|---|---|---|
| 5,360,984 | A * | 11/1994 | Kirihata | H01L 27/0617 257/139 |
| 5,485,030 | A * | 1/1996 | Terashima | H01L 29/0649 257/E29.328 |
| 5,572,048 | A * | 11/1996 | Sugawara | H01L 27/0716 257/132 |
| 5,861,639 | A * | 1/1999 | Bernier | H01L 29/7404 257/157 |
| 6,259,123 | B1 | 7/2001 | Kelberlau | H01L 29/0834 257/107 |
| 6,475,864 | B1 * | 11/2002 | Sato | H01L 29/0634 438/268 |
| 6,724,042 | B2 * | 4/2004 | Onishi | H01L 29/0634 257/341 |
| 8,288,824 | B2 * | 10/2012 | Tsuzuki | H01L 29/0834 438/328 |
| 9,018,674 | B2 * | 4/2015 | Werber | H01L 29/0834 257/124 |
| 9,773,923 | B2 * | 9/2017 | Onozawa | H01L 29/32 |
| 10,083,956 | B2 * | 9/2018 | Ogura | H01L 27/0635 |
| 10,243,039 | B2 * | 3/2019 | Bolotnikov | H01L 29/6606 |
| 10,340,373 | B2 * | 7/2019 | Luo | H01L 29/0804 |
| 10,658,499 | B2 * | 5/2020 | Shinsho | H01L 23/482 |
| 10,756,181 | B1 * | 8/2020 | Kawakami | H01L 29/7397 |
| 2009/0032851 | A1 * | 2/2009 | Pfirsch | H01L 29/7397 257/288 |
| 2009/0152667 | A1 * | 6/2009 | Rieger | H01L 29/0634 257/488 |
| 2009/0267200 | A1 * | 10/2009 | Gutt | H01L 29/0615 257/E21.334 |
| 2009/0289276 | A1 * | 11/2009 | Yoshiura | H01L 29/861 257/133 |
| 2011/0024791 | A1 * | 2/2011 | Schulze | H01L 29/0834 257/107 |
| 2011/0193132 | A1 * | 8/2011 | Kouno | H01L 29/0696 257/139 |
| 2012/0132954 | A1 * | 5/2012 | Kouno | H01L 29/0619 257/140 |
| 2012/0319136 | A1 * | 12/2012 | Noborio | H01L 29/1095 257/77 |
| 2013/0075783 | A1 * | 3/2013 | Yamazaki | H01L 29/36 257/139 |
| 2013/0264607 | A1 * | 10/2013 | Werber | H01L 29/0834 257/124 |
| 2014/0048847 | A1 * | 2/2014 | Yamashita | H01L 29/36 257/140 |
| 2014/0070270 | A1 * | 3/2014 | Yoshida | H01L 29/7395 257/140 |
| 2014/0175459 | A1 * | 6/2014 | Yamamoto | H01L 29/66068 257/77 |
| 2014/0306283 | A1 * | 10/2014 | Nakajima | H01L 29/0834 257/329 |
| 2015/0132895 | A1 * | 5/2015 | Kamijo | H01L 29/7397 438/138 |
| 2015/0179636 | A1 * | 6/2015 | Pfirsch | H01L 29/66348 257/140 |
| 2015/0200247 | A1 * | 7/2015 | Schmidt | H01L 21/324 257/140 |
| 2015/0206758 | A1 * | 7/2015 | Kato | H01L 21/263 438/459 |
| 2015/0262999 | A1 * | 9/2015 | Ogura | H01L 29/861 257/140 |
| 2015/0340965 | A1 * | 11/2015 | Hirao | H02M 7/537 363/131 |
| 2015/0364613 | A1 * | 12/2015 | Onozawa | H01L 21/221 257/481 |
| 2016/0035867 | A1 * | 2/2016 | Pfirsch | H01L 29/407 257/140 |
| 2016/0071964 | A1 * | 3/2016 | Kitagawa | H01L 29/7397 257/132 |
| 2016/0079236 | A1 * | 3/2016 | Tamaki | H01L 29/1095 257/140 |
| 2016/0093690 | A1 * | 3/2016 | Falck | H01L 29/66136 257/139 |
| 2016/0181391 | A1 * | 6/2016 | Bobde | H01L 29/66136 438/270 |
| 2016/0211257 | A1 * | 7/2016 | Yoshida | H01L 29/7397 |
| 2016/0260703 | A1 * | 9/2016 | Nakamura | H01L 29/0619 |
| 2016/0329323 | A1 * | 11/2016 | Iwasaki | H01L 29/0821 |
| 2017/0025522 | A1 * | 1/2017 | Naito | H01L 29/407 |
| 2017/0047319 | A1 * | 2/2017 | Naito | H01L 21/265 |
| 2017/0117394 | A1 * | 4/2017 | Pfirsch | H01L 29/083 |
| 2017/0141103 | A1 * | 5/2017 | Kameyama | H01L 29/861 |
| 2017/0271447 | A1 * | 9/2017 | Tamura | H01L 21/263 |
| 2017/0352747 | A1 * | 12/2017 | Sumitomo | H01L 27/0727 |
| 2017/0373141 | A1 * | 12/2017 | Yoshida | H01L 21/8234 |
| 2018/0012762 | A1 * | 1/2018 | Mukai | H01L 29/36 |
| 2018/0012982 | A1 * | 1/2018 | Shinsho | H01L 29/41 |
| 2018/0083131 | A1 * | 3/2018 | Tamaki | H01L 27/0623 |
| 2018/0190649 | A1 * | 7/2018 | Laven | H01L 29/1095 |
| 2018/0197977 | A1 * | 7/2018 | Kouno | H01L 27/0664 |
| 2018/0226399 | A1 * | 8/2018 | Tamaki | H01L 29/7397 |
| 2018/0294258 | A1 * | 10/2018 | Kamibaba | H01L 29/66136 |
| 2019/0067462 | A1 * | 2/2019 | Tamura | H01L 29/32 |
| 2019/0074367 | A1 * | 3/2019 | Naito | H01L 29/66136 |
| 2019/0096989 | A1 * | 3/2019 | Yoshida | H01L 29/063 |
| 2019/0148500 | A1 * | 5/2019 | Agata | H01L 29/7397 257/655 |
| 2019/0206860 | A1 * | 7/2019 | Kamimura | H01L 29/7302 |
| 2019/0214379 | A1 * | 7/2019 | Senoo | H01L 29/7397 |
| 2019/0228973 | A1 * | 7/2019 | Kimura | H01L 29/1095 |
| 2019/0252534 | A1 * | 8/2019 | Murakawa | H01L 29/407 |
| 2019/0259747 | A1 * | 8/2019 | Gejo | H01L 29/0623 |
| 2019/0296132 | A1 * | 9/2019 | Tamaki | H01L 29/0692 |
| 2019/0326119 | A1 * | 10/2019 | Yoshimura | H01L 29/32 |
| 2019/0386125 | A1 * | 12/2019 | Sato | H01L 29/861 |
| 2020/0135593 | A1 * | 4/2020 | Takishita | H01L 29/66136 |
| 2020/0243673 | A1 * | 7/2020 | Shinsho | H01L 29/7394 |
| 2020/0251587 | A1 * | 8/2020 | Fischer | H01L 29/063 |
| 2020/0381424 | A1 * | 12/2020 | Shukla | H01L 27/0255 |
| 2021/0050435 | A1 * | 2/2021 | Naito | H01L 29/8613 |
| 2021/0066288 | A1 * | 3/2021 | Rahimo | H01L 27/0664 |

FOREIGN PATENT DOCUMENTS

| | | |
|---|---|---|
| JP | 2017176688 A | 10/2017 |
| WO | 2014156849 A1 | 10/2014 |
| WO | 2016063683 A1 | 4/2016 |

* cited by examiner

SEMICONDUCTOR DEVICE AND METHOD OF MANUFACTURING SEMICONDUCTOR DEVICE

The contents of the following Japanese patent application(s) are incorporated herein by reference:
NO. 2017-253184 filed in JP on Dec. 28, 2017, and
NO. 2018-219144 filed in JP on Nov. 22, 2018.

BACKGROUND

1. Technical Field

The present invention relates to a semiconductor device and a method of manufacturing the semiconductor device.

Conventionally, it has been known that a diode is provided with a P type buried layer (for example, refer to Patent Document 1). Also, it has been known that in a semiconductor device including a Super Junction-Metal Oxide Semiconductor Field Effect Transistor (SJ-MOSFET) portion and an Insulated Gate Bipolar Transistor (IGBT) portion on one semiconductor chip, the SJ-MOSFET portion is provided with a P type floating region (for example, refer to Patent Document 2).

PRIOR ART LITERATURE

Patent Document

[Patent Document 1] PCT International Publication No. WO2014/156849
[Patent Document 2] PCT International Publication No. WO2016/063683

In a diode, it is preferable that a carrier injection amount from a cathode can be adjusted with high accuracy.

SUMMARY

In a first aspect of the present invention, a semiconductor device in which a diode region is provided in a semiconductor substrate is provided. The diode region may be provided with a base region of a first conductivity type exposed on an upper surface of the semiconductor substrate. The diode region may be provided with a cathode region of a second conductivity type exposed on a lower surface of the semiconductor substrate. The diode region may be provided with an inter-cathode region of a first conductivity type exposed on the lower surface of the semiconductor substrate and alternately arranged with the cathode region in a predetermined direction. The diode region may have a floating region of a second conductivity type provided above the cathode region and above the inter-cathode region.

The semiconductor device may include a transistor region that is provided in the semiconductor substrate and arranged next to the diode region in a top view of the semiconductor substrate.

The inter-cathode region and the floating region may be arranged apart from each other in a depth direction of the semiconductor substrate.

The diode region may be have a dummy trench portion provided extending in an extending direction on the upper surface of the semiconductor substrate. The cathode region and the inter-cathode region may be alternately arranged in the extending direction.

In the diode region be provided to a portion n, the cathode region may deeper than the inter-cathode region, with the lower surface of the semiconductor substrate as a reference.

In the depth direction of the semiconductor substrate, a distance between an upper end portion of the cathode region and a lower end portion of the floating region may be shorter than a distance between an upper end portion of the inter-cathode region and a lower end portion of the floating region.

In the top view of the semiconductor substrate, an area of the floating region provided in the diode region may be larger than an area of the cathode region. In the top view of the semiconductor substrate, an area of the inter-cathode region provided in the diode region may be larger than the area of the cathode region.

In a second aspect of the present invention, a method of manufacturing a semiconductor device is provided. The semiconductor device may include a transistor region and a diode region on one semiconductor substrate. The method of manufacturing the semiconductor device may include an implantation step for a collector region, an implantation step for a cathode region and an implantation step for a floating region. At the implantation step for the collector region, a dopant of a first conductivity type may be implanted in a lower surface of the semiconductor substrate to form the collector region in the transistor region. At the implantation step for the cathode region, a dopant of a second conductivity type may be implanted in the lower surface of the semiconductor substrate to form the cathode region in the diode region. The implantation step for the floating region may be after the implantation step for the cathode region. At the implantation step for the floating region, the dopant of the first conductivity type may be implanted in the lower surface of the semiconductor substrate to form the floating region of the first conductivity type provided in the diode region.

The implantation step for the cathode region may be performed after the implantation step for the collector region. Instead of this, the implantation step for the collector region may be performed after the implantation step for the cathode region, and the implantation step for the floating region may be performed after the implantation step for the collector region. Further, instead of this, the implantation step for the collector region may also be performed after the implantation step for the floating region.

In a third aspect of the present invention, another method of manufacturing a semiconductor device is provided. The semiconductor device may include a transistor region and a diode region on one semiconductor substrate. The other method of manufacturing the semiconductor device may include an implantation step for a collector region, an implantation step for a floating region and an implantation step for a cathode region. At the implantation step for the collector region, a dopant of a first conductivity type may be implanted in a lower surface of the semiconductor substrate to form the collector region in the transistor region. At the implantation step for the floating region, the dopant of the first conductivity type may be implanted in the lower surface of the semiconductor substrate to form the floating region of the first conductivity type provided in the diode region. The implantation step for the cathode region may be after the implantation step for the collector region and the implantation step for the floating region. At the implantation step for the cathode region, a dopant of a second conductivity type may be implanted in the lower surface of the semiconductor substrate to form the cathode region in the diode region.

The implantation step for the floating region may be performed after the implantation step for the collector region and the implantation step for the cathode region may be performed after the implantation step for the collector region. Instead of this, the implantation step for the collector region may be performed after the implantation step for the floating region. Further, instead of this, the implantation step for the collector region may also be performed after the implantation step for the cathode region.

After the implantation step for the collector region, the implantation step for the cathode region and the implantation step for the floating region, an end portion of the floating region may not reach a boundary between the collector region and the cathode region. The end portion of the floating region may be an end portion of the floating region that is the closest to the boundary between the collector region and the cathode region. The end portion of the floating region may not reach the boundary between the collector region and the cathode region in a direction parallel to an array direction of the cathode region and the collector region toward the collector region from the cathode region. The floating region may be positioned within the diode region.

Alternatively, after the implantation step for the collector region, the implantation step for the cathode region and the implantation step for the floating region, the end portion of the floating region may also be positioned on the boundary between the collector region and the cathode region. The end portion of the floating region may be an end portion of the floating region that is the closest to the boundary between the collector region and the cathode region. The end portion of the floating region may be positioned on the boundary between the collector region and the cathode region in the direction parallel to the array direction of the cathode region and the collector region toward the collector region from the cathode region.

A lower end portion of the floating region may be closer to an upper surface of the semiconductor substrate than an upper end portion of the collector region.

After the implantation step for the collector region, the implantation step for the cathode region and the implantation step for the floating region, at least a part of the floating region may be positioned within the cathode region.

The cathode region may have at least two peaks of an electron concentration at different positions in a depth direction toward the upper surface from the lower surface. A peak position of a hole concentration in the floating region may be positioned between two peaks among the at least two peaks of the electron concentration in the cathode region in the depth direction.

The lower end portion of the floating region may be spaced apart from an upper end portion of the cathode region.

After the implantation step for the collector region, the implantation step for the cathode region and the implantation step for the floating region, the upper end portion of the cathode region may be closer to the upper surface of the semiconductor substrate than the upper end portion of the collector region. The implanting for the cathode region includes implanting a dopant of a second conductivity type in a partial region of the lower surface of the semiconductor substrate to form, in the diode region, the cathode region and an inter-cathode region of a first conductivity type alternately arranged with the cathode region in a predetermined direction.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

In the present specification, one side of a direction parallel to a depth direction of a semiconductor substrate is referred to as an "upper" side, and the other side is referred to as a "lower" side. One surface of two main surfaces of a substrate, a region, a layer or another member is referred to as an upper surface, and the other surface is referred to as a lower surface. The "upper" and "lower" directions are not limited to the gravity direction or a mounting direction when mounting the semiconductor device on a wiring substrate and the like.

In the present specification, technical matters may be described by using orthogonal coordinate axes of X axis, Y axis and Z axis. In the present specification, the X axis, Y axis and Z axis constitute a right-hand system. In the present specification, a surface parallel to the upper surface or the lower surface of the semiconductor substrate is taken as an X-Y plane, and a depth direction of the semiconductor substrate which is perpendicular to the upper surface or the lower surface of the semiconductor substrate is taken as the Z axis.

In the present specification, the first conductivity type is a P type and the second conductivity type is an N type; however, the first conductivity type may also be the N type and the second conductivity type may also be the P type. In this case, the conductivity types of the substrate, layers, regions and the like in each embodiment are respectively opposite conductivity types. Also, in the present specification, when a P+ type or an N+ type is described, it means that a doping concentration of the P+ type or the N+ type is higher than that of the P type or the N type, and when a P− type or an N− type is described, it means that a doping concentration of the P− type or the N− type is lower than that of the P type or the N type.

In the present specification, the doping concentration refers to a concentration of impurities transformed into a donor or transformed into an acceptor. In the present specification, a concentration difference between the donor and the acceptor may be referred to as a net doping concentration or merely a doping concentration. Also, a peak value of the doping concentration distribution may be referred to as the doping concentration.

Figure 1:
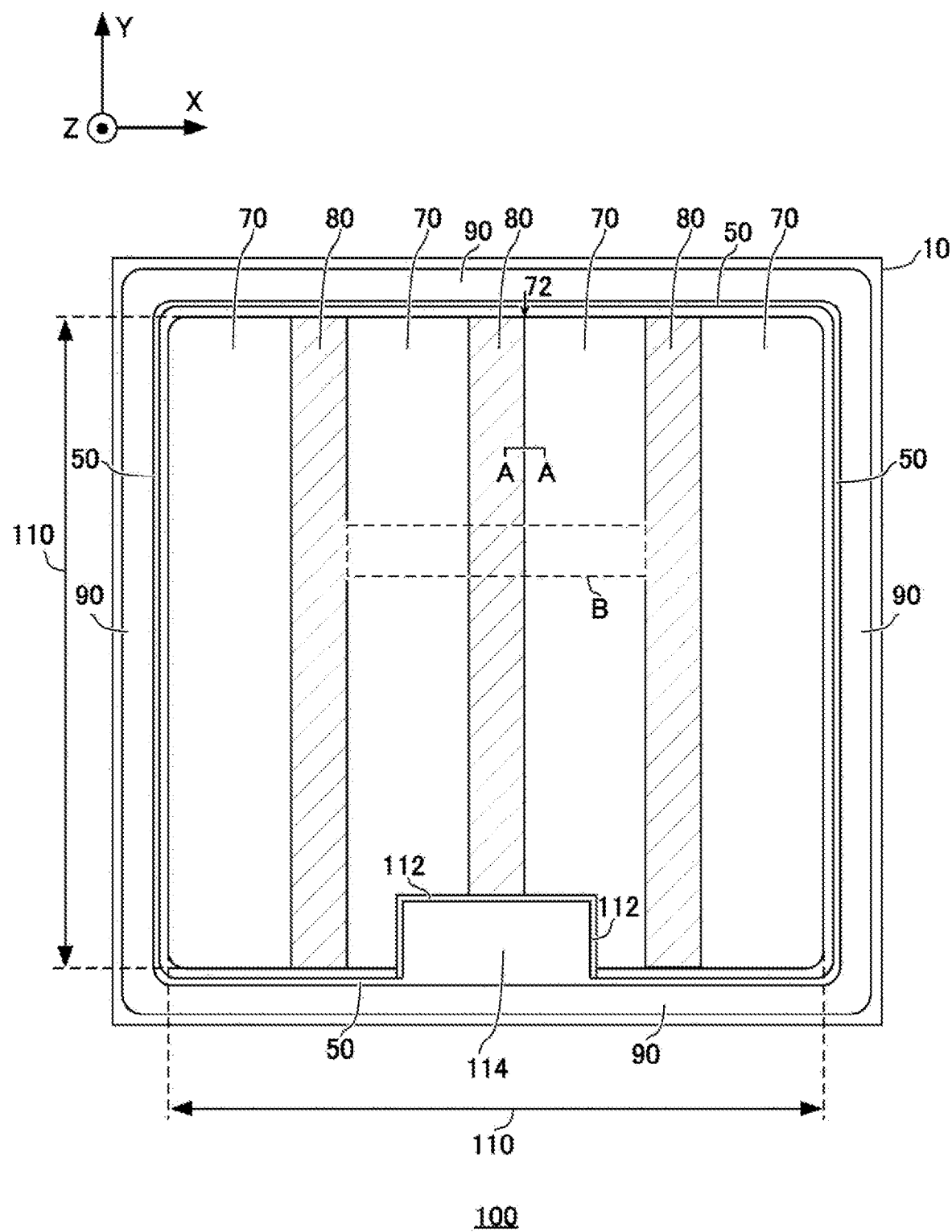
FIG. 1 shows a top view of a semiconductor device 100 according to one embodiment of the present invention.

FIG. 1 is a top view of a semiconductor device 100 according to one embodiment of the present invention. That is, FIG. 1 is a drawing of the semiconductor device 100 viewed from the upper surface side of the semiconductor substrate 10 and parallel to the Z axis. However, in FIG. 1, to easily understand an arrangement relation among respective regions, members such as an emitter electrode and a passivation film are appropriately omitted.

The semiconductor device 100 includes a semiconductor substrate 10. The semiconductor substrate 10 may be a silicon (Si) substrate, may be a silicon carbide (SiC) substrate, or may also be a nitride semiconductor substrate, such as gallium nitride (GaN), and the like. The semiconductor substrate 10 in the present embodiment is the silicon substrate. When using the silicon substrate, an N type dopant may be one or more types of elements of phosphorous (P) and arsenic (As), and a P type dopant may be one or more types of elements of boron (B) and aluminum (Al).

The semiconductor device 100 includes an active region 110, an edge termination structure region 90 and a gate runner portion 50. The active region 110 may include a transistor region in which main current flows between an upper surface and a lower surface of the semiconductor substrate 10 if a transistor provided in the semiconductor device 100 is in an ON state, and a diode region in which the main current flows between the upper surface and the lower surface of the semiconductor substrate 10 if the transistor is in an OFF state. Instead of this, the active region 110 may also be a region to which an emitter electrode is provided in the top view. The active region 110 of the present embodiment is a region excluding a pad region 112 among a region surrounded by the gate runner portion 50 in the top view.

The semiconductor device 100 of the present embodiment includes an IGBT region 70 and a Free Wheeling Diode (FWD) region 80 in the active region 110 of one semiconductor substrate 10. That is, the semiconductor device 100 of the present embodiment is an RC-IGBT. The IGBT region 70 is one example of the transistor region, and the FWD region 80 is one example of the diode region. In the present embodiment, the IGBT region 70 and the FWD region 80 are alternately arranged in the X-axis direction. Also, in the present embodiment, the IGBT regions 70 are provided on both ends of the active region 110 in the X-axis direction.

The IGBT region 70 may include a P+ type collector region in a region in contact with the lower surface of the semiconductor substrate 10. The IGBT region 70 of the present embodiment is positioned within the active region 110 and is a region provided with the collector region on the lower surface of the semiconductor substrate 10. The IGBT region 70 may be provided periodically with a unit structure, which includes an N+ type emitter region and a P+ type contact region, on the upper surface of the semiconductor substrate 10.

The FWD region 80 of the present embodiment is positioned within the active region 110 and is a region provided with an N+ type cathode region in a region in contact with the lower surface of the semiconductor substrate 10. The cathode region may also be retreated inside the active region 110 in the Y-axis direction in the vicinity of the gate runner portion 50 and the pad region 112. For example, an end portion of the cathode region in the Y-axis direction is positioned more inside the active region 110 than the gate runner portion 50 in the vicinity of the gate runner portion 50. However, even if the end portion of the cathode region in the Y-axis direction is positioned inside the active region 110, because a gate trench portion and the emitter region are not provided, a portion from one end portion of the gate runner portion 50 to the other end portion opposite to the one end portion in the Y-axis direction may be considered as the FWD region 80.

In the present embodiment, the boundary 72 between the IGBT region 70 and the FWD region 80 in the X-axis direction is the boundary between the cathode region and the collector region. In FIG. 1, taking an easy understanding of the drawing into account, only the boundary 72 crossing the line A-A is marked with the reference number.

The edge termination structure region 90 may be provided between the active region 110 and an outer peripheral end portion of the semiconductor substrate 10 in the top view. The edge termination structure region 90 may be arranged so as to surround the active region 110 on the upper surface of the semiconductor substrate 10. The edge termination structure region 90 of the present embodiment is arranged in a rectangular annular shape along the outer peripheral end portion of the semiconductor substrate 10. The edge termination structure region 90 may have a function for relaxing electric field concentration on the upper surface side of the semiconductor substrate 10. The edge termination structure region 90 may have any one of a guard ring, a field plate and a resurf, for example, or a structure that combines two or more thereof.

The gate runner portion 50 of the present embodiment is provided between the active region 110 and the edge termination structure region 90 in the top view. The gate runner portion 50 may transmit a gate signal supplied from a gate pad 114 to a gate trench portion of the IGBT region 70. The gate runner portion 50 may have a laminated structure of a metal layer and a polysilicon layer.

The metal layer of the gate runner portion 50 may be a metal layer formed of aluminum, aluminum-silicon alloy or aluminum-silicon-copper (Cu) alloy. The polysilicon layer of the gate runner portion 50 may be a polysilicon layer in which impurities such as phosphorous are doped.

An insulating film may be provided between the polysilicon layer of the gate runner portion 50 and the upper surface of the semiconductor substrate 10. Portions of the gate runner portion 50 excluding portions connected to the gate trench portion may be electrically separated from the semiconductor substrate 10 by the insulating film. Also, the metal layer of the gate runner portion 50 may be provided on the polysilicon layer. The metal layer may be connected to the polysilicon layer via a predetermined contact region (for example, an aperture region of an interlayer dielectric film).

The pad region 112 of the present embodiment is a region obtained by notching a part of the active region 110. That is, the pad region 112 of the present embodiment is not included in the active region 110. A range of the pad region 112 in the top view may be a range of a P+ type well region provided in a region in contact with the upper surface of the semiconductor substrate 10. The gate pad 114 may be provided in a range narrower than the P+ type well region. The gate pad 114 of the present embodiment is electrically connected to the gate runner portion 50. The gate signal may be supplied from outside the semiconductor device 100 to the gate pad 114.

Figure 2:
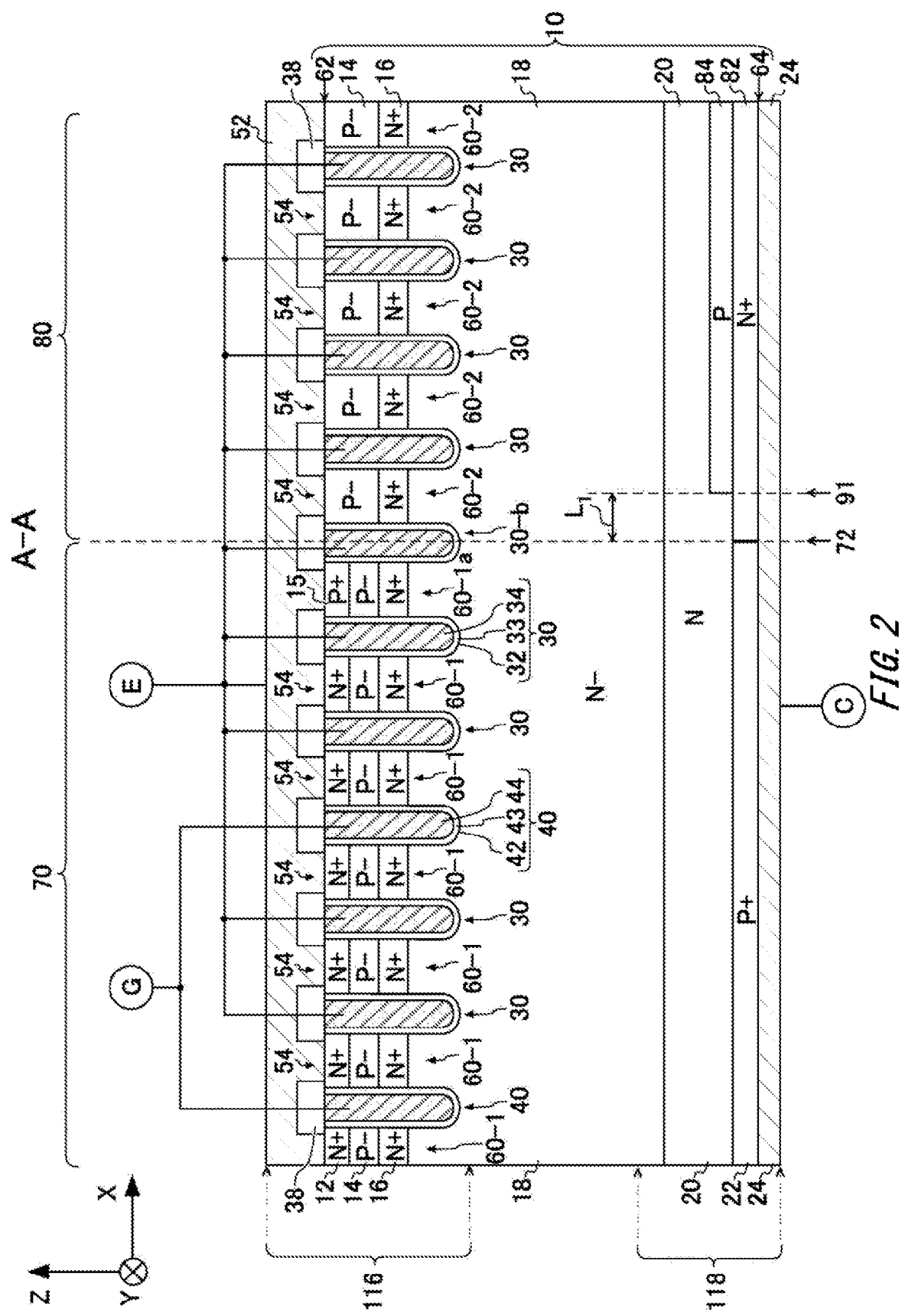
FIG. 2 shows a cross section view taken along line A-A of FIG. 1.

FIG. 2 is a drawing showing a cross section view taken along line A-A of FIG. 1. The cross section taken along line A-A is a cross section parallel to an X-Z plane passing through the boundary 72 between a collector region 22 of the IGBT region 70 and a cathode region 82 of the FWD region 80. At the cross section taken along line A-A, the semiconductor device 100 includes an emitter electrode 52, an interlayer dielectric film 38, a semiconductor substrate 10 and a collector electrode 24.

The interlayer dielectric film 38 may be formed of one or more types of materials among silicon dioxide ($SiO_2$), Boro-Phospho Silicate Glass (BPSG), Phosphorus Silicate Glass (PSG) and Borosilicate Glass (BSG). The interlayer dielectric film 38 of the present embodiment is provided on the dummy trench portion 30 and the gate trench portion 40. The interlayer dielectric film 38 of the present embodiment has a plurality of apertures 54. The aperture 54 may serve as a contact portion at which the emitter electrode 52 and an upper surface 62 of the semiconductor substrate 10 are electrically connected to each other.

The emitter electrode 52 and the collector electrode 24 may be formed of aluminum, aluminum-silicon alloy or aluminum-silicon-copper (Cu) alloy. The emitter electrode 52 and the collector electrode 24 may respectively have a barrier metal layer formed of titanium (Ti), titanium compound or the like in a lower layer. The upper surface 62 of the semiconductor substrate 10 and the emitter electrode 52 may be directly connected to each other. Note that a plug formed of tungsten (W) and the like may also be provided in the aperture 54. The upper surface 62 of the semiconductor substrate 10 and the emitter electrode 52 may be electrically connected to each other via the plug.

The semiconductor substrate 10 of the present embodiment has a plurality of trench portions in a region in contact with the upper surface 62. The plurality of trench portions include gate trench portions 40 and dummy trench portions 30. A distance between the trench portions adjacent to each other in the X-axis direction may be fixed.

A mesa portion 60 is provided between the respective trench portions. The mesa portion 60 of the present embodiment is a region from a bottom portion of the trench portion to the upper surface 62, and is a region of the semiconductor substrate 10 sandwiched by two adjacent trench portions in the X-axis direction. The mesa portion 60 may have an N+ type emitter region 12, a P+ type contact region 15, a P− type base region 14 and an N+ type accumulation region 16. Note that in the mesa portion 60, a mesa portion 60-1 described below and a mesa portion 60-2 described below are included.

In the present embodiment, the mesa portions 60 of the IGBT region 70 are alternately provided in the Y-axis direction and have the emitter region 12 and the contact region 15 respectively exposed on the upper surface 62. Note that at the cross section taken along line A-A, in the mesa portion 60-1 of the IGBT region 70, the emitter region 12 exists and the contact region 15 does not exist.

In a mesa portion 60-1a of the IGBT region 70 which is the closest to the boundary 72 may not be provided with the emitter region 12 to reduce current interference of the IGBT region 70 with the FWD region 80. In the mesa portion 60-1a of the IGBT region 70, the contact region 15 and the P− type base region 14 may be respectively exposed on the upper surface 62 in the Y-axis direction. Note that at the cross section taken along line A-A, in the mesa portion 60-1a, the contact region 15 exists and the base region 14 does not exist.

In the mesa portion 60 of the IGBT region 70, in a range within which the emitter region 12 and the contact region 15 exist, the base region 14 is positioned below the emitter region 12 and the contact region 15. A portion, which is in contact with the gate trench portion 40, of the base region 14 may serve as a channel forming region. If an ON voltage is applied to the gate trench portion 40 as the gate signal, a channel being a charge inversion layer may be formed in the base region 14. By forming the channel in the base region 14, electrons may flow between the emitter region 12 and a drift region 18.

The accumulation region 16 in the present embodiment is provided so as to cover an entire lower surface of the base region 14 in each mesa portion 60. The accumulation region 16 may be sandwiched by two trench portions in the X-axis direction. A bottom portion of the accumulation region 16 may be provided at a position closer to the upper surface 62 than the bottom portion of each trench portion. That is, the bottom portion of the accumulation region 16 may be provided at a position shallower than the bottom portion of each trench portion. By providing the accumulation region 16 between the drift region 18 and the base region 14, carrier injection enhancement effect (IE effect: Injection-Enhancement effect) can be enhanced and the ON voltage in the IGBT region 70 can be reduced.

The gate trench portion 40 has a gate trench 42, a gate insulating film 43 and a gate conductive portion 44. The gate trench 42 may be formed by selectively etching the semiconductor substrate 10 from the upper surface 62 to a predetermined depth. The gate insulating film 43 may be provided in contact with an inner wall of the gate trench 42. The gate insulating film 43 may be formed by oxidizing or nitriding the semiconductor on the inner wall of the gate trench 42. The gate conductive portion 44 is provided in contact with the gate insulating film 43 and more inside the gate trench 42 than the gate insulating film 43. The gate insulating film 43 may electrically insulate the gate conductive portion 44 from the semiconductor substrate 10. The gate conductive portion 44 may be formed of a conductive material such as polysilicon.

The dummy trench portion 30 has a dummy trench 32, a dummy trench insulating film 33 and a dummy trench conductive portion 34. The dummy trench insulating film 33 and the dummy trench conductive portion 34 may be formed by the same method as that of the gate insulating film 43 and the gate conductive portion 44.

In the present embodiment, the IGBT region 70 has a plurality of the gate trench portions 40 and a plurality of the dummy trench portions 30. Two dummy trench portions 30 are provided between a dummy trench portion 30-b positioned above the boundary 72 and the gate trench portion 40 closest to the dummy trench portion 30-b in the X-axis direction. A set of two dummy trench portions 30 and one gate trench portion 40 may be repeatedly provided in the X-axis direction.

Similarly, the dummy trench portion 30-b may also be provided above the boundary 72 between the IGBT region 70 and the FWD region 80 that is in contact with the IGBT region 70 in a negative direction of the X axis. Two dummy trench portions 30 may also be provided between the dummy trench portion 30-b and the gate trench portion 40 closest to the dummy trench portion 30-b in the X-axis direction. On the other hand, all trench portions in the FWD region 80 may be the dummy trench portions 30.

In the present embodiment, the mesa portion 60-2 of the FWD region 80 has the base region 14 and the contact region 15 respectively exposed on the upper surface 62. Note that at the cross section taken along line A-A, the base region 14 exists in the mesa portion 60-2.

In the FWD region 80, an area exposed on the upper surface 62 of the base region 14 may be greater than that of the contact region 15. The base region 14 in the FWD region 80 may serve as an anode region in the diode. The contact region 15 may be partially provided only in a predetermined region (for example, a region in the vicinity of the gate runner portion 50) in the vicinity of an end portion in the Y-axis direction. In the mesa portion 60-2 of the present embodiment, the accumulation region 16 is provided so as to cover the entire lower surface of the base region 14.

In the present embodiment, a structure including the mesa portion 60, the trench portion, the interlayer dielectric film 38 and the emitter electrode 52 is referred to as an upper surface structure 116. However, the upper surface structure 116 may also include a lifetime control region in the vicinity of the upper surface 62 of the semiconductor substrate 10. The vicinity of the upper surface 62 of the semiconductor substrate 10 may mean a portion upper than a position of a half of a thickness (the thickness is a length from the upper surface 62 to the lower surface 64 in the Z-axis direction) of the semiconductor substrate 10.

The lifetime control region is a region in which a lifetime killer is intentionally formed by implantation and the like of the impurities in the inner portion of the semiconductor substrate 10. The lifetime killer may be a recombination center of the carriers in the inner portion of the semiconductor substrate 10. The recombination center of the carriers may be a crystal defect, a vacancy, vacancy complexes, a defect complex, which is of the crystal defect, the vacancy and the vacancy complexes and of elements constituting the semiconductor substrate 10, a dislocation, a rare gas element such as helium and neon, or a metal element, such as platinum, and the like.

In the present embodiment, a structure including an N+ type field stop (hereinafter abbreviated as FS) region 20, a P type floating region 84, a P+ type collector region 22 and an N+ type cathode region 82 is referred to as a lower surface structure 118. The lower surface structure 118 may also include the lifetime control region between a position of a half of the thickness of the semiconductor substrate 10 and an upper portion of the FS region 20.

The FS region 20 may have a function for preventing a depletion layer, which spreads from the bottom portion of the base region 14 to the lower surface 64, from reaching the collector region 22 when the semiconductor device 100 is turned off. The FS region 20 may be an N type semiconductor region and may have one or more peaks in the doping concentration distribution. A plurality of the peaks in the doping concentration distribution in the FS region 20 may be discretely provided in the Z-axis direction.

The floating region 84 is a P type region being in an electrically floating state. The floating region 84 may be provided in the FWD region 80. In the present embodiment, the floating region 84 may be dispersively provided in the entire FWD region 80.

In principle, the electrically floating state refers to a state in which none of the collector electrode 24 and the emitter electrode 52 is electrically connected. By providing the floating region 84, an electron injection from the cathode region 82 can be suppressed. Accordingly, the carrier distribution of the semiconductor substrate 10 in the depth direction can be adjusted without providing the lifetime killer on the lower surface 64 side of the semiconductor substrate 10. For this reason, costs for providing the lifetime control region can be reduced. In addition, leak current caused by the lifetime control region can also be reduced.

The floating region 84 may be positioned within the FWD region 80. In the present embodiment, an end portion 91 of the floating region 84 does not reach the boundary 72 in the X-axis direction. Note that the end portion 91 of the present embodiment is an end portion of the floating region 84 closest to the boundary 72. A distance $L_1$ between the boundary 72 and the end portion 91 may be equal to or more than several nm and equal to or less than several μm. Note that in the present embodiment, the X-axis direction is a direction parallel to an array direction of the cathode region 82 and the collector region 22 toward the collector region 22 from the cathode region 82.

The floating region 84 of the present embodiment is positioned within the FS region 20 in the Z-axis direction. That is, in the present embodiment, the upper end portion of the floating region 84 is closer to the lower surface 64 than the upper end portion of the FS region 20. Also, in the present embodiment, the lower end portion of the floating region 84 is matched with the lower end portion of the FS region 20; however, the lower end portion of the floating region 84 may also be closer to the upper surface 62 than the lower end portion of the FS region 20.

Figure 3:
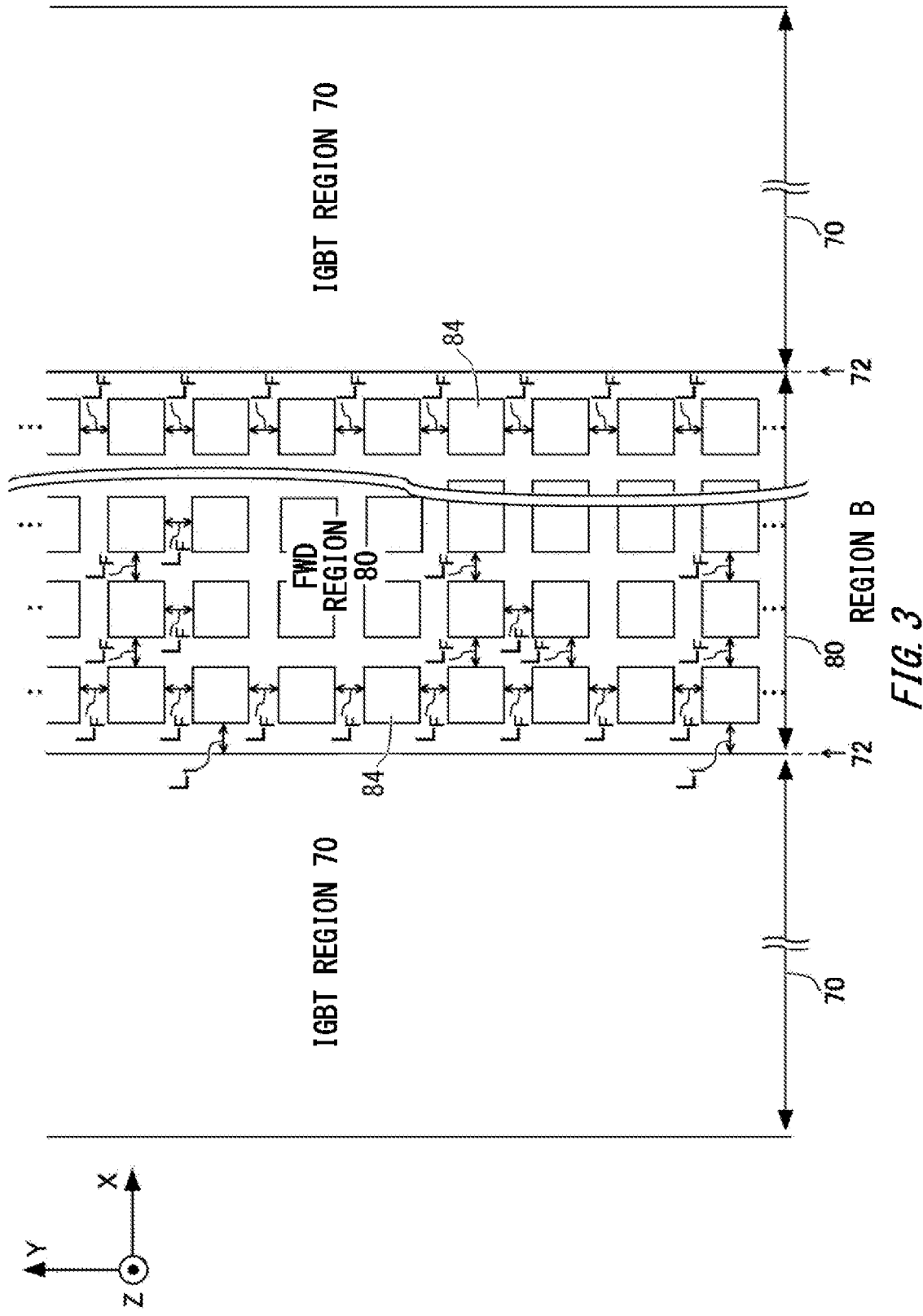
FIG. 3 shows an enlarged view of a region B of FIG. 1.

FIG. 3 is an enlarged view of a region B of FIG. 1. Lengths of the semiconductor substrate 10 in the X-axis and Y-axis directions may be respectively equal to or more than several mm and equal to or less than ten and several mm. A width of the IGBT region 70 in the X-axis direction may be equal to or more than 1 time and equal to or less than 3 times of a width of the FWD region 80 in the X-axis direction, and may also be equal to or more than 2 times and equal to or less than 3 times of the width of the FWD region 80 in the X-axis direction. For example, the width of the IGBT region 70 in the X-axis direction is equal to or more than 1000 μm and equal to or less than 1500 μm, and the width of the FWD region 80 in the X-axis direction is equal to or more than 400 μm and equal to or less than 500 μm. Note that the widths of the IGBT region 70 and of the FWD region 80 in the Y-axis direction may be the same.

On the X-Y plane, an area of the floating region 84 may be smaller than an area of the FWD region 80. On the X-Y plane, the floating region 84 may cover a range of equal to or more than 90% and less than 100% of the cathode region 82, and may cover a range of equal to or more than 90% and equal to or less than 95% of the cathode region 82. Each of the floating regions 84 may be an island-shaped region dispersively arranged on the X-Y plane. Each floating region 84 may be spaced apart from each other by a predetermined identical distance $L_F$ in the X-axis and Y-axis directions.

Figure 4A:
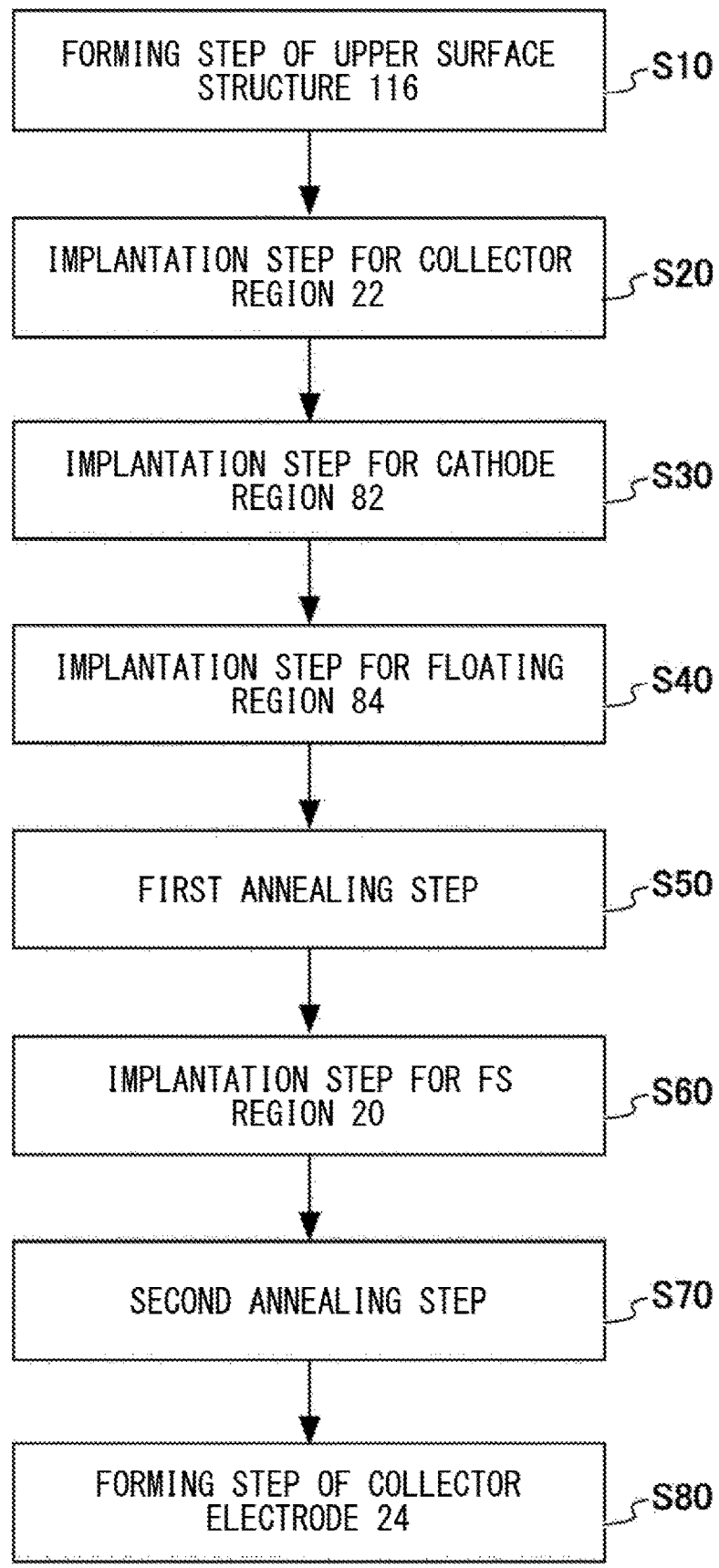
FIG. 4A shows a flow diagram of a method of manufacturing the semiconductor device 100 in a first embodiment.

FIG. 4A is a flow diagram showing a method of manufacturing the semiconductor device 100 in the first embodiment. The manufacturing method in the first embodiment includes a forming step of the upper surface structure 116 (S10), an implantation step for the collector region 22 (S20), an implantation step for the cathode region 82 (S30), an implantation step for the floating region 84 (S40), a first annealing step (S50), an implantation step for the FS region 20 (S60), a second annealing step (S70) and a forming step of the collector electrode 24 (S80). In the first embodiment, each step is performed in an ascending order of the numbers following the letter S.

Figure 4B:
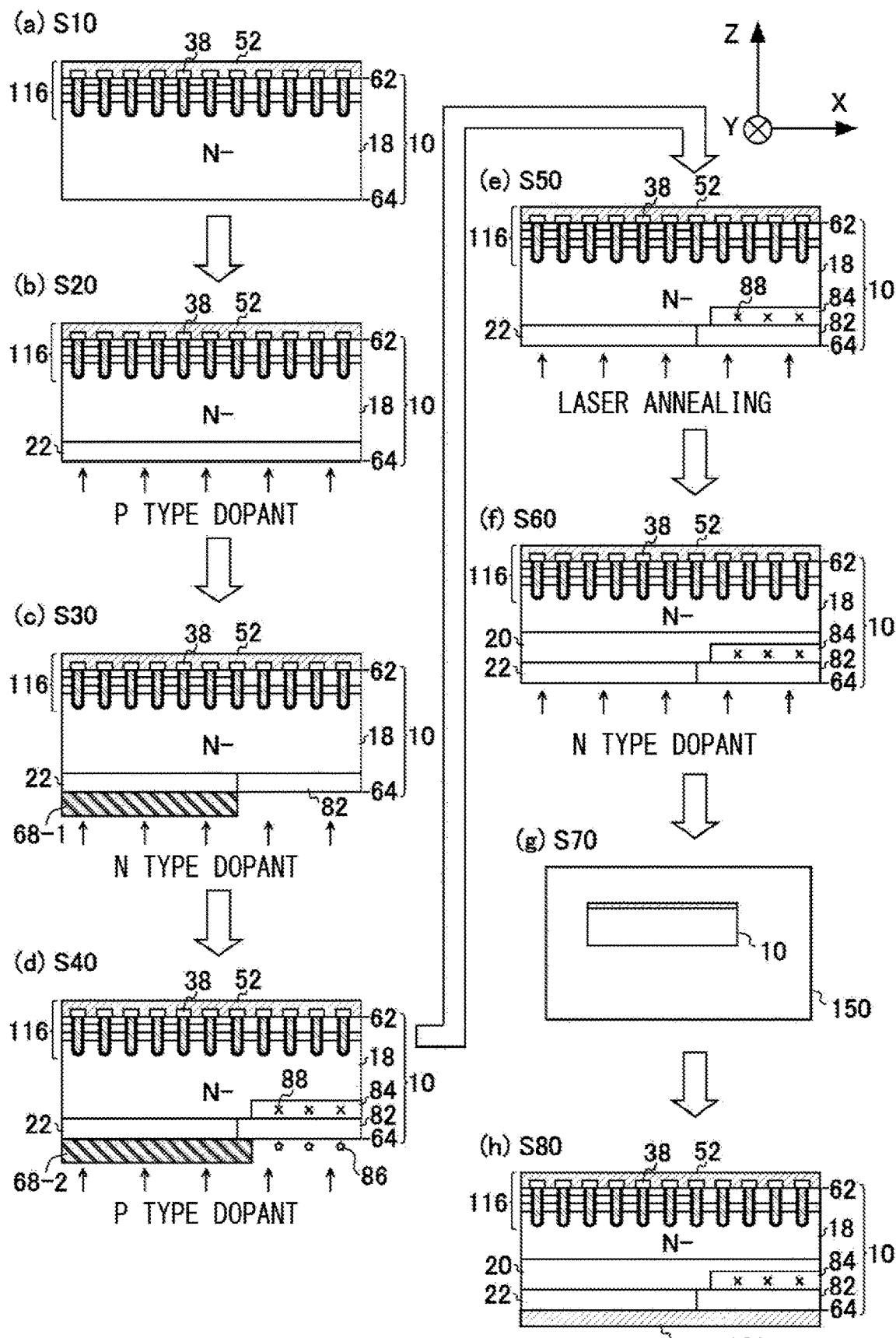
FIG. 4B shows respective steps of the method of manufacturing the semiconductor device 100 in the first embodiment.

FIG. 4B is a drawing showing the respective steps of the method of manufacturing the semiconductor device 100 in the first embodiment. FIG. 4B shows the step (S10), as (a), of forming the upper surface structure 116. At the step S10, the trench portion may be formed in the N− type semiconductor substrate 10. When forming the dummy trench conductive portion 34 and the gate conductive portion 44, the polysilicon layer of the gate runner portion 50 may be formed. After forming the trench portion, the P type dopant for the base region 14 may be implanted in the upper surface 62 of the semiconductor substrate 10. The dopant in an ionized state may be accelerated by an implantation device and be implanted in the semiconductor substrate 10. Subsequently, the semiconductor substrate 10 may be annealed for 3 hours at about 1150° C.

At the step S10, subsequently, the N type dopant for the accumulation region 16, the N type dopant for the emitter region 12 and the P type dopant for the contact region 15 may be implanted selectively and sequentially. However, the implantation order may also be appropriately changed. Subsequently, the semiconductor substrate 10 may be annealed for 30 minutes at about 1000° C. At the step S10, further subsequently, the interlayer dielectric film 38 may be formed by CVD. Subsequently, the aperture 54 may be formed by selectively removing, by etching, a thermal oxide film and the interlayer dielectric film 38 on the upper surface 62. The thermal oxide film is, for example, the insulating film provided on the upper surface 62 when forming the gate insulating film 43 and the dummy trench insulating film 33.

At the step S10, further subsequently, the emitter electrode 52 may be deposited by sputtering. When depositing the emitter electrode 52 by sputtering, the metal layer of the gate runner portion 50 and the gate pad 114 may also be deposited. After the deposition, the emitter electrode 52, the metal layer of the gate runner portion 50 and the gate pad 114 may be patterned in predetermined shapes. The step S10 may also include a step of forming a passivation layer, which includes a predetermined aperture, on the upper portion of the emitter electrode 52 and the like.

Note that, the step S10 of the present embodiment includes grinding a surface of the semiconductor substrate 10 on the opposite side to the upper surface 62 in the Z-axis direction after forming the upper surface structure 116. The semiconductor substrate 10 may be thinned so as to have a thickness corresponding to a predetermined withstand voltage. The lower surface 64 of the present embodiment is the surface of the semiconductor substrate 10, the surface exposed after thinning.

FIG. 4B shows, as (b), the implantation step for the collector region 22 (S20). At the step S20, the P type dopant is implanted in the entire lower surface 64 of the semiconductor substrate 10. The step S20 may be a dopant implantation that is to form the collector region 22 in the IGBT region 70. That is, at the step S20, the P type dopant may be doped by a dose amount corresponding to the doping concentration of the collector region 22 in the semiconductor device 100.

FIG. 4B shows, as (c), the implantation step for the cathode region 82 (S30). At the step S30, first, a mask 68 such as a photoresist material is formed in contact with the entire lower surface 64. Subsequently, on the X-Y plane, a mask 68-1 is patterned within a range corresponding to the collector region 22. Subsequently, the N type dopant is implanted in the lower surface 64 of the semiconductor substrate 10. The step S30 may be a dopant implantation that is to form the cathode region 82 in the FWD region 80. That is, at the step S30, the N type dopant may be doped by a dose amount corresponding to the doping concentration of the cathode region 82 in the semiconductor device 100.

Accordingly, a region in which the P type dopant has been implanted is counter-doped within a range in which the mask 68-1 is not provided. Note that within the range in which the mask 68-1 has been provided, the N type dopant may not be implanted. After doping, the mask 68-1 may be removed.

FIG. 4B shows, as (d), the implantation step for the floating region 84 (S40). At the step S40, a mask 68-2 is provided on the X-Y plane within a range corresponding to the floating region 84. The mask 68-2 of the present embodiment is formed by the same method as that of the mask 68-1; however, the mask 68-2 is provided on the X-Y plane within a range different from that of the mask 68-1.

Subsequently, the P type dopant is implanted in the lower surface 64 of the semiconductor substrate 10. The step S40 may be a dopant implantation that is to form the P type floating region 84. That is, at the step S40, the P type dopant may be doped by a dose amount corresponding to the doping concentration of the floating region 84 in the semiconductor device 100. An implantation depth range at the step S40 may be shallower than an implantation depth range of the cathode region 82. After doping, the mask 68-2 may be removed.

As described above, at the steps S30 and S40, a mask process of forming, patterning and removing the mask 68 is performed for a plurality of times. For that reason, among the plurality of the implantation steps, the later implantation steps have a higher possibility of generation or adhesion of particles 86. Accordingly, there is a possibility that defect 88 is generated within the semiconductor substrate 10 caused by the particles and a flaw is generated. Because the defect 88 or the flaw generated in the cathode region 82 directly influences the electrical characteristics of the FWD region 80, the defect 88 or the flaw has a significant influence on the semiconductor device 100. For example, when the defect 88 or the flaw is generated in the cathode region 82, influences such as junction leakage, withstand voltage failure, lowered switching characteristics and the like may be generated.

Here, in the present embodiment, the implantation step for the floating region 84 (S40) is performed after the implantation step for the cathode region 82 (S30). Accordingly, compared to a case where the implantation step for the cathode region 82 is performed after the implantation step for the floating region 84, the implantation step for the cathode region 82 can be performed on the lower surface 64 that is in a cleaner state. For that reason, at the step S30, a risk that the defect 88 or the flaw is generated in the cathode region 82 can be reduced. For that reason, in the semiconductor device 100, the current leakage and the withstand voltage failure can be reduced. In this way, in the present embodiment, the non-defective product rate of the RC-IGBT can be improved.

Note that in the present embodiment, because the implantation step for the collector region 22 (S20) is performed in a state in which the lower surface 64 is clean, the defect 88 or the flaw in the collector region 22 can also be reduced. Accordingly, in the collector region 22 as well, the current leakage and the withstand voltage failure can also be reduced. However, in the present embodiment, compared to a case where the implantation step for the cathode region 82 (S30) is performed after the implantation step for the floating region 84 (S40), lots of the defect 88 may be introduced in the floating region 84. However, compared to the case where the defect 88 or the flaw is introduced in the cathode region 82, the defect 88 introduced in the floating region 84 has a small influence on the FWD region 80. For that reason, in the present embodiment, the defect 88 introduced in the floating region 84 may be considered to be allowable.

FIG. 4B shows, as (e), the first annealing step (S50). In the present embodiment, the semiconductor substrate 10 is annealed at a temperature of 1000° C. by irradiating laser light on the lower surface 64. The laser light may have energy higher than band gap energy of the semiconductor substrate 10. According to the step S50, a crystal defect generated caused by the dopant ion implantation can be recovered and the implanted dopant can be activated.

FIG. 4B shows, as (f), an implantation step for the FS region 20 (S60). In the present embodiment, to form the FS region 20, hydrogen is implanted from the lower surface 64 to a predetermined depth range. Note that hydrogen in a hydrogen ion (that is, proton) state may be implanted in the semiconductor substrate 10. The hydrogen ion may be implanted in the semiconductor substrate 10 at multiple steps by changing implantation energy so that a plurality of peaks are provided in the FS region 20 in the Z-axis direction.

FIG. 4B shows, as (g), the second annealing step (S70). In the present embodiment, the semiconductor substrate 10 is placed within a thermal treatment furnace 150, and the semiconductor substrate 10 is annealed at a temperature of about 400° C. By performing the annealing of the FS region 20 separately from the step S50, the hydrogen of the FS region 20 can be activated at a temperature that is a temperature different from that of the P type and N type dopants implanted at the step S20 to the step S40 and that is the most suitable for the hydrogen activation. In addition, by performing the implantation step for the FS region 20 after the step S50, compared to a case where the implantation step for the FS region 20 is performed before the step S50, the dopant implantation accuracy for the FS region 20 can be improved.

FIG. 4B shows, as (h), the forming step of the collector electrode 24 (S80). In the present embodiment, the collector electrode 24 in contact with the entire lower surface 64 is formed by sputtering. Accordingly, the semiconductor device 100 is completed. Note that the position of the end portion 91 may be a position after the implantation step for the collector region 22, the implantation step for the cathode region 82 and the implantation step for the floating region 84. The position of the end portion 91 in the present embodiment is the position of the end portion 91 after the step S80.

Figure 5A:
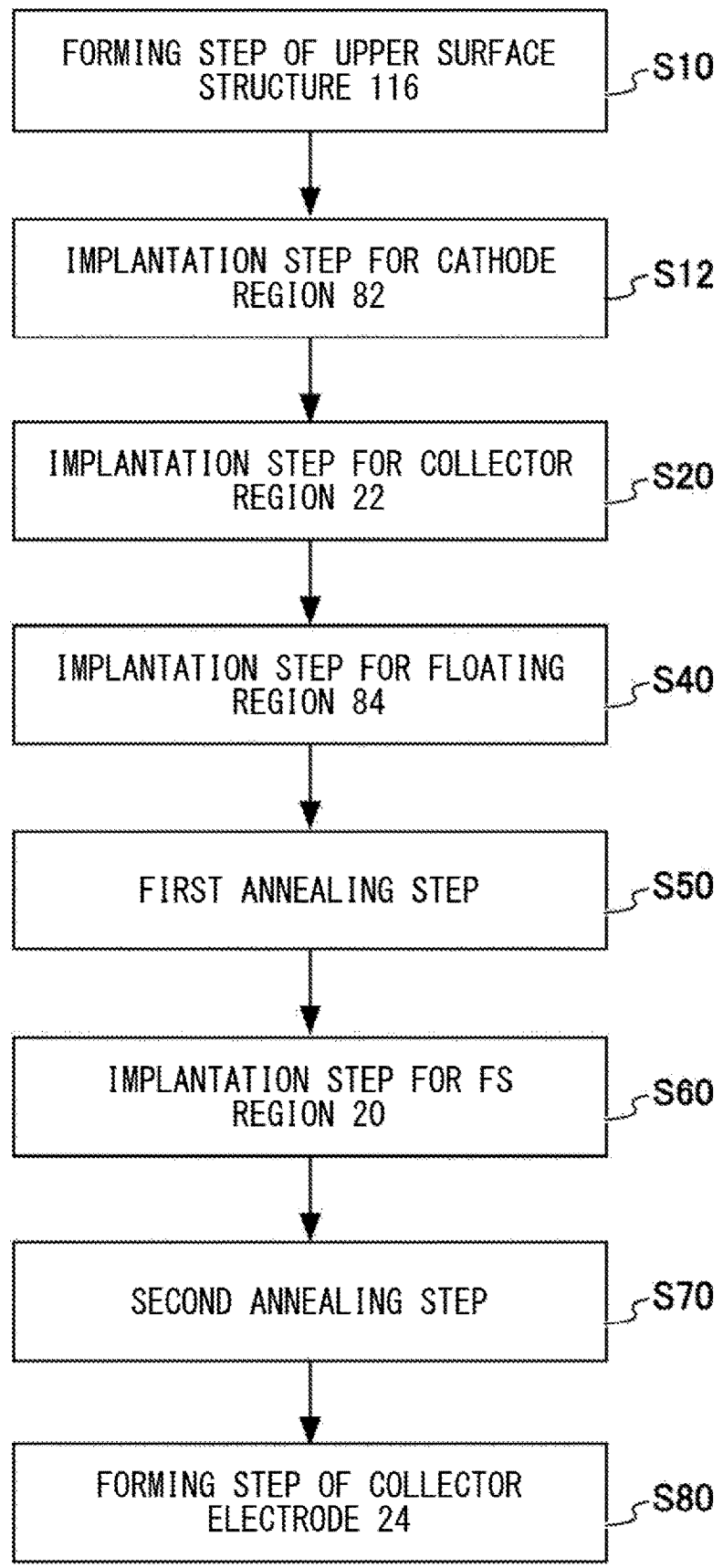
FIG. 5A shows a flow diagram of a method of manufacturing a semiconductor device 120 in a first modification example of the first embodiment.

FIG. 5A is a flow diagram showing a method of manufacturing a semiconductor device 120 in a first modification example of the first embodiment. Note that the semiconductor device 120 is shown in the next drawing. In the present embodiment, the implantation step for the collector region 22 (S20) is performed after the implantation step for the cathode region 82 (S12), and the implantation step for the floating region 84 (S40) is performed after the implantation step for the collector region 22 (S20). The above points are different from the first embodiment. The descriptions of the same steps as those of the first embodiment are omitted.

Figure 5B:
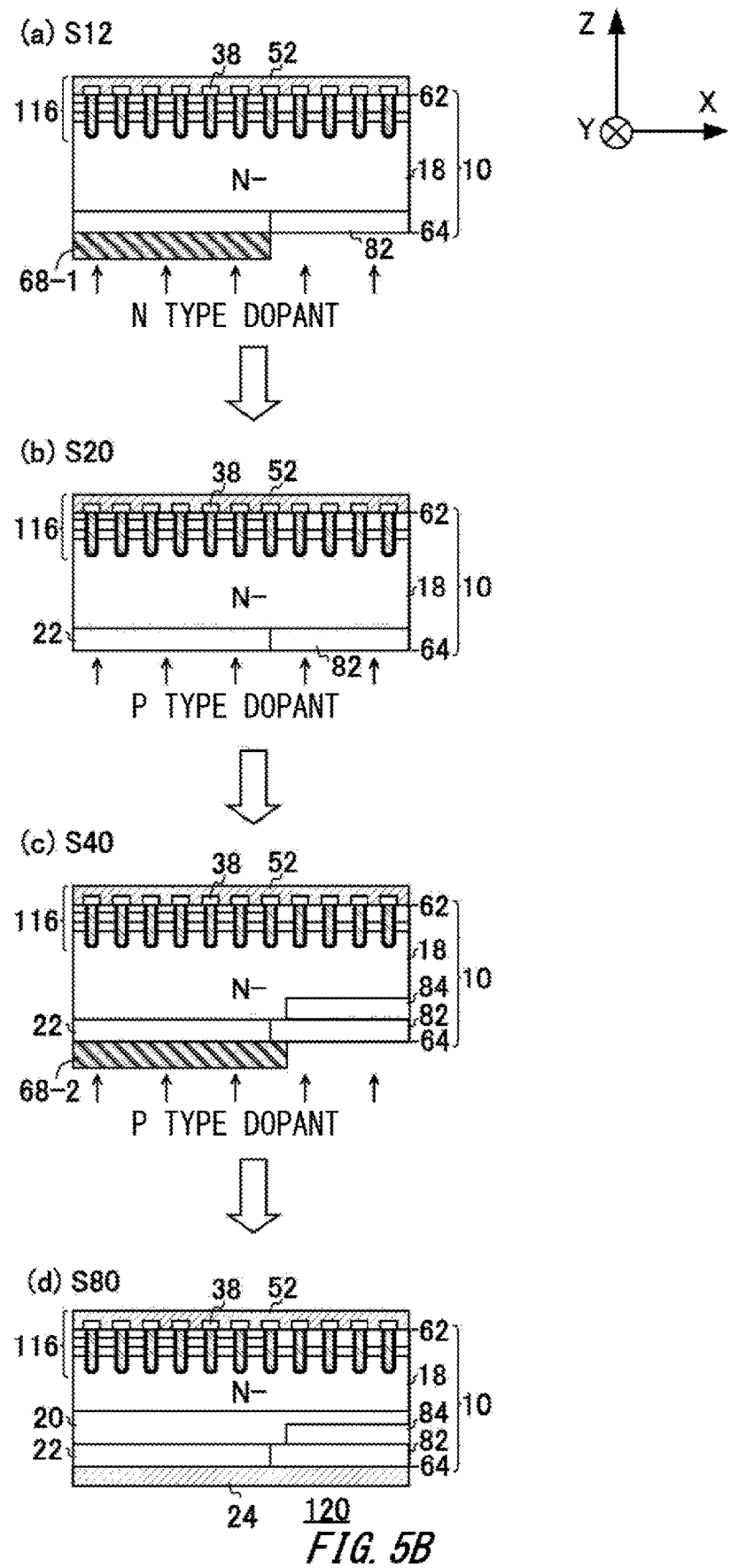
FIG. 5B shows respective steps of the method of manufacturing the semiconductor device 120 in the first modification example of the first embodiment.

FIG. 5B is a drawing showing the respective steps of the method of manufacturing the semiconductor device 120 in the first modification example of the first embodiment. The step S12 of (a) shown in FIG. 5B corresponds to the step S30 of (c) shown in FIG. 4B, the step S20 of (b) shown in FIG. 5B corresponds to the step S20 of (b) shown in FIG. 4B, the step S40 of (c) shown in FIG. 5B corresponds to the step S40 of (d) shown in FIG. 4B, and the step S80 of (d) shown in FIG. 5B corresponds to the step S80 of (h) shown in FIG. 4B. In the first modification example as well, because the current leakage and the withstand voltage failure in the cathode region 82 and the collector region 22 can be reduced, the non-defective product rate of the RC-IGBT can be improved.

Figure 6A:
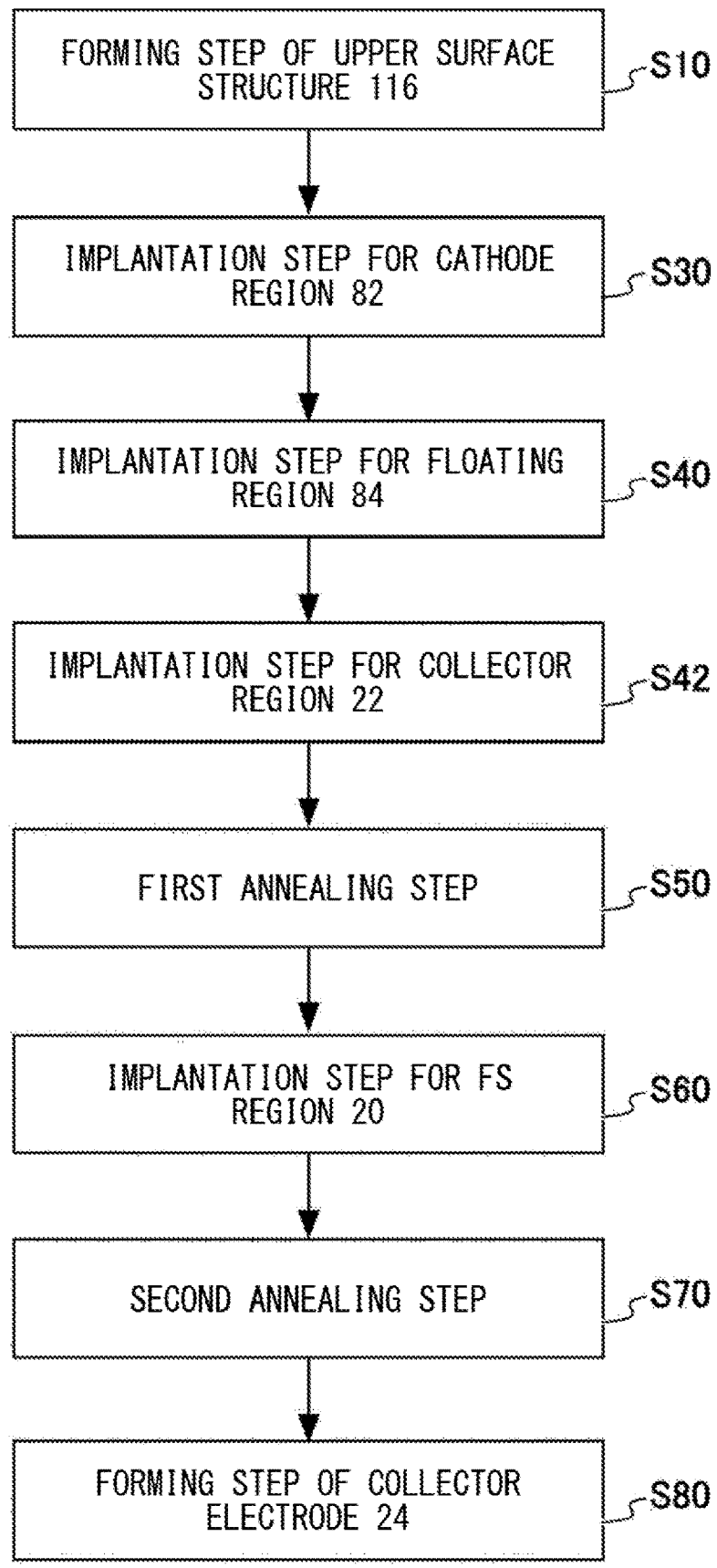
FIG. 6A shows a flow diagram of a method of manufacturing a semiconductor device 140 in a second modification example of the first embodiment.

FIG. 6A is a flow diagram showing a method of manufacturing the semiconductor device 140 in a second modification example of the first embodiment. Note that the semiconductor device 140 is shown in the next drawing. In the present embodiment, the implantation step for the floating region 84 (S40) is performed after the implantation step for the cathode region 82 (S30), and the implantation step for the collector region 22 (S42) is performed after the implantation step for the floating region 84 (S40). The above points are different from the first embodiment. The descriptions of the same steps as those of the first embodiment are omitted.

Figure 6B:
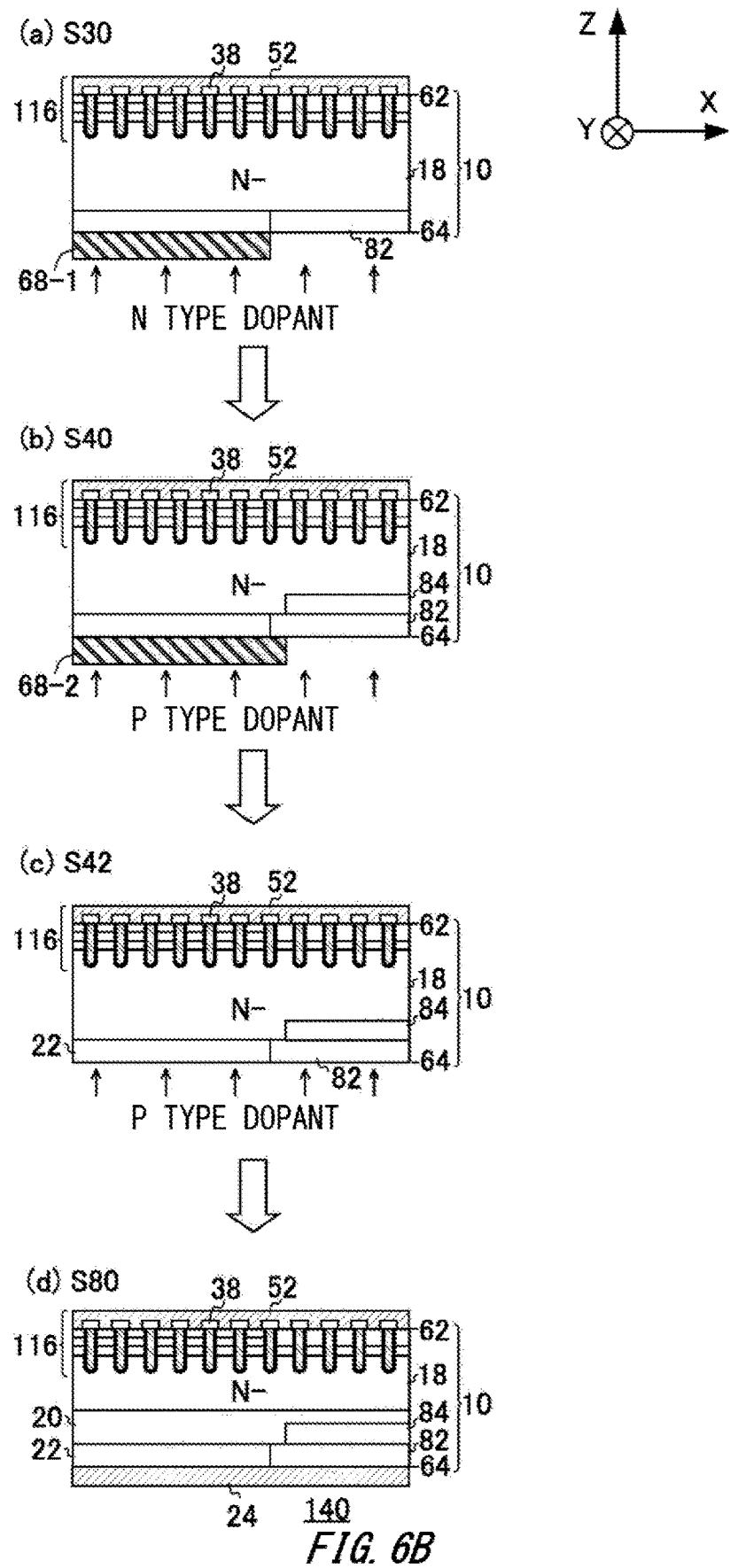
FIG. 6B shows respective steps of the method of manufacturing the semiconductor device 140 in the second modification example of the first embodiment.

FIG. 6B is a drawing showing the respective steps of the method of manufacturing the semiconductor device 140 in the second modification example of the first embodiment. The step S30 of (a) shown in FIG. 6B corresponds to the step S30 of (c) shown in FIG. 4B, the step S40 of (b) shown in FIG. 6B corresponds to the step S40 of (d) shown in FIG. 4B, the step S42 of (c) shown in FIG. 6B corresponds to the step S20 of (b) shown in FIG. 4B, and the step S80 of (d) shown in FIG. 6B corresponds to the step S80 of (h) shown in FIG. 4B. In the second modification example, because the current leakage and the withstand voltage failure in the cathode region 82 can be reduced, the non-defective product rate of the RC-IGBT can be improved.

Figure 7:
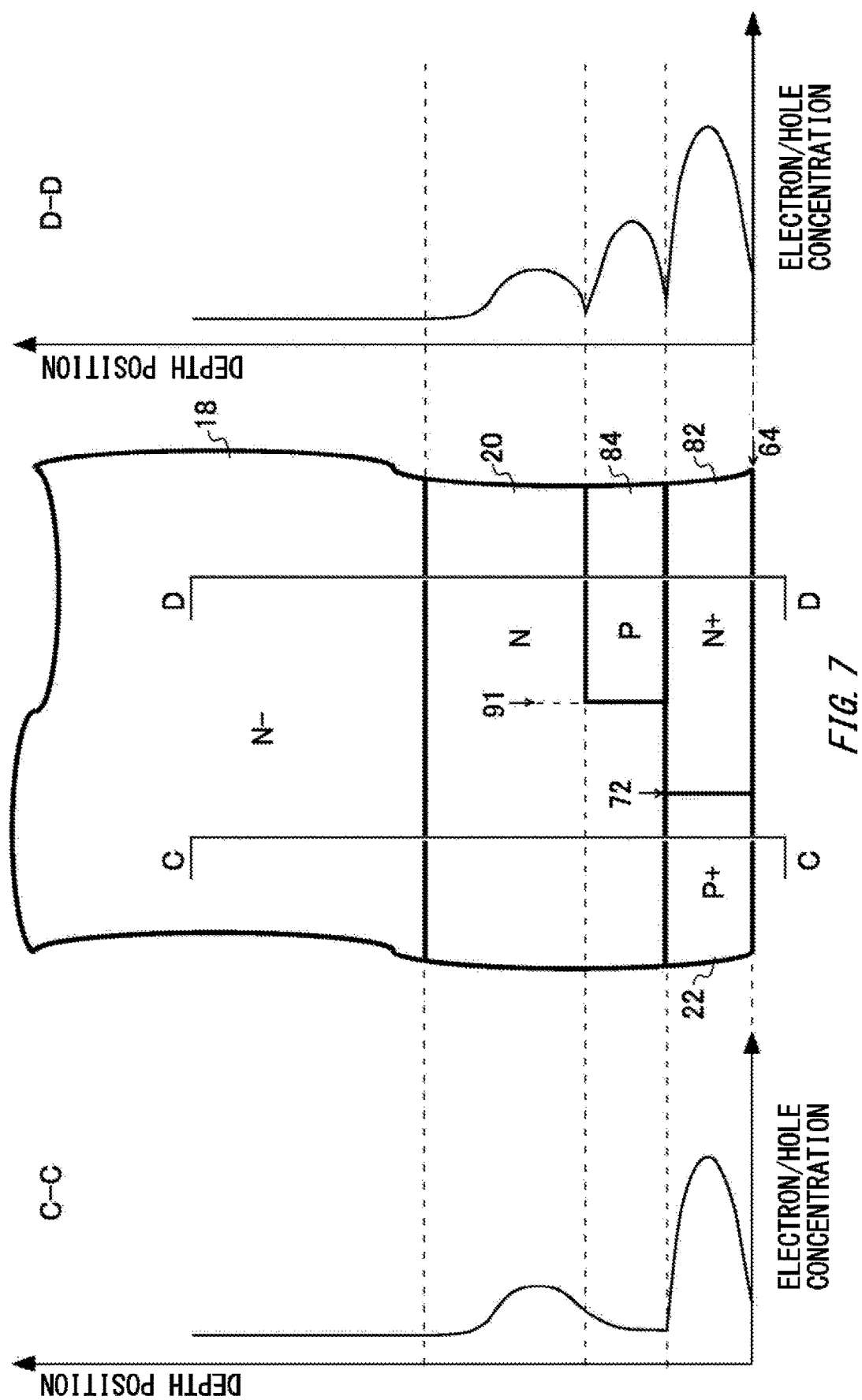
FIG. 7 shows concentration distributions of electrons and holes in the vicinity of a boundary 72 in the first embodiment.

FIG. 7 is a drawing showing the concentration distributions of the electrons and holes in the vicinity of the boundary 72 in the first embodiment. In a center of the FIG. 7, a partially enlarged view in the vicinity of the boundary 72 in the semiconductor device 100 is shown. In FIG. 7, the electron/hole concentration distributions at the cross section taken along line C-C and the cross section taken along line D-D of the partially enlarged view are respectively shown by sandwiching a partially enlarged view of the vicinity of the boundary 72. At the cross section taken along line C-C and the cross section taken along line D-D, the horizontal axis indicates the electron concentration or the hole concentration ($cm^{-3}$), and the vertical axis indicates the depth position ($\mu m$). Note that in the present specification, the electron concentration and the hole concentration are effective (that is, net) concentrations. The effective concentration means a difference between the electron concentration and the hole concentration, for example.

The cross section taken along line C-C passes through the drift region 18, the FS region 20 and the collector region 22 in an order of proximity to the upper surface 62. Because the drift region 18 and the FS region 20 are N type regions, the drift region 18 and the FS region 20 are regions in which electrons are the majority carrier. Note that the concentration of the N type region means the electron concentration. On the other hand, because the collector region 22 is the P type region, the collector region 22 is a region in which holes are the majority carrier. Note that the concentration of the P type region means the hole concentration. In the depth direction, peaks of the concentration distributions of the ion-implanted P type and N type dopants may respectively match the peak positions of the hole concentration and the electron concentration. Note that caused by the annealing and the like after the dopant implantation, the concentration peak positions of the implanted dopants may not exactly match the concentration peak positions of the electrons or the holes. However, relative position relations of the respective peaks may be considered to be the same.

The cross section taken along line D-D passes through the drift region 18, the FS region 20, the floating region 84 and the cathode region 82 in an order of proximity to the upper surface 62. The concentration in the floating region 84 is the hole concentration, and the concentration in the cathode region 82 is the electron concentration.

Figure 8:
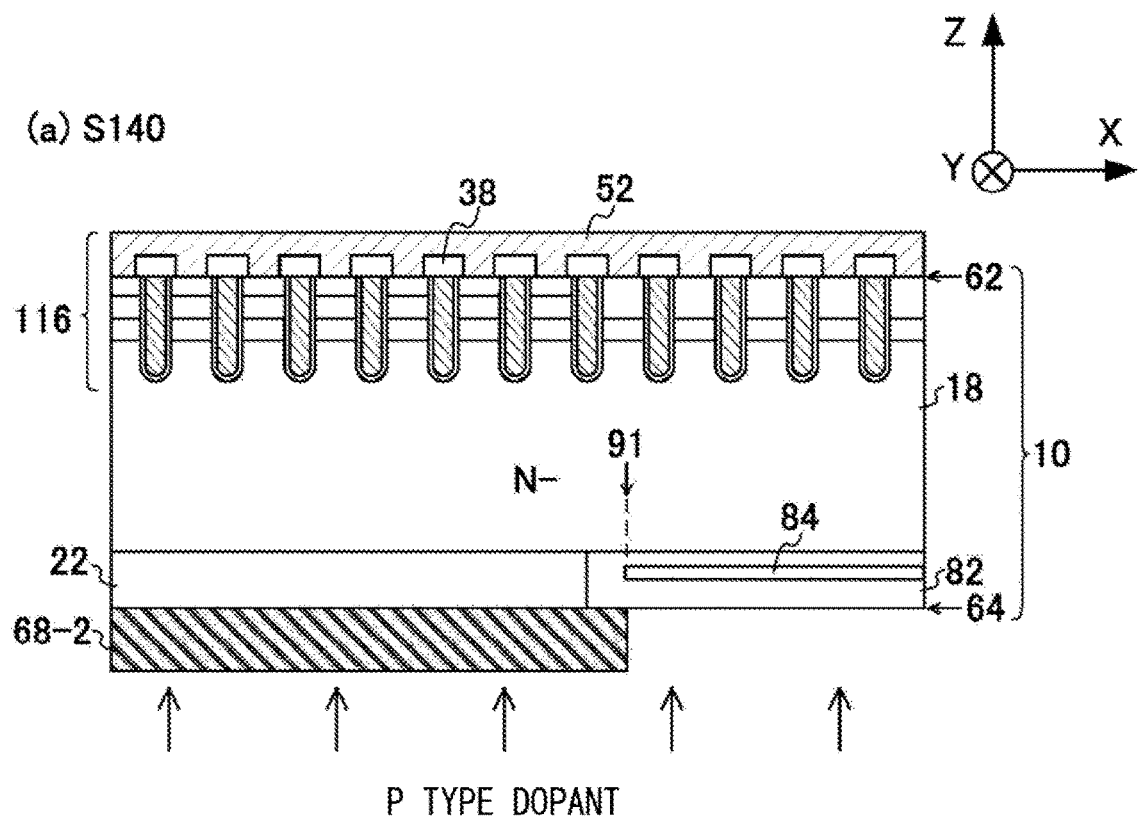
FIG. 8 shows steps of a method of manufacturing a semiconductor device 160 in a third modification example of the first embodiment.
Figure 8:
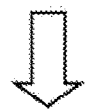
Figure 8:
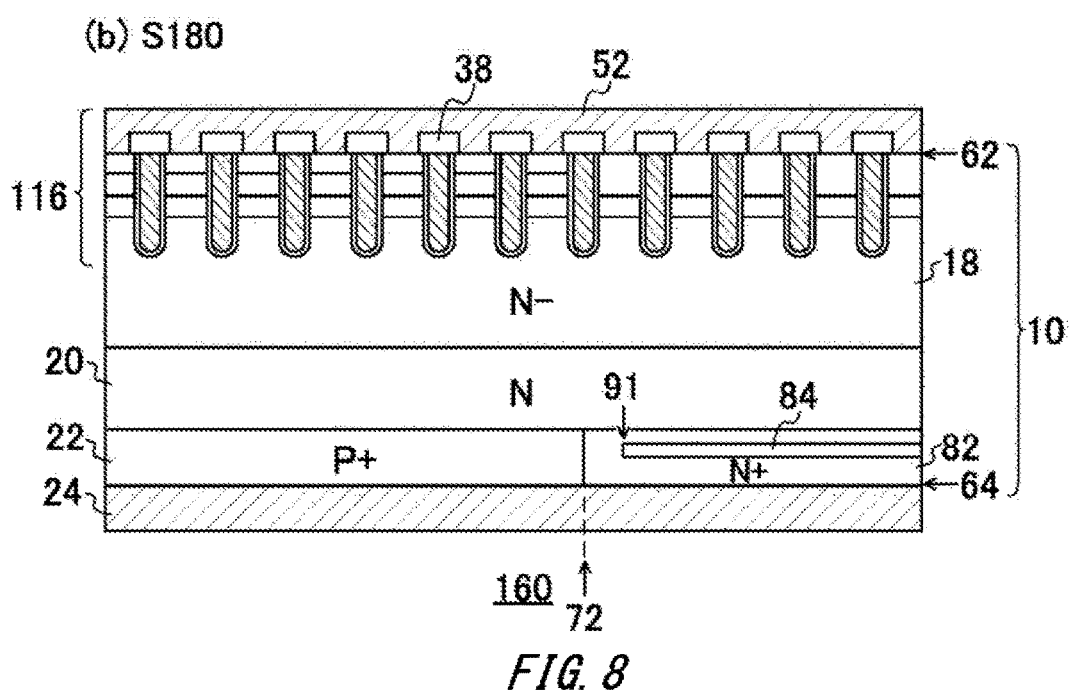

FIG. 8 is a drawing showing the steps of a method of manufacturing a semiconductor device 160 in a third modification example of the first embodiment. The step S140 of (a) shown in FIG. 8 corresponds to the step S40 of (d) shown in FIG. 4B, and the step S180 of (b) shown in FIG. 8 corresponds to the step S80 of (h) shown in FIG. 4B. Note that the descriptions of the same steps at those of the first embodiment are omitted. The third modification example is different from the first embodiment in the following point: the floating region 84 is formed within the cathode region 82. In third modification example, in the cathode region 82 between the upper end portion of the floating region 84 and the FS region 20, a tail region of the P type dopant concentration distribution used for the floating region 84 formation may exist. Similarly, in the cathode region 82 between the lower end portion of the floating region 84 and the lower surface 64 as well, the tail region of the P type dopant concentration distribution used for the floating region 84 formation may exist.

Also, the peak of the P type dopant concentration distribution of the floating region 84 may exist at a position closer to the FS region 20 than a half of the depth position of the cathode region 82. In third modification example, the floating region 84 is provided closer to the FS region 20 than the lower surface 64. Accordingly, a risk that the floating region 84 is exposed on the lower surface 64 of the semiconductor device 160 can be reduced while providing the floating region 84 within the cathode region 82. The third modification example of FIG. 8 may also be combined with the first modification example of FIG. 5A and FIG. 5B and the second modification example of FIG. 6A and FIG. 6B.

Figure 9:
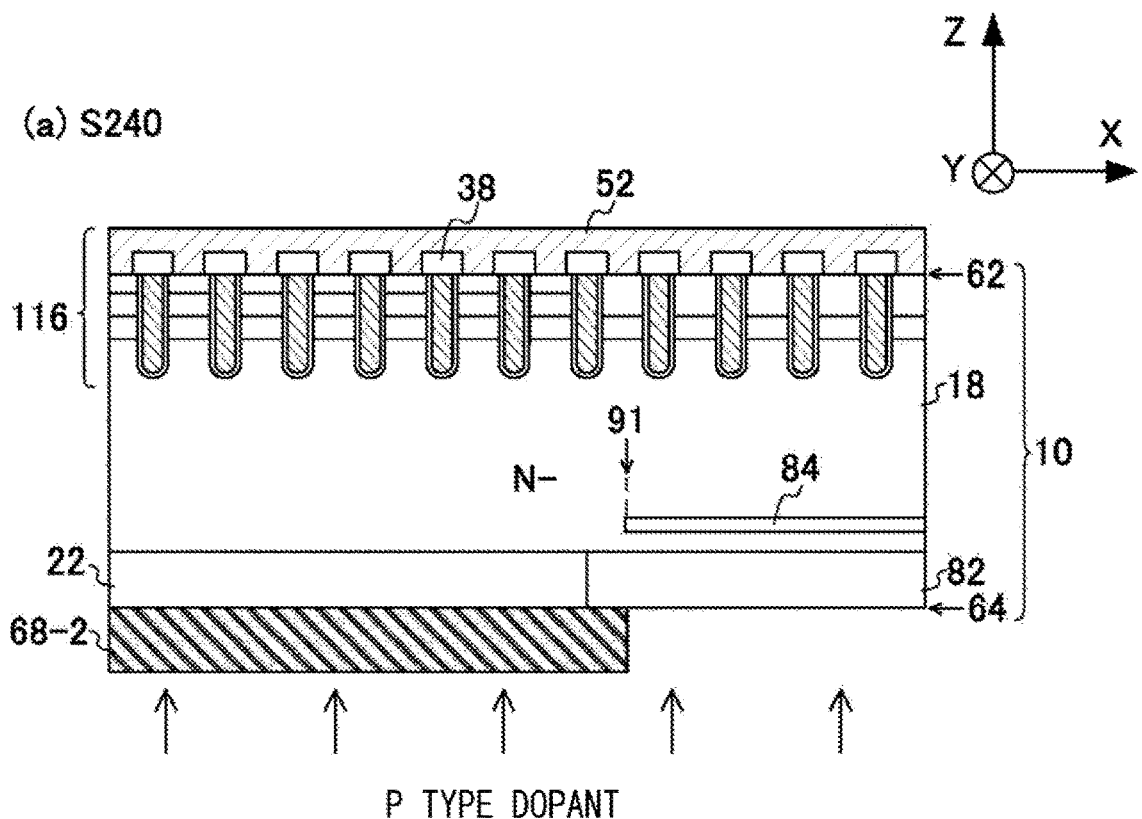
FIG. 9 shows steps of a method of manufacturing a semiconductor device 180 in a fourth modification example of the first embodiment.
Figure 9:
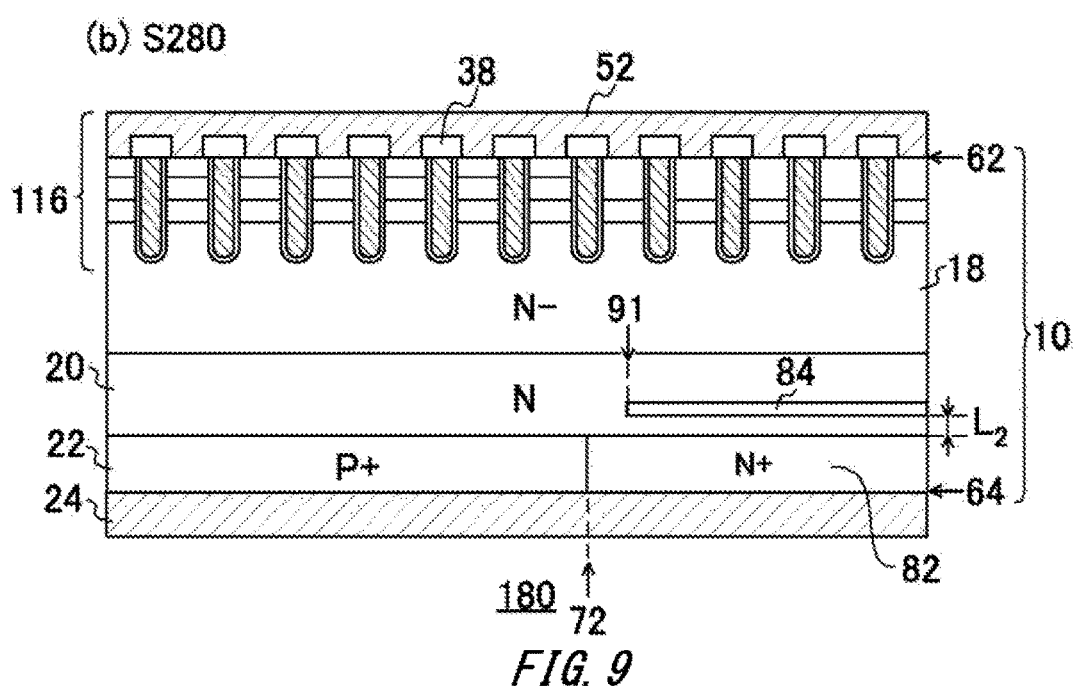

FIG. 9 is a drawing showing the steps of a method of manufacturing a semiconductor device 180 in a fourth modification example of the first embodiment. The step S240 of (a) shown in FIG. 9 corresponds to the step S40 of (d) shown in FIG. 4B, and the step S280 of (b) shown in FIG. 9 corresponds to the step S80 of (h) shown in FIG. 4B. Note that the descriptions of the same steps as those of the first embodiment are omitted. The fourth modification example is different from the first embodiment in the following point: the lower end portion of the floating region 84 is formed in an upper portion than the cathode region 82. In (b) shown in FIG. 9, a distance between the lower end portion of the floating region 84 and the upper end portion of the cathode region 82 is shown as $L_2$. In the fourth modification example, in the FS region 20 between the lower end portion of the floating region 84 and the upper end portion of the cathode region 82, the tail region of the P type dopant concentration distribution used for the floating region 84 formation may exist. Also, similar to the third modification example of the first embodiment, the tail region of the P type dopant concentration distribution used for the floating region 84 formation may exist between the upper end portion of the floating region 84 and the upper end portion of the FS region 20. The fourth modification example of FIG. 9 may also be combined with the first modification example of FIG. 5A and FIG. 5B and the second modification example of FIG. 6A and FIG. 6B.

Figure 10A:
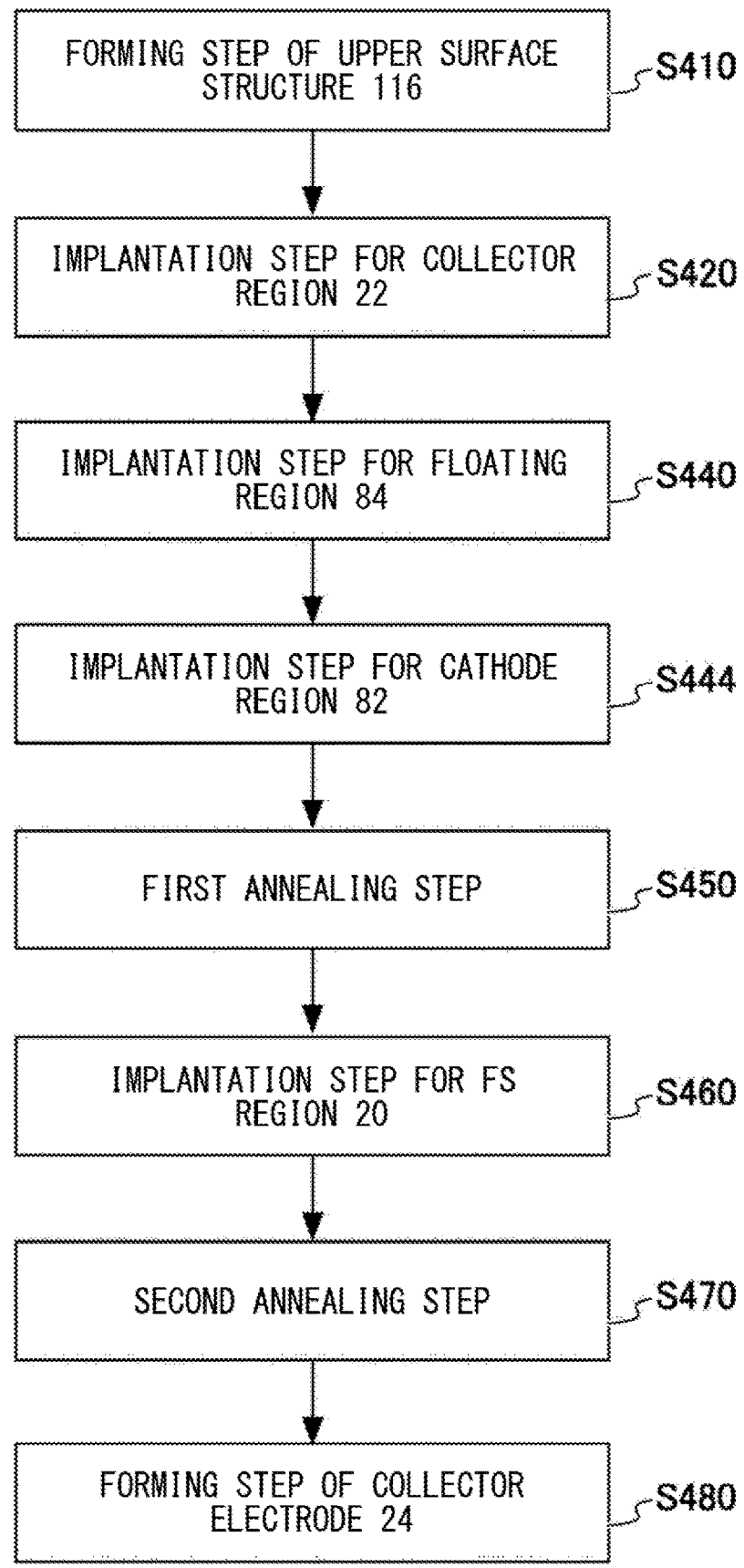
FIG. 10A shows a flow diagram of a method of manufacturing a semiconductor device 200 in a second embodiment.

FIG. 10A is a flow diagram showing a method of manufacturing a semiconductor device 200 in a second embodiment. Note that the semiconductor device 200 is shown in the next drawing. The method of manufacturing the second embodiment includes a step (S410) of forming the upper surface structure 116, an implantation step for the collector region 22 (S420), an implantation step for the floating region 84 (S440), an implantation step for the cathode region 82 (S444), a first annealing step (S450), an implantation step for the FS region 20 (S460), a second annealing step (S470) and a forming step of the collector electrode 24 (S480). In the second embodiment as well, the respective steps are performed in an ascending order of the numbers following the letter S.

Figure 10B:
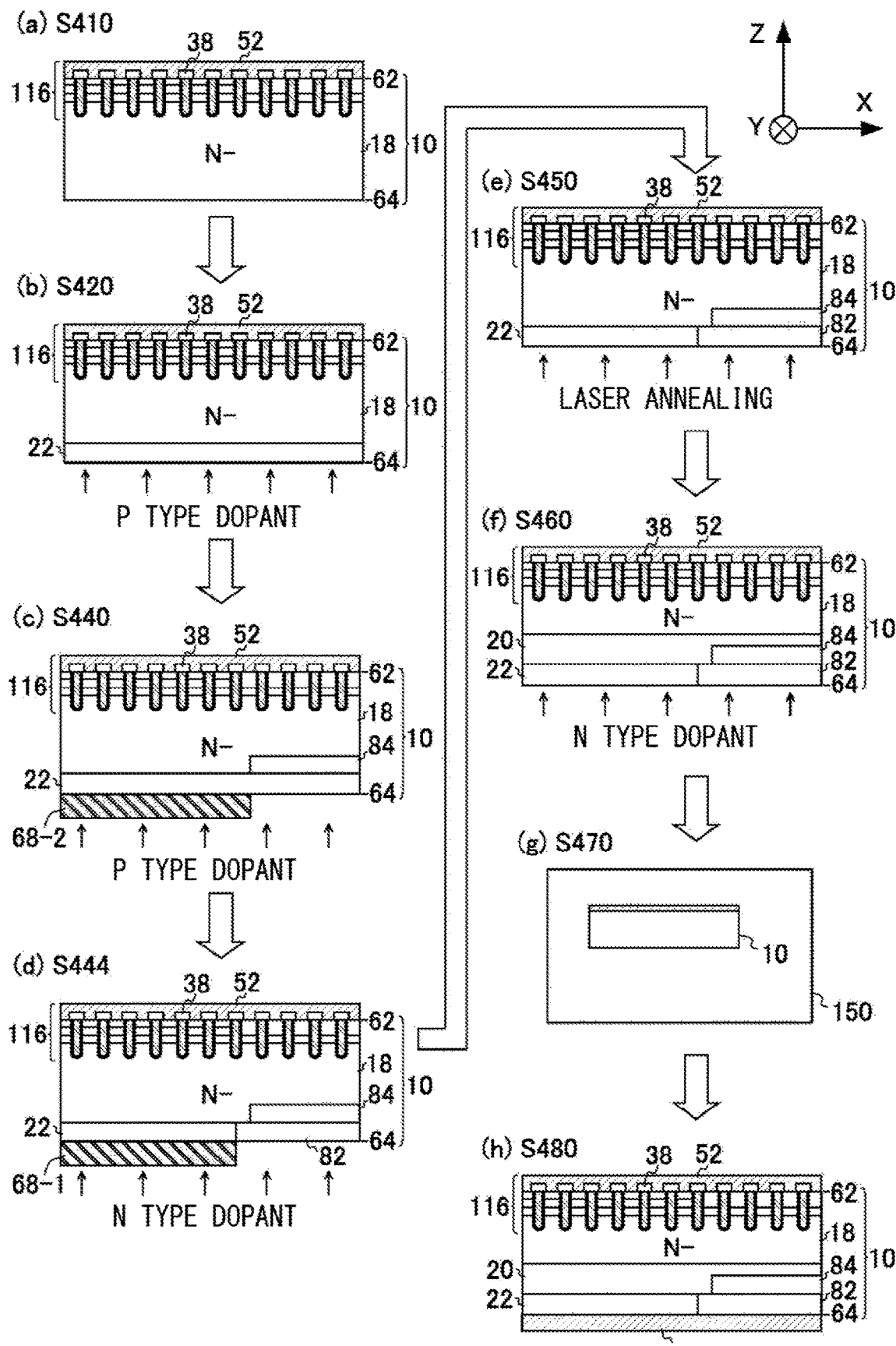
FIG. 10B shows respective steps the method of manufacturing the semiconductor device 200 in the second embodiment.

FIG. 10B is a drawing showing the respective steps of the method of manufacturing the semiconductor device 200 in the second embodiment. The step S410 of (a) shown in FIG. 10B corresponds to the step S10 of (a) shown in FIG. 4B. The step S420 of (b) shown in FIG. 10B corresponds to the step S20 of (b) shown in FIG. 4B. The step S440 of (c) shown in FIG. 10B corresponds to the step S40 of (d) shown in FIG. 4B. The step S444 of (d) shown in FIG. 10B corresponds to the step S30 of (c) shown in FIG. 4B. The step S450 of (e) shown in FIG. 10B corresponds to the step S50 of (e) shown in FIG. 4B. The step S460 of (f) shown in FIG. 10B corresponds to the step S60 of (f) shown in FIG. 4B. The step S470 of (g) shown in FIG. 10B corresponds to the step S70 of (g) shown in FIG. 4B. The step S480 of (h) shown in FIG. 10B corresponds to the step S80 of (h) shown in FIG. 4B.

If the implantation step for the floating region 84 is performed after the implantation step for the collector region 22 and the implantation step for the cathode region 82, the N type dopant for the cathode region 82 is implanted in the cathode region 82 in addition to the P type dopant for the collector region 22. For that reason, disturbance in crystallinity in the cathode region 82 right below the floating region 84 may become large. If the disturbance in crystallinity in the cathode region 82 is large, there is a possibility that the implantation range of the P type dopant for the floating region 84 varies from a design range. For example, there is a possibility that the P type dopant also varies in the X-Y plane direction in addition to the Z-axis direction.

On the other hand, in the second embodiment, the implantation step for the cathode region 82 (S444) is performed after the implantation step for the collector region 22 (S420) and the implantation step for the floating region 84 (S440). In the second embodiment, after the P type dopant implantation step for the collector region 22 (S420) and before the N type dopant implantation step for the cathode region 82 (S444), because the P type dopant for the floating region 84 is implanted (S440), the floating region 84 can be provided with good controllability. Accordingly, the implantation range of the P type dopant for the floating region 84 can be provided in the design range. For that reason, the variation in the characteristics of a plurality of the semiconductor devices 200 can be made small.

Further, in the present embodiment, because the implantation step for the collector region 22 (S420) is performed in the state in which the lower surface 64 is clean, the defect 88 or the flaw in the collector region 22 can be reduced. Accordingly, the current leakage and the withstand voltage failure in the semiconductor device 200 can be reduced. Note that in the present embodiment as well, as the semiconductor device 160 of FIG. 8, the floating region 84 may be formed within the cathode region 82. Also, as the semiconductor device 180 of FIG. 9, the lower end portion of the floating region 84 may also be formed in an upper portion than the cathode region 82.

Figure 11A:
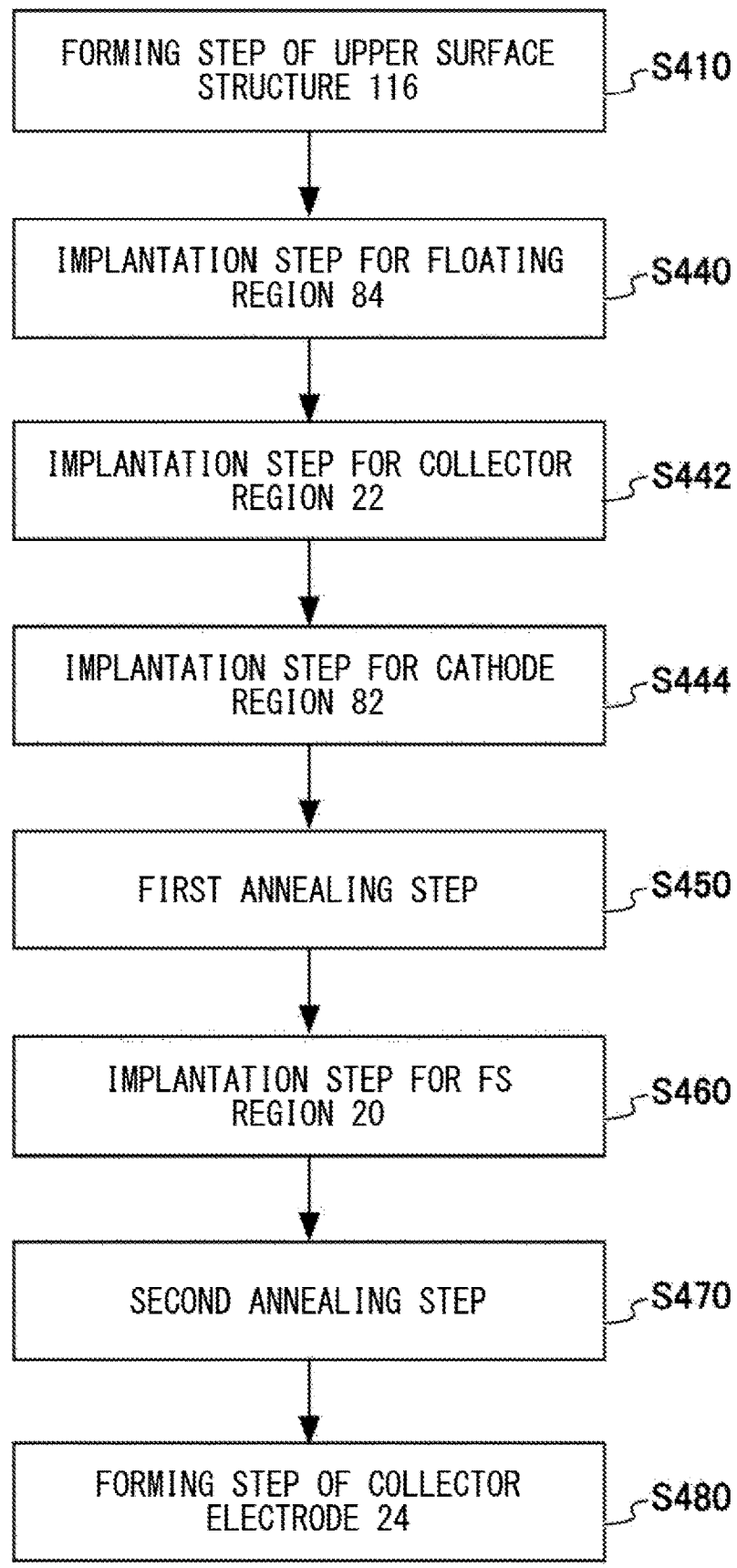
FIG. 11A shows a flow diagram of a method of manufacturing a semiconductor device 220 in a first modification example of the second embodiment.

FIG. 11A is a flow diagram showing a method of manufacturing a semiconductor device 220 in a first modification example of the second embodiment. Note that the semiconductor device 220 is shown in the next drawing. In the first modification example, the implantation step for the collector region 22 (S442) is performed after the implantation step for the floating region 84 (S440), and the implantation step for the cathode region 82 (S444) is performed after the implantation step for the collector region 22 (S442). The above points are different from the second embodiment.

Figure 11B:
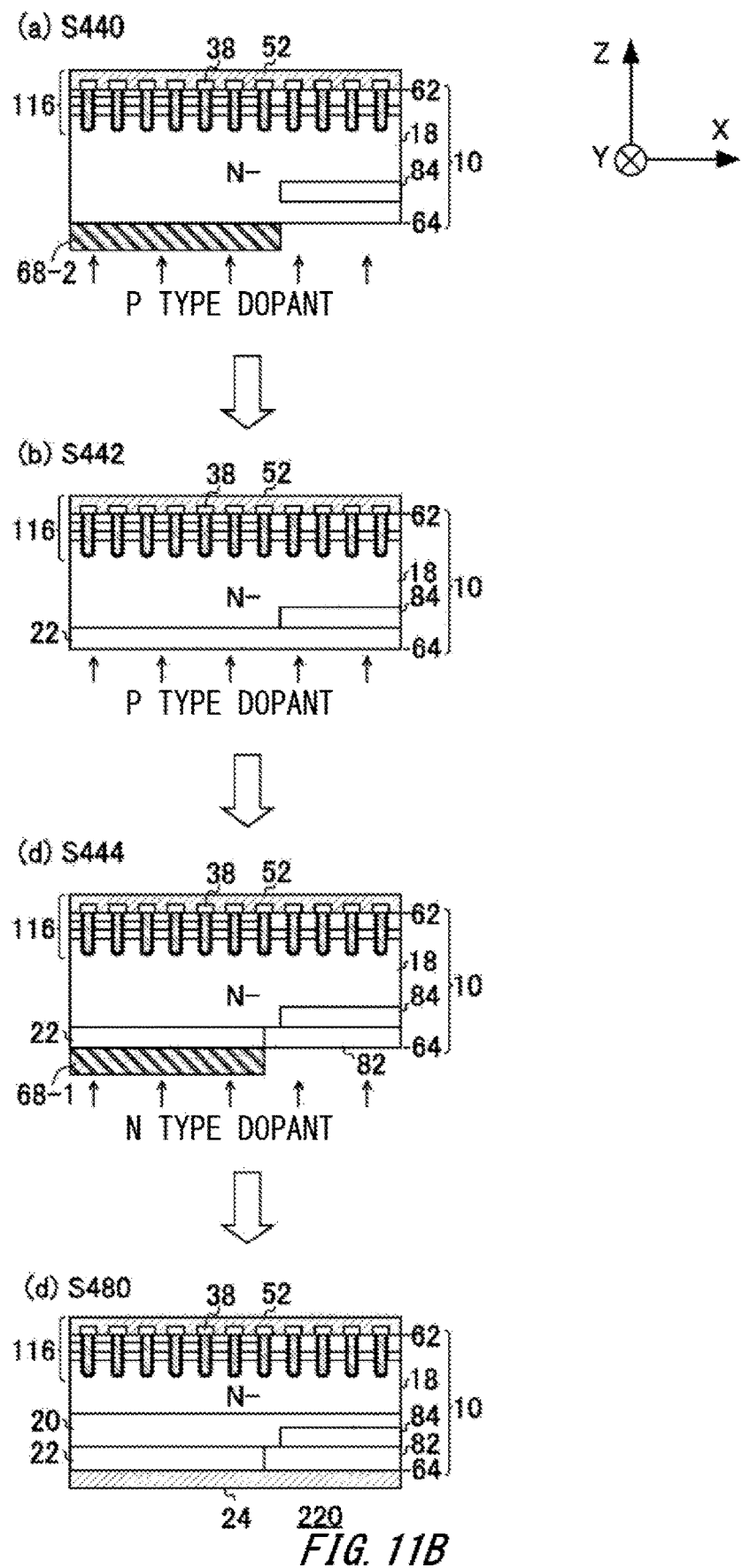
FIG. 11B shows respective steps of the method of manufacturing the semiconductor device 220 in the first modification example of the second embodiment.

FIG. 11B is a drawing showing the respective steps of the method of manufacturing the semiconductor device 220 in the first modification example of the second embodiment. The step S440 of (a) shown in FIG. 11B corresponds to the step S440 of (c) shown in FIG. 10B. The step S442 of (b) shown in FIG. 11B corresponds to the step S420 of (b) shown in FIG. 10B. The step S444 of (c) shown in FIG. 11B corresponds to the step S444 of (d) shown in FIG. 10B. The step S480 of (d) shown FIG. 11B corresponds to the step S480 of (h) shown in FIG. 10B. In the first modification example, because the floating region 84 is first formed in a process of forming the lower surface structure 118, the controllability of the floating region 84 can be further improved compared to the second embodiment.

Figure 12A:
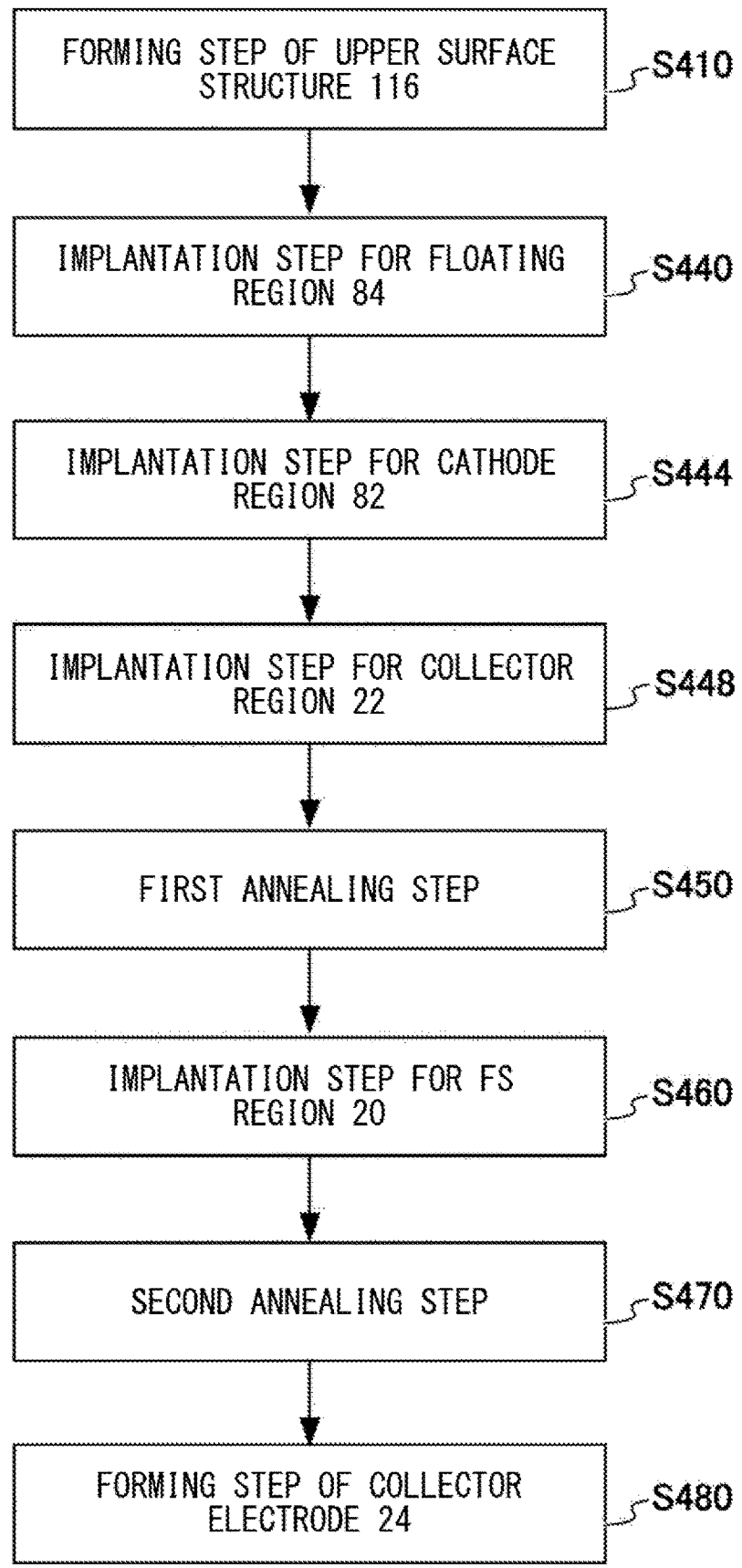
FIG. 12A shows a flow diagram of a method of manufacturing a semiconductor device 240 in a second modification example of the second embodiment.

FIG. 12A is a flow diagram showing a method of manufacturing a semiconductor device 240 in a second modification example of the second embodiment. Note that the semiconductor device 240 is shown in the next drawing. In the second modification example, the implantation step for the cathode region 82 (S444) is performed after the implantation step for the floating region 84 (S440), and the implantation step for the collector region 22 (S448) is performed after the implantation step for the cathode region 82 (S444). The above points are different from the second embodiment.

Figure 12B:
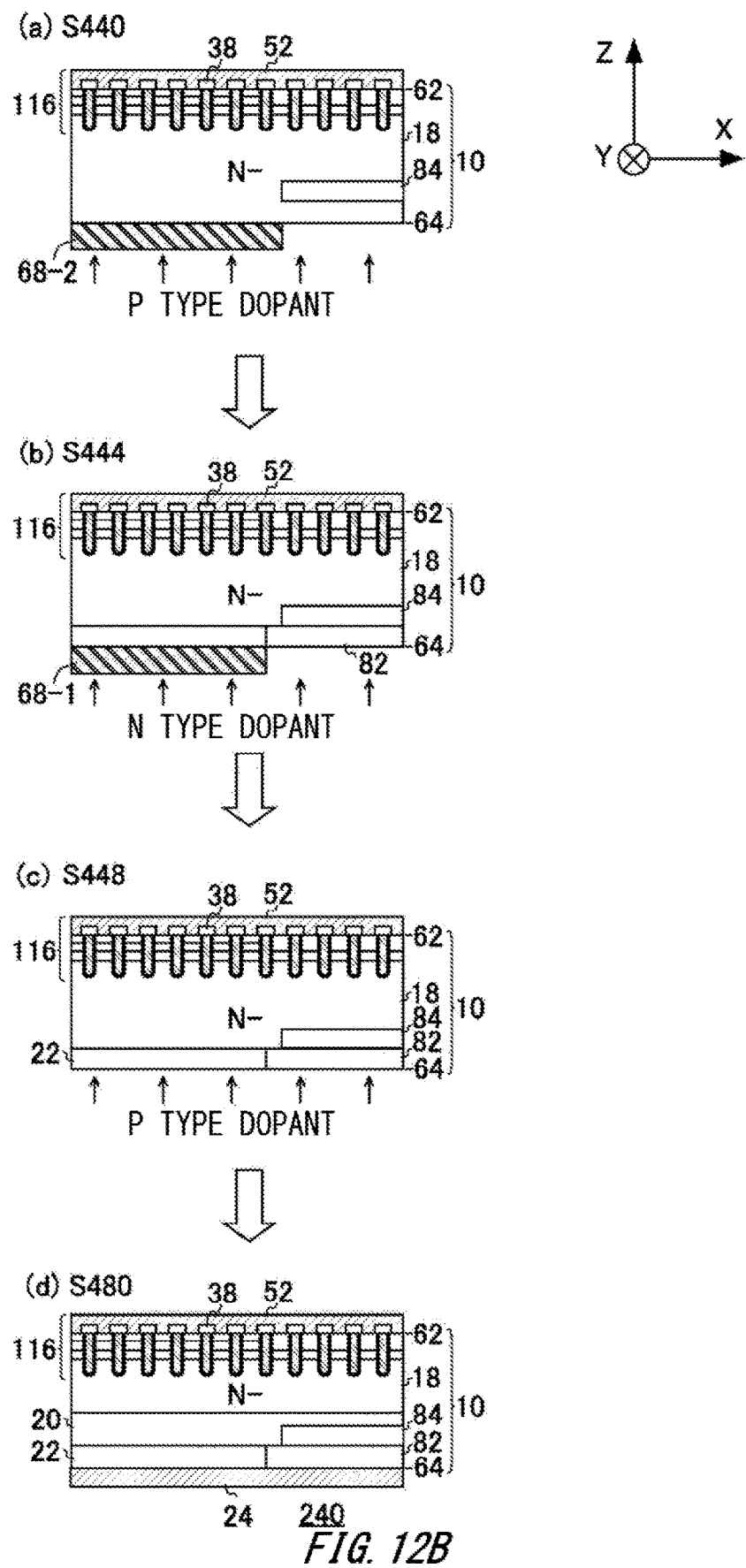
FIG. 12B shows respective steps of the method of manufacturing the semiconductor device 240 in the second modification example of the second embodiment.

FIG. 12B is a drawing showing the respective steps of the method of manufacturing the semiconductor device 240 in the second modification example of the second embodiment. The step S440 of (a) shown in FIG. 12B corresponds to the step S440 of (c) shown in FIG. 10B. The step S444 of (b) shown in FIG. 12B corresponds to the step S444 of (d) shown in FIG. 10B. The step S448 of (c) shown in FIG. 12B corresponds to the step S420 of (b) shown in FIG. 10B. The step S480 of (d) shown in FIG. 12B corresponds to the step S480 of (h) shown in FIG. 10B. In the second modification example as well, because the floating region 84 is first formed in a process of forming the lower surface structure 118, the controllability of the floating region 84 can be further improved compared to the second embodiment.

Note that in the second embodiment, the first modification example of the second embodiment and the second modification example of the second embodiment as well, as the semiconductor device 160 of FIG. 8, the floating region 84 may be formed within the cathode region 82. Also, as the semiconductor device 180 of FIG. 9, the lower end portion of the floating region 84 may also be formed in an upper portion than the cathode region 82.

Figure 13A:
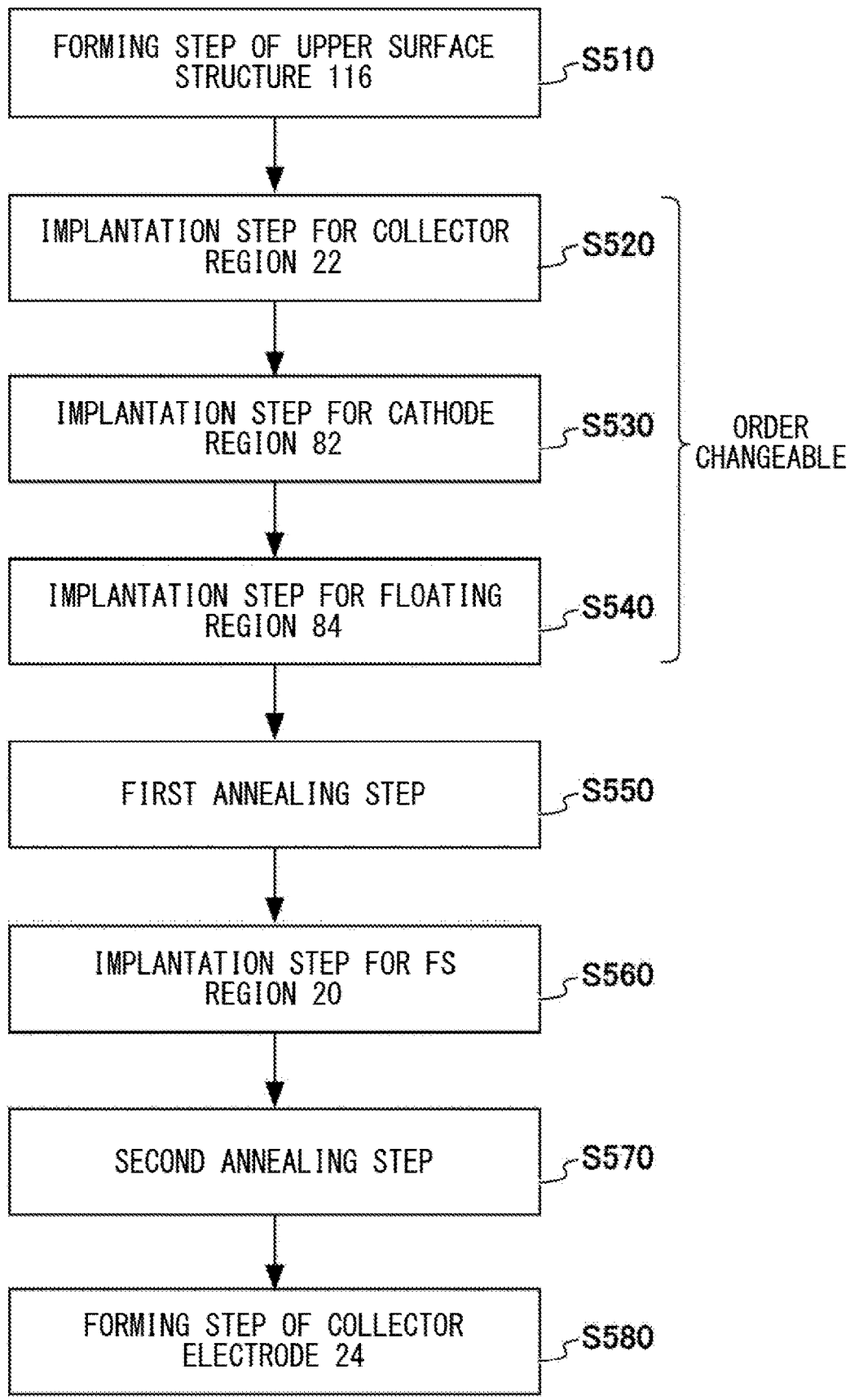
FIG. 13A shows a flow diagram of a method of manufacturing a semiconductor device 300 in a third embodiment.

FIG. 13A is a flow diagram showing a method of manufacturing a semiconductor device 300 in a third embodiment. Note that the semiconductor device 300 is shown in the next drawing. The third embodiment is different from the above-described embodiments in the following point: the position of the boundary 72 matches that of the end portion 91 of the floating region 84. Although the order of the respective steps shown in FIG. 13A is the same as that of FIG. 4A, the order of the steps S520, S530 and S540 may also be appropriately swapped as the respective embodiments of FIGS. 5A, 6A, 10A, 11A and 12A.

Figure 13B:
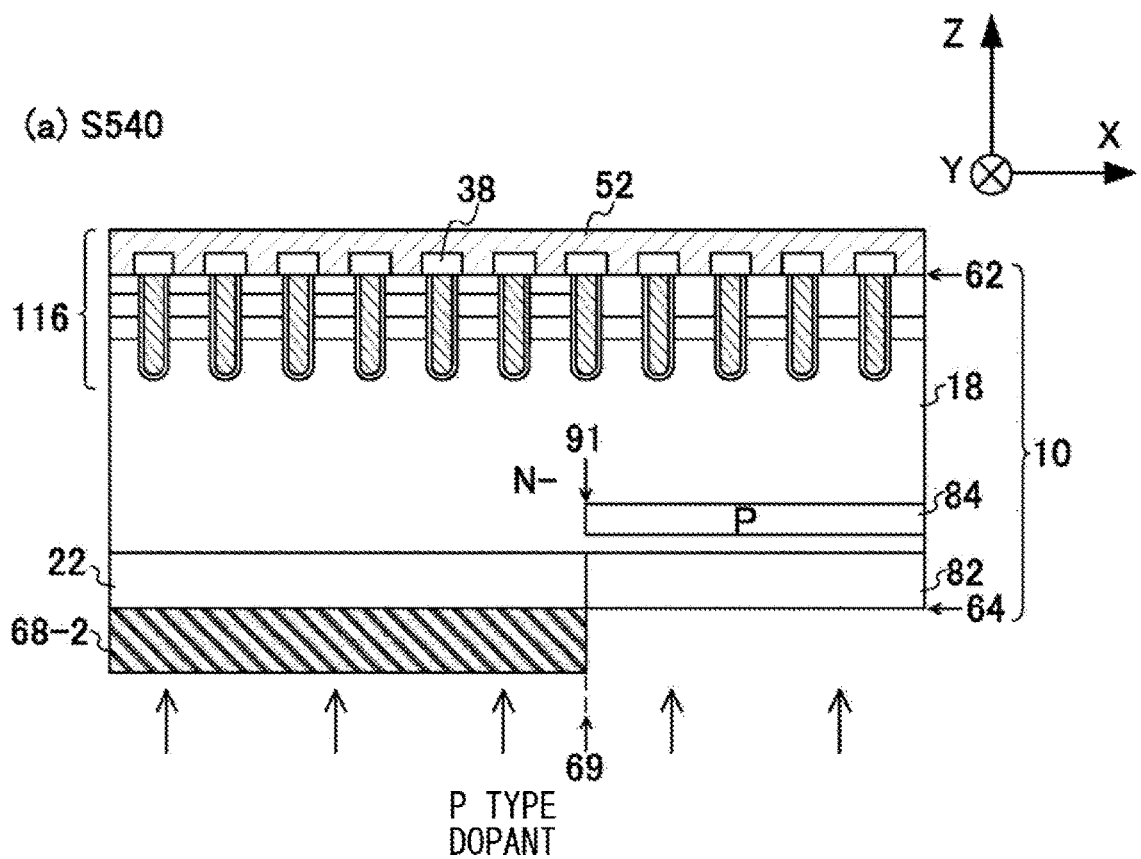
FIG. 13B shows steps of the method of manufacturing the semiconductor device 300 in the third embodiment.
Figure 13B:
Figure 13B:
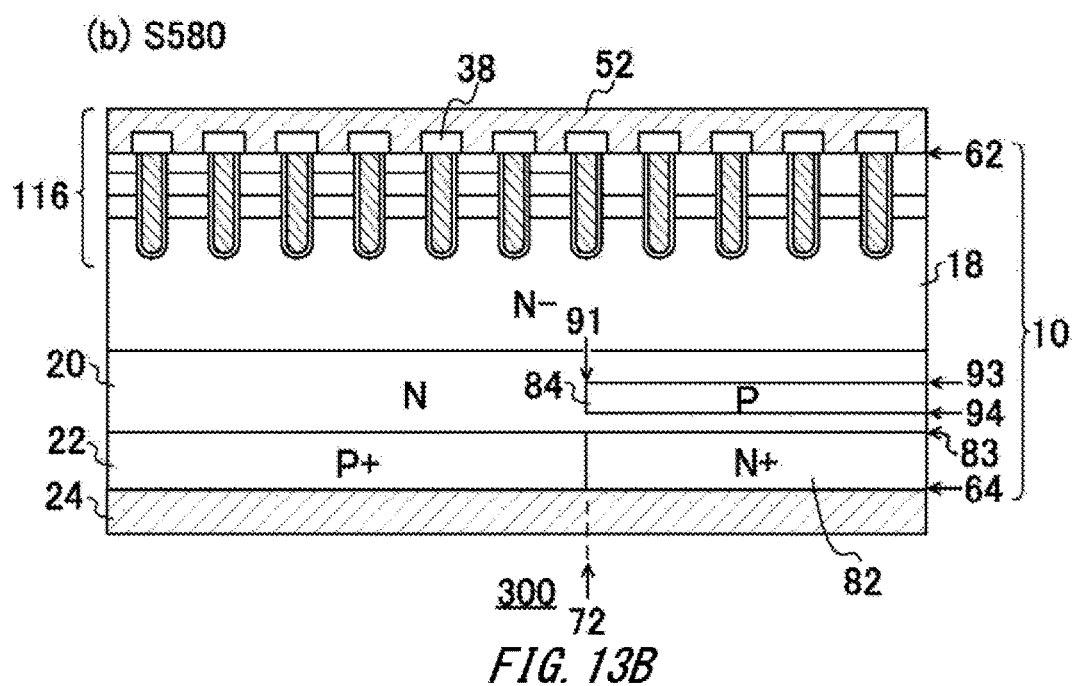

FIG. 13B is a drawing showing steps, as (a) and (b), of a method of manufacturing a semiconductor device 300 in a third embodiment. (a) shown in FIG. 13B is an implantation step for the floating region 84 (S540), and (b) shown in FIG. 13B is a forming step of the collector electrode 24 (S580). In the step S540, an end portion 69 in the X-axis direction of the mask 68-2 corresponding to the floating region 84 is matched with the boundary 72. Accordingly, as shown in the step S580, the end portion 91 of the floating region 84 in the semiconductor device 300 is positioned on the boundary 72 in the X-axis direction. Note that in the present embodiment as well, the position of the end portion 91 is the position at the step S580 that is after the implantation step for the collector region 22 (S520), the implantation step for the cathode region 82 (S530) and the implantation step for the floating region 84 (S540).

At the step S540, the P type dopant may be implanted in a range closer to the upper surface 62 than the cathode region 82. As a result, in the semiconductor device 300, a lower end portion 94 of the floating region 84 may be spaced apart from an upper end portion 83 of the cathode region 82.

In the present embodiment, the floating region 84 can be securely spaced apart from the collector region 22 in the Z-axis direction while making the floating region 84 close to the IGBT region 70 as possible in the X-Y plane direction. Therefore, compared to a case where the floating region 84 is provided in the IGBT region 70, it can securely prevent the floating region 84 and the collector region 22 from being short-circuited. Note that in the semiconductor device 300, the upper end portion 93 of the floating region 84 may be closer to the lower surface 64 than the upper end portion of the FS region 20. That is, the FS region 20 may exist above the upper end portion 93 of the floating region 84.

Figure 13C:
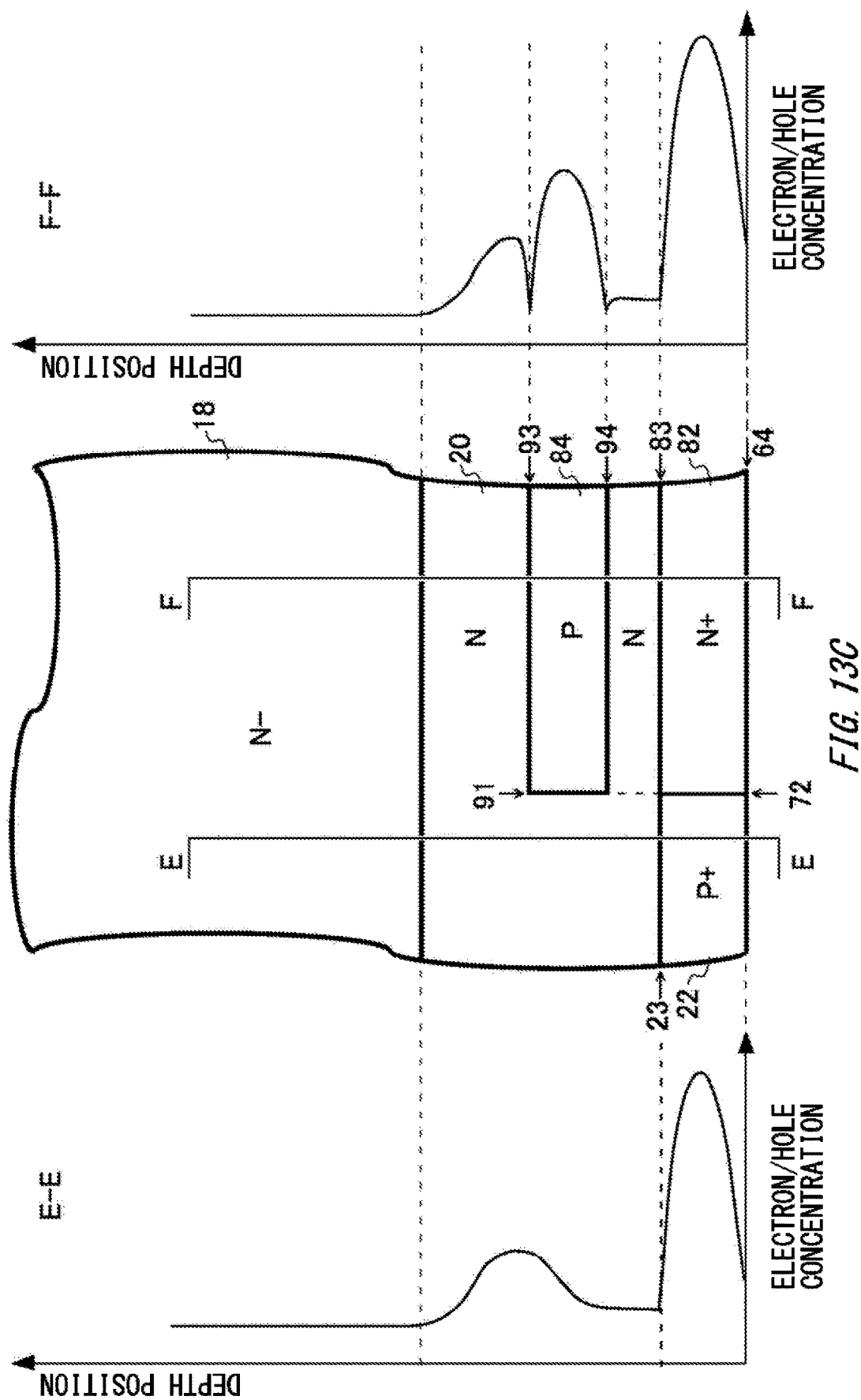
FIG. 13C shows concentration distributions of electrons and holes in the vicinity of the boundary 72 in the third embodiment.

FIG. 13C is a drawing showing the concentration distributions of the electrons and holes in the vicinity of the boundary 72 in the third embodiment. In a center of the FIG. 13C, a partially enlarged view in the vicinity of the boundary 72 in the semiconductor device 300 is shown. In FIG. 13C, the electron/hole concentration distributions at the cross section taken along line E-E and the cross section taken along line F-F of the partially enlarged view are respectively shown by sandwiching a partially enlarged view of the vicinity of the boundary 72. At the cross section taken along line E-E and the cross section taken along line F-F, the horizontal axis indicates the electron concentration or the hole concentration (cm$^{-3}$), and the vertical axis indicates the depth position (μm).

Because the cross section taken along line E-E is the same as the cross section taken along line C-C of FIG. 7, the description is omitted. The cross section taken along line F-F is similar to the cross section taken along line D-D of FIG. 7. However, at the cross section taken along line F-F, the FS region 20 is provided between the upper end portion 83 of the cathode region 82 and the lower end portion 94 of the floating region 84. The cross section taken along line F-F may be the same as (b) shown in FIG. 9 in points excluding the position of the end portion 91 of the floating region 84.

As shown in FIG. 13C, the floating region 84 may be spaced apart from the upper end portion 83 of the cathode region 82. In the present embodiment in which the positions of the upper end portions of the cathode region 82 and of the collector region 22 are the same in the Z-axis direction, the lower end portion 94 of the floating region 84 is closer to the upper surface 62 than the upper end portion 23 of the collector region 22. Also, the upper end portion 93 of the floating region 84 is positioned in a lower portion than the upper end portion of the FS region 20. Note that in the present embodiment, in the Z-axis direction, the upper end portion 83 of the cathode region 82 may be closer to the upper surface 62 than the upper end portion 23 of the collector region 22, and the floating region 84 may also be spaced apart from the upper end portion 83 of the cathode region 82.

Figure 13D:
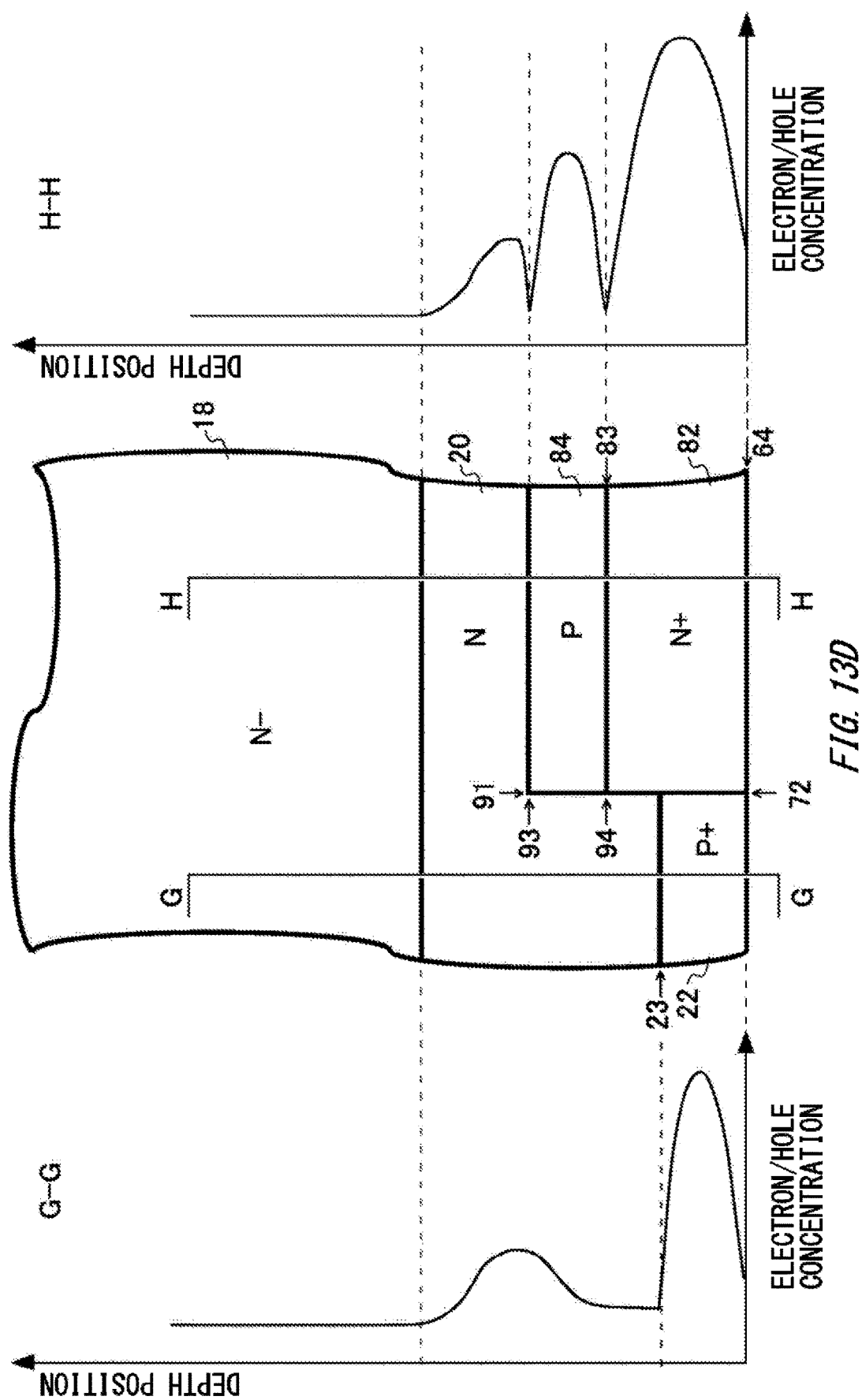
FIG. 13D shows concentration distributions of electrons and holes in the vicinity of the boundary 72 in a first modification example of the third embodiment.

FIG. 13D is a drawing showing the concentration distributions of the electrons and the holes in the vicinity of the boundary 72 in the first modification example of the third embodiment. In a center of FIG. 13D, a partially enlarged view in the vicinity of the boundary 72 is shown, and on the left side and the right side of FIG. 13D, the dopant concentration distributions at the cross section taken along line G-G and the cross section taken along line H-H of the partially enlarged view are respectively shown. The horizontal axis and the vertical axis of each of the cross section taken along line G-G and the cross section taken along line H-H are the same as those of FIG. 13C.

In the first modification example, the thickness of the cathode region 82 in the Z-axis direction is made thicker than the thickness of the collector region 22 in the Z-axis direction. The upper end portion 83 of the cathode region 82 and the lower end portion 94 of the floating region 84 are taken as positions at which troughs of the electron concentration and the hole concentration are formed. For example, after the implantation step S520 for the collector region 22 of implanting the P type dopant in the lower surface 64, the cathode region 82 thicker than the collector region 22 is formed by performing the implantation step S530 for the cathode region 82 of implanting the N type dopant. Note that the implantation step S530 for the cathode region 82 of implanting the N type dopant may also be performed first, and after this, the implantation step S520 for the collector region 22 may be performed.

In the first modification example, because the cathode region 82 is thicker than the collector region 22, the upper end portion 83 of the cathode region 82 is positioned closer to the upper surface 62 than the upper end portion 23 of the collector region 22. Also, the lower end portion 94 of the floating region 84 is closer to the upper surface 62 than the upper end portion 23 of the collector region 22. Accordingly, it can securely prevent the floating region 84 and the collector region 22 from being short-circuited. For that reason, the characteristics of the semiconductor device 300 can be made close to the designed characteristics. Also, not only the third embodiment in which the position of the boundary 72 are matched with that of the end portion 91 of the floating region 84, in the first embodiment and the second embodiment as well, by making the cathode region 82 thicker than the collector region 22, an intended structure can be easily manufactured and a reliability can be further enhanced. Note that that the cathode region 82 is thicker than the collector region 22 may also be intended to a case where the cathode region 82 is apparently thicker than the collector region 22, not only a case where the cathode region 82 is slightly thicker than the collector region 22. Specifically, the cathode region 82 may be thicker than the collector region 22 by about 1.2 times, preferably, the cathode region 82 may be thicker than the collector region 22 by about 1.4 times, and more preferably, the cathode region 82 may be thicker than the collector region 22 by about 1.6 times.

Note that the implantation step S540 for the floating region 84 may also be performed before the implantation step S520 for the collector region 22 and the implantation step S530 for the cathode region 82. Also, the implantation step S540 for the floating region 84 may also be performed between the implantation step S520 for the collector region 22 and the implantation step S530 for the cathode region 82 or after the implantation step S520 for the collector region 22 and the implantation step S530 for the cathode region 82. Note that in the first modification example as well, the end portion 91 of the floating region 84 is positioned on the boundary 72.

Figure 13E:
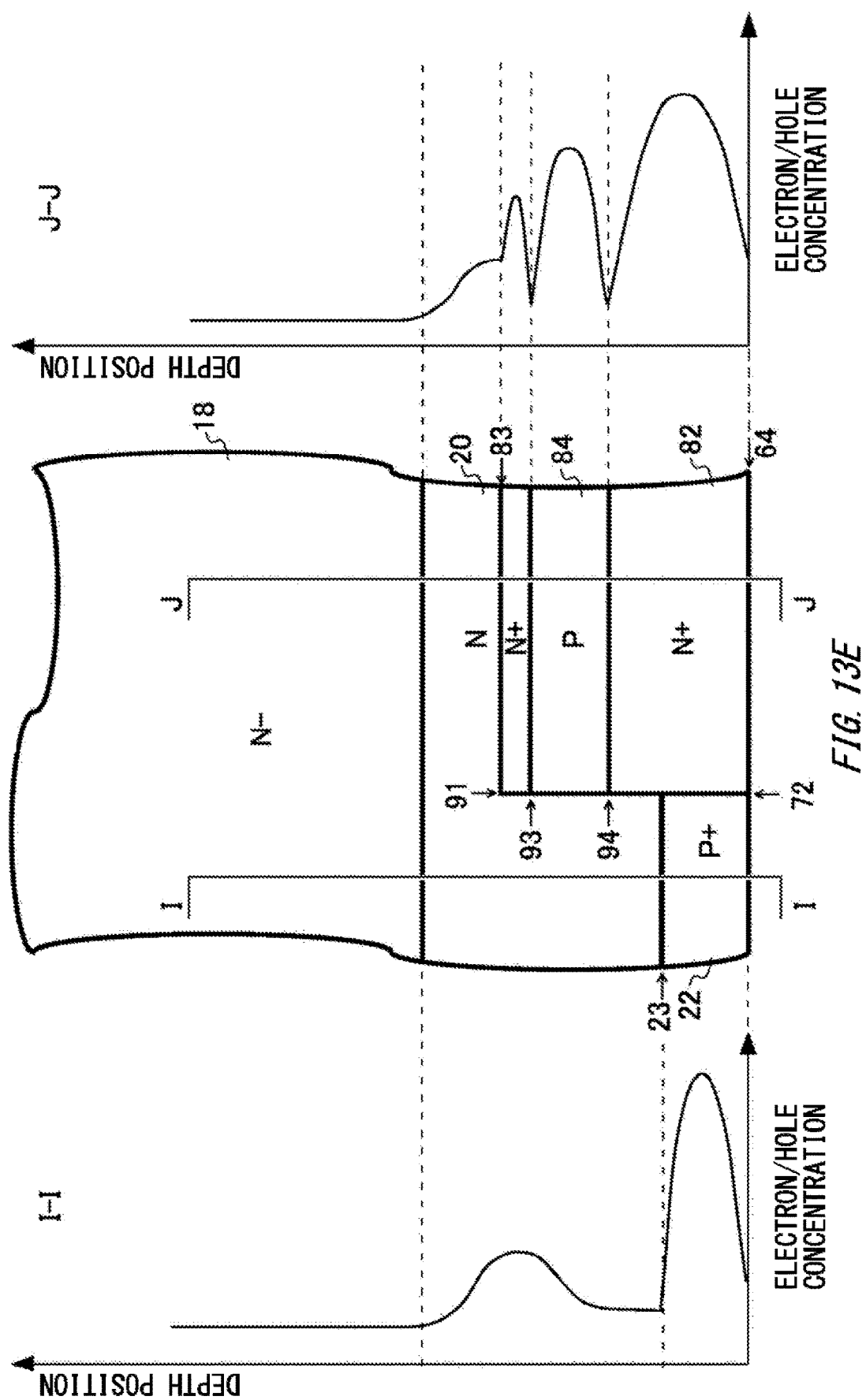
FIG. 13E shows concentration distributions of electrons and holes in the vicinity of the boundary 72 in a second modification example of the third embodiment.

FIG. 13E is a drawing showing the concentration distributions of the electrons and the holes in the vicinity of the boundary 72 in the second modification example of the third embodiment. In a center of FIG. 13E, a partially enlarged view in the vicinity of the boundary 72 is shown, and in FIG. 13E, the dopant concentration distributions at the cross section taken along line I-I and the cross section taken along line J-J of the partially enlarged view are respectively shown by sandwiching a partially enlarged view of the vicinity of the boundary 72. The horizontal axis and the vertical axis of each of the cross section taken along line I-I and cross section taken along line J-J are the same as those of FIG. 13C.

In the second modification example as well, the thickness of the cathode region 82 in the depth direction is made thicker than the thickness of the collector region 22 in the Z-axis direction. Note that the depth direction may be parallel to a direction toward the upper surface 62 from the lower surface 64. At the implantation step for the cathode region 82, the N type ion may also be implanted by different accelerated energies. That is, at the implantation step for the cathode region 82, the ion implantation may be performed so that the N type ion concentration distribution has a peak at one position in the depth direction, or the ion implantation may also be performed so that the N type ion concentration distribution has peaks at a plurality of different positions in the depth direction.

In the case where the cathode region 82 has the peaks at the plurality of different positions in the depth direction, the peak position of the P type dopant concentration distribution of the floating region 84 may be provided between the plurality of peaks of the N type dopant concentration distribution of the cathode region 82. The respective concentrations of the plurality of peaks in the N type dopant concentration distribution of the cathode region 82 may be the same, may be gradually decreased toward the upper surface 62, or may also be gradually increased toward the upper surface 62. Also, the concentration of the P type dopant implanted at the implantation step S540 for the floating region 84 may be higher than the concentration of the N type dopant implanted in the region of the floating region 84 at the implantation step S530 for the cathode region 82.

In the second modification example, the N type dopant is implanted at the step S530 so that the N type dopant concentration in the cathode region 82 has two peaks at different positions in the depth direction. Accordingly, the electron concentration in the cathode region 82 has two peaks at different positions in the depth direction. Further, in the second modification example, the P type dopant is implanted at the step S540 so that the peak of the P type dopant concentration in the floating region 84 is positioned between the two peaks of the N type dopant concentration. Accordingly, the peak position of the hole concentration in the floating region 84 is positioned between the two peaks of the electron concentration in the cathode region 82 in the depth direction. In the second modification example, compared to a case where the peak positions of the cathode region 82 and the peak position of the floating region 84 are overlapped in the depth direction, even if the P type dopant concentration is reduced at the implantation step for the floating region 84, the floating region 84 having a sufficient P type characteristics can be obtained.

Also, in another embodiment, the N type dopant concentration in the cathode region 82 may also have three or more peaks at different positions in the depth direction. In this case, the peak position of the floating region 84 may be provided between any two peak positions of the cathode region 82.

In the second modification example, the entire range of the floating region 84 in the Z-axis direction is positioned within the cathode region 82. Also, the lower end portion 94 of the floating region 84 is closer to the upper surface 62 than the upper end portion 23 of the collector region 22. For that reason, the floating region 84 can be securely spaced apart from the collector region 22 in the Z-axis direction while making the floating region 84 close to the IGBT region 70 in the X-Y plane direction as possible. Note that in another embodiment, at least a part of the floating region 84 may also be positioned within the cathode region 82. That is, the lower portion of the floating region 84 is partially overlapped with the upper portion of the cathode region 82, and the upper end portion 93 of the floating region 84 may also be in an upper portion than the upper end portion 83 of the cathode region 82. If the concentration of the peak of the floating region 84 is higher than that of the peak of the cathode region 82, such a shape is easily formed.

Note that the descriptions of the collector region 22, the cathode region 82 and the floating region 84 of FIG. 13B to FIG. 13E may also be applied to the first embodiment and the second embodiment in which the end portion 91 of the floating region 84 does not reach the boundary 72 in the X-axis direction.

Figure 14:
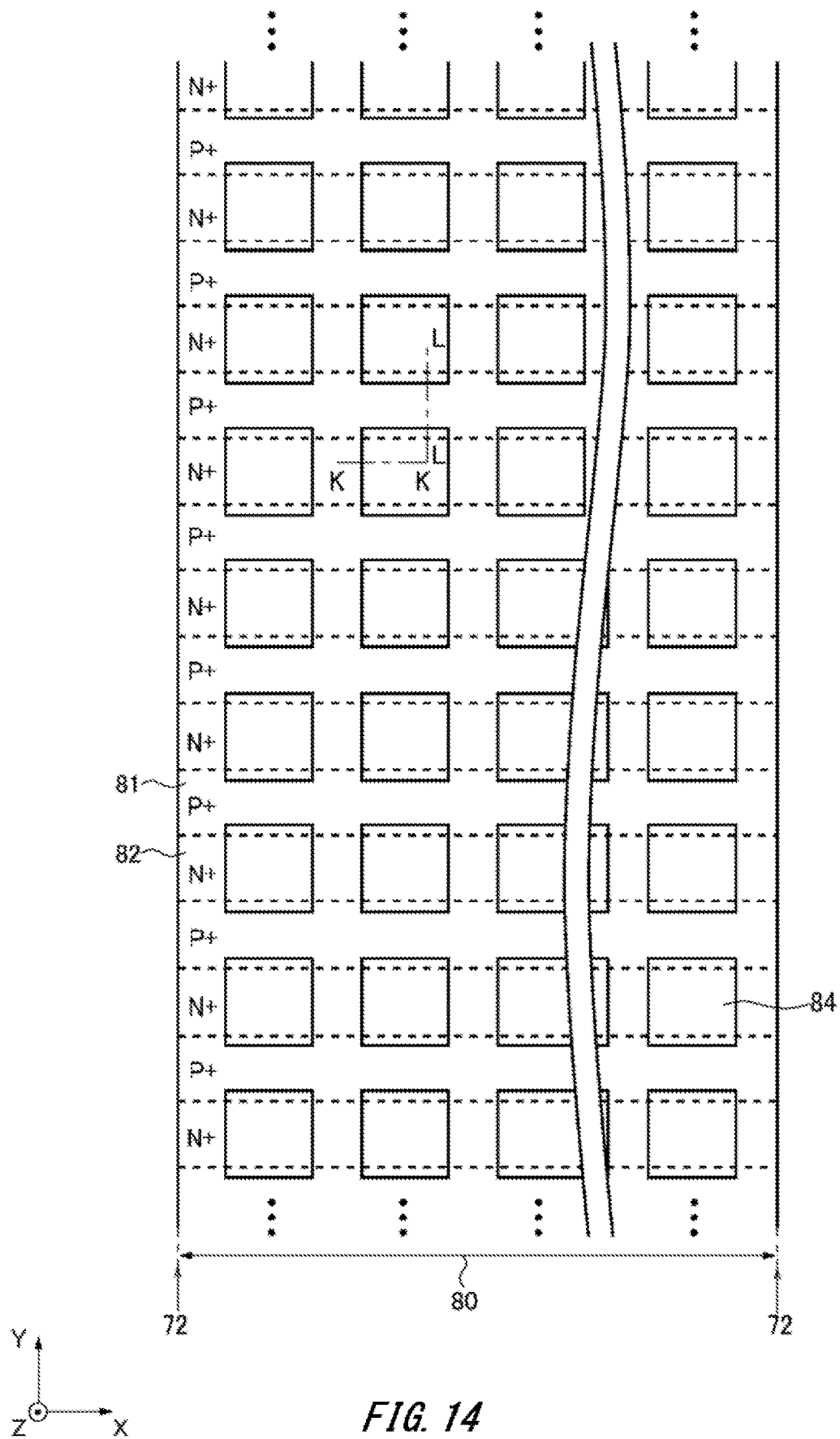
FIG. 14 shows a top view of a FWD region 80 according to a fourth embodiment.

FIG. 14 is a top view of the FWD region 80 according to a fourth embodiment. The semiconductor device of the fourth embodiment may have, on one semiconductor substrate 10, both of the FWD region 80 and the IGBT region 70 or may also only have the FWD region 80. The IGBT region 70 is the same as any of the IGBT region 70 in the first to the third embodiments. The IGBT region 70 is arranged next to the FWD region 80 in the top view.

In the present example, a region in which a gate structure including the gate trench portion 40 and the emitter region 12 is periodically arranged is set as the IGBT region 70. Also, a region in which the gate structure is not provided and the cathode region 82 is periodically arranged on the lower surface 64 of the semiconductor substrate 10 is set as the FWD region 80. 80% or more of an area of an upper surface of each mesa portion 60 of the FWD region 80 may be set as P type region such as the base region 14.

The FWD region 80 of the present example is different from the FWD region 80 of the first to the third embodiments in that the FWD region 80 of the present example includes the inter-cathode region 81 of a first conductivity type (P+ type in the present example) exposed on the lower surface 64 of the semiconductor substrate 10. The structure of the FWD region 80 of the present example except the inter-cathode region 81 is the same as that of any example in each of the first to the third embodiments. A doping concentration and a thickness in the Z-axis direction of the inter-cathode region 81 may be the same as those of the collector region 22 of the IGBT region 70.

The inter-cathode region 81 and the cathode region 82 are alternately arranged in a predetermined direction on a plane parallel to the lower surface 64. In the example of FIG. 14, the inter-cathode region 81 and the cathode region 82 are alternately arranged along the Y-axis direction. The inter-cathode region 81 and the cathode region 82 may have a band-like shape extending in the X-axis direction from one end to the other end in the X-axis direction of the FWD region 80.

In another example, the inter-cathode region 81 and the cathode region 82 may also be alternately arranged along a direction different from the Y-axis direction. Also, the inter-cathode region 81 and the cathode region 82 may also be alternately arranged in two directions. The inter-cathode region 81 and the cathode region 82 may also be alternately arranged in both of the X-axis direction and the Y-axis direction.

The floating region 84 is provided above the cathode region 82 and above the inter-cathode region 81. However, the floating region 84 is not provided above a partial region of the cathode region 82. Also, the floating region 84 is not provided above a partial region of the inter-cathode region 81.

By providing the inter-cathode region 81 and the floating region 84 in the FWD region 80, the carrier injection amount from the cathode region 82 can be adjusted with higher accuracy. For this reason, the characteristics of the semiconductor device can be adjusted with higher accuracy.

Figure 15:
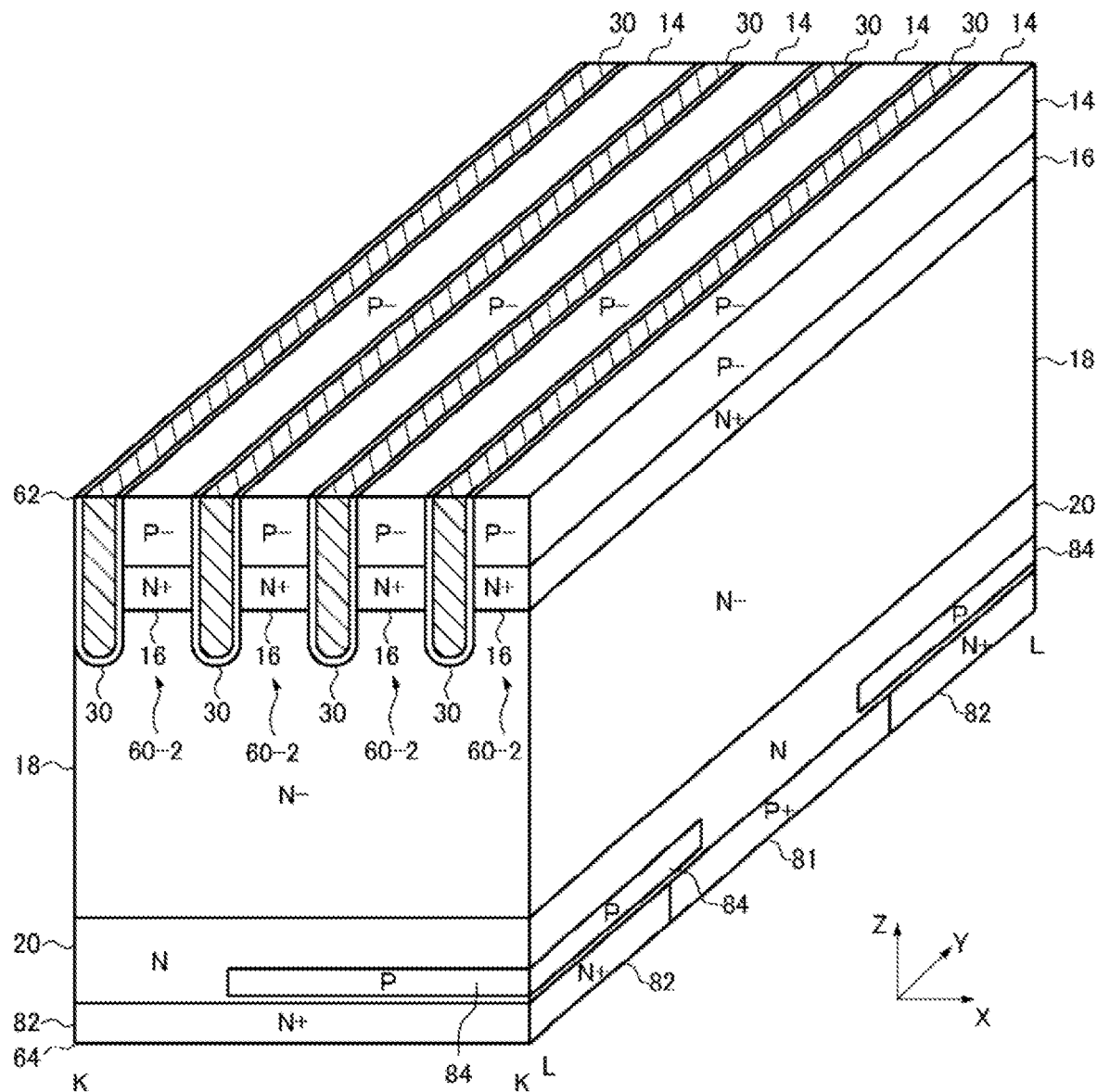
FIG. 15 shows a perspective cross-sectional view including a K-K cross section and an L-L cross section in FIG. 14.

FIG. 15 is a perspective cross-sectional view including a K-K cross section and an L-L cross section in FIG. 14. The K-K cross section is the XZ plane and the L-L cross section is the YZ plane. In FIG. 15, a cross section of the semiconductor substrate 10 is shown and the interlayer dielectric film 38, the emitter electrode 52 and the collector electrode 24 are omitted.

As shown in FIG. 14 and FIG. 15, the floating region 84 of the present example is arranged overlapping a part of each cathode region 82 in the X-axis direction. That is, a part of the cathode region 82 in the X-axis direction is not overlapped with the floating region 84. The floating region 84 may be arranged overlapping a part of each inter-cathode region 81 in the X-axis direction. A part of the inter-cathode region 81 in the X-axis direction may not be overlapped with the floating region 84. Note that the term "overlapping/overlapped" refers to an arrangement on positions facing each other in the Z-axis direction. As shown in FIG. 14, the floating region 84 may be discretely arranged in the X-axis direction. The drift region 18 or the FS region 20 may be provided between two floating regions 84.

As shown in FIG. 14 and FIG. 15, the floating region 84 of the present example is arranged overlapping all over each cathode region 82 in the Y-axis direction. The floating region 84 of the present example extends to a position on which the floating region 84 is overlapped with a part of the inter-cathode region 81 in the Y-axis direction. As shown in FIG. 14, the floating region 84 may be discretely arranged in the Y-axis direction. Two end portions of each cathode region 82 in the Y-axis direction may be overlapped with the floating region 84. Also, in another example, the floating region 84 may also be arranged overlapping all over each inter-cathode regions 81 the Y-axis direction. In this case, the floating region 84 may extend to a position on which the floating region 84 is overlapped with a part of the cathode region 82 in the Y-axis direction.

As shown in FIG. 15, the dummy trench portion 30 is provided extending in a predetermined extending direction (the Y-axis direction in the present example), The extending direction of the dummy trench portion 30 is a longitudinal direction of the dummy trench portion 30 in the top view. The inter-cathode region 81 and the cathode region 82 are alternately arranged along the extending direction of the dummy trench portion 30 (the Y-axis direction). For this reason, both of the inter-cathode region 81 and the cathode region 82 are arranged below each mesa portion 60-2. For this reason, the carrier injection amount from the cathode region 82 can be equalized in each mesa portion 60-2.

Also, the floating region 84 is arranged apart from the inter-cathode region 81 in the depth direction of the semiconductor substrate 10. Accordingly, the floating region 84 is prevented from being connected to the collector electrode 24 via the inter-cathode region 81. The FS region 20 or the drift region 18 may be provided between the inter-cathode region 81 or the floating region 84.

Figure 16:
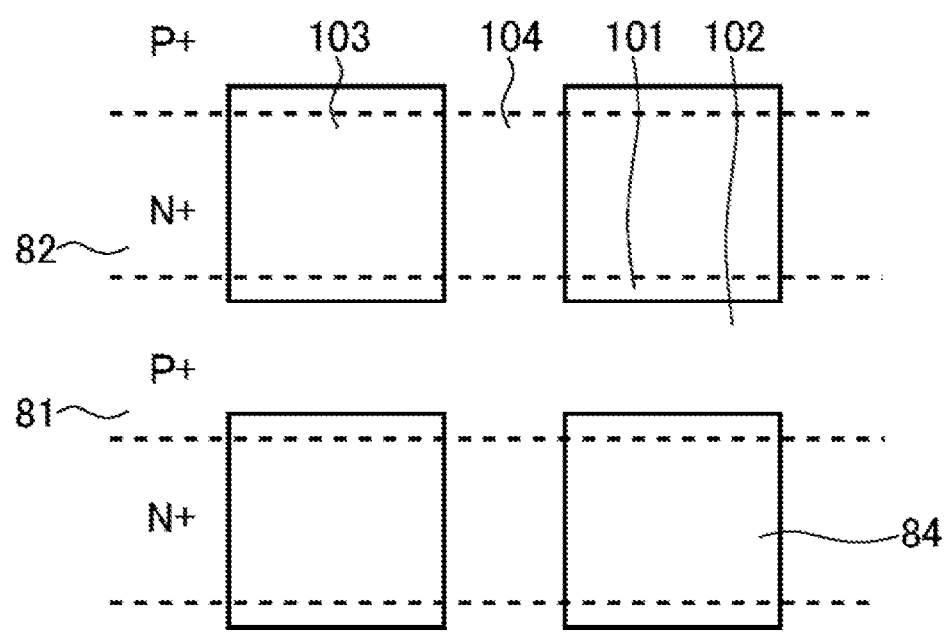
FIG. 16 shows an enlarged top view for describing an arrangement example of a floating region 84, a cathode region 82 and an inter-cathode region 81.

FIG. 16 is an enlarged top view for describing an arrangement example of the floating region 84, the cathode region 82 and the inter-cathode region 81. In the present example, a region in which the floating region 84 and the inter-cathode region 81 are overlapped with each other is set as a first region 101, a region in which the inter-cathode region 81 is provided but the floating region 84 is not provided is set as a second region 102, a region in which the cathode region 82 and the floating region 84 are overlapped with each other is set as a third region 103 and a region in which the cathode region 82 is provided but the floating region 84 is not provided is set as a fourth region 104. The first region 101 is a region in which the electron injection amount from the lower surface 64 side is the smallest, that is, a region in which the electron injection amount does not substantially exist, and the fourth region 104 is a region in which the electron injection amount from the lower surface 64 side is the largest. The second region 102 is also, similar to the first region 101, a region in which the electron injection amount does not substantially exist. On the other hand, these first region 101 and second region 102 have an effect of implanting holes during reverse recovery and can also adjust the hole injection amount by the floating region 84. The third region 103 is a region in which the electron injection amount from the lower surface 64 side is more than that in the first region 101 and in the second region 102 and is less than that in the fourth region 104. Note that the electron injection amount is an injection amount per area unit.

In this way, by arranging the floating region 84 and the cathode region 82 and the inter-cathode region 81 so that the floating region 84 is overlapped with the cathode region 82 and the inter-cathode region 81, the first region 101, the second region 102, the third region 103 and the fourth region 104 for adjusting the injection of carriers (electrons/holes) can be provided. By adjusting an area ratio of these regions, a total injection amount of carriers (electrons/holes) in the FWD region 80 can be adjusted with high accuracy. Also, by providing the floating region 84 per cathode region 82 and setting a width of the floating region 84 larger than a width of the cathode region 82 in the Y-axis direction, the first region 101 can be arranged on each boundary between the inter-cathode region 81 and the cathode region 82.

As one example, an area of the floating region 84 in the top view may be larger than an area of the cathode region 82. The area of the floating region 84 is larger than an area of the first region 101. Also, the area of the floating region 84 is larger than an area of the third region 103. The area of the floating region 84 may be equal to or less than 90% of a sum of areas of the cathode region 82 and the inter-cathode region 81. Also, an area of the inter-cathode region 81 in the top view may be larger than the area of the cathode region 82. Note that an area of each region refers to a total area per region in the FWD region 80.

Figure 17:
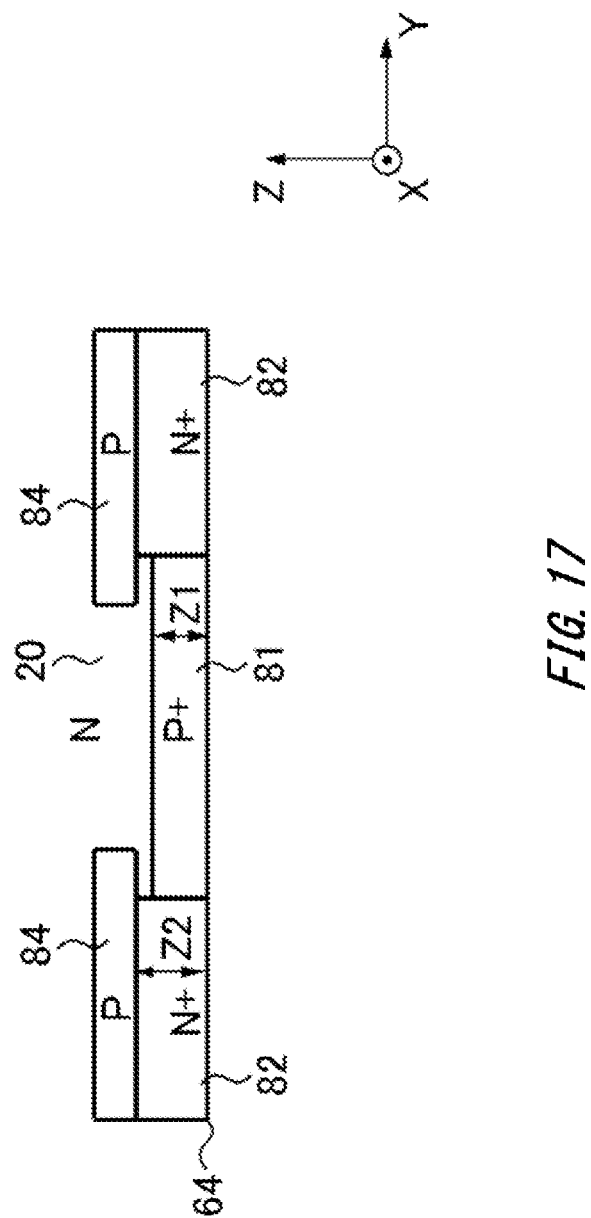
FIG. 17 shows the cathode region 82 and the inter-cathode region 81 on a YZ plane.

FIG. 17 is a drawing showing the cathode region 82 and the inter-cathode region 81 on the YZ plane. The cathode region 82 is provided to a portion deeper than the inter-cathode region 81, with the lower surface 64 of the semiconductor substrate 10 as a reference. A thickness of the cathode region 82 in the depth direction (the Z-axis direction) is set as Z2 and a thickness of the inter-cathode region 81 is set as Z1. The thickness Z2 is larger than the thickness Z1.

The floating region 84 is arranged above an upper end portion of the cathode region 82. By setting the thickness Z2 of the cathode region 82 large, the floating region 84 and the inter-cathode region 81 can be suppressed from contacting with each other. Note that the floating region 84 may be in contact with or may also be spaced apart from the cathode region 82.

Figure 18:
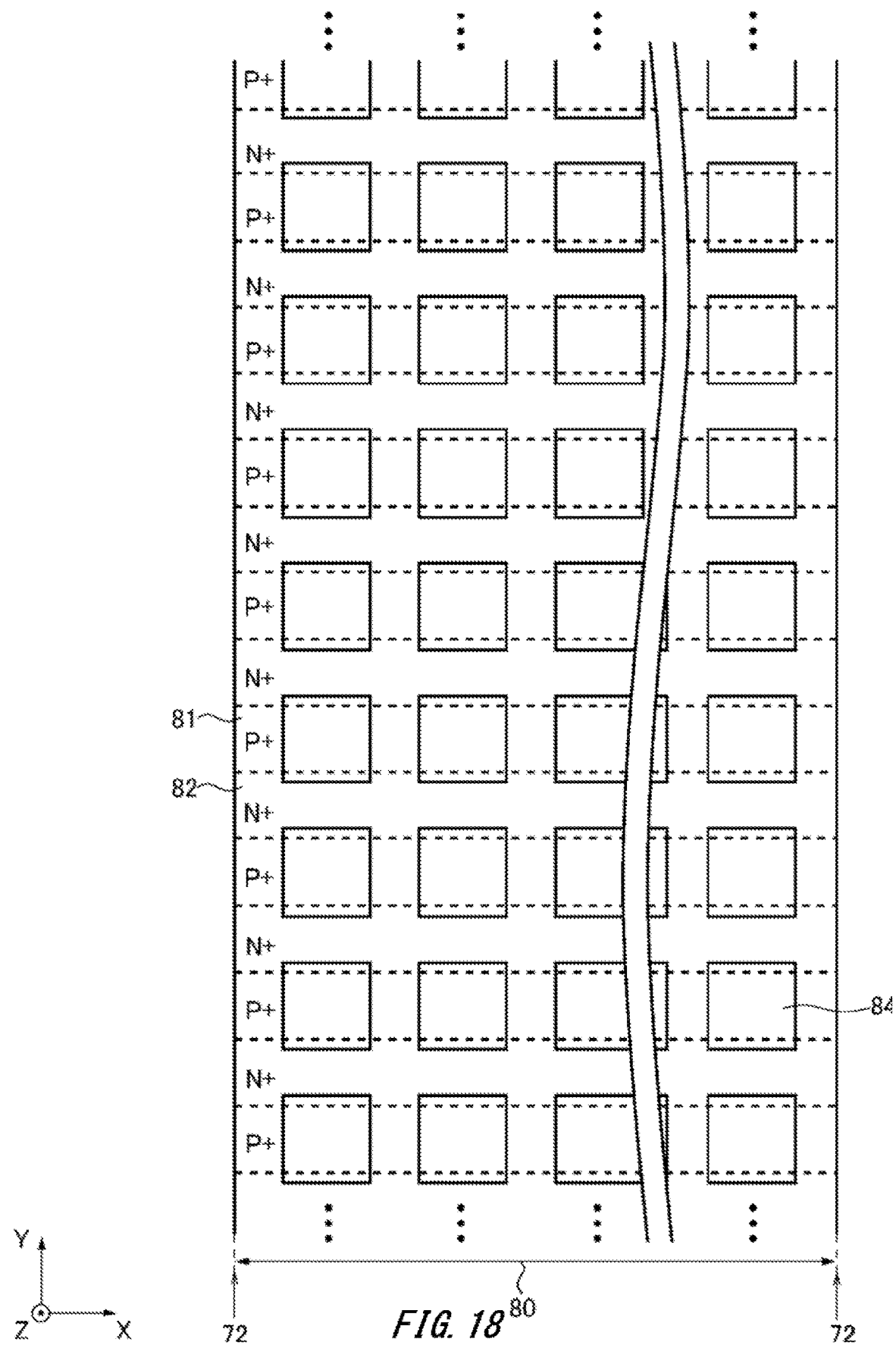
FIG. 18 shows a top view of the FWD region 80 according to a first modification example of the fourth embodiment.

FIG. 18 is a top view of the FWD region 80 according to a first modification example of the fourth embodiment. The FWD region 80 of the present example is different from that of the examples described in FIG. 14 to FIG. 16 in the arrangement of the floating region 84 in the Y-axis direction. The other structures of the FWD region 80 of the present example are similar to those of the examples described in FIG. 14 to FIG. 16

The floating region 84 of the present example is arranged overlapping all over the inter-cathode region 81 in the Y-axis direction and overlapping a partial region of the cathode region 82 in the Y-axis direction. In the example shown in FIG. 14, the area of the fourth region 104 shown in FIG. 16 can be reduced and the electron injection amount from the cathode region 82 can be reduced. In the present example, because the area of the fourth region 104 increases, the electron injection amount from the cathode region 82 increases. In this way, by providing the floating region 84 and the inter-cathode region 81, the electron injection amount from the cathode region 82 can be easily adjusted.

Figure 19:
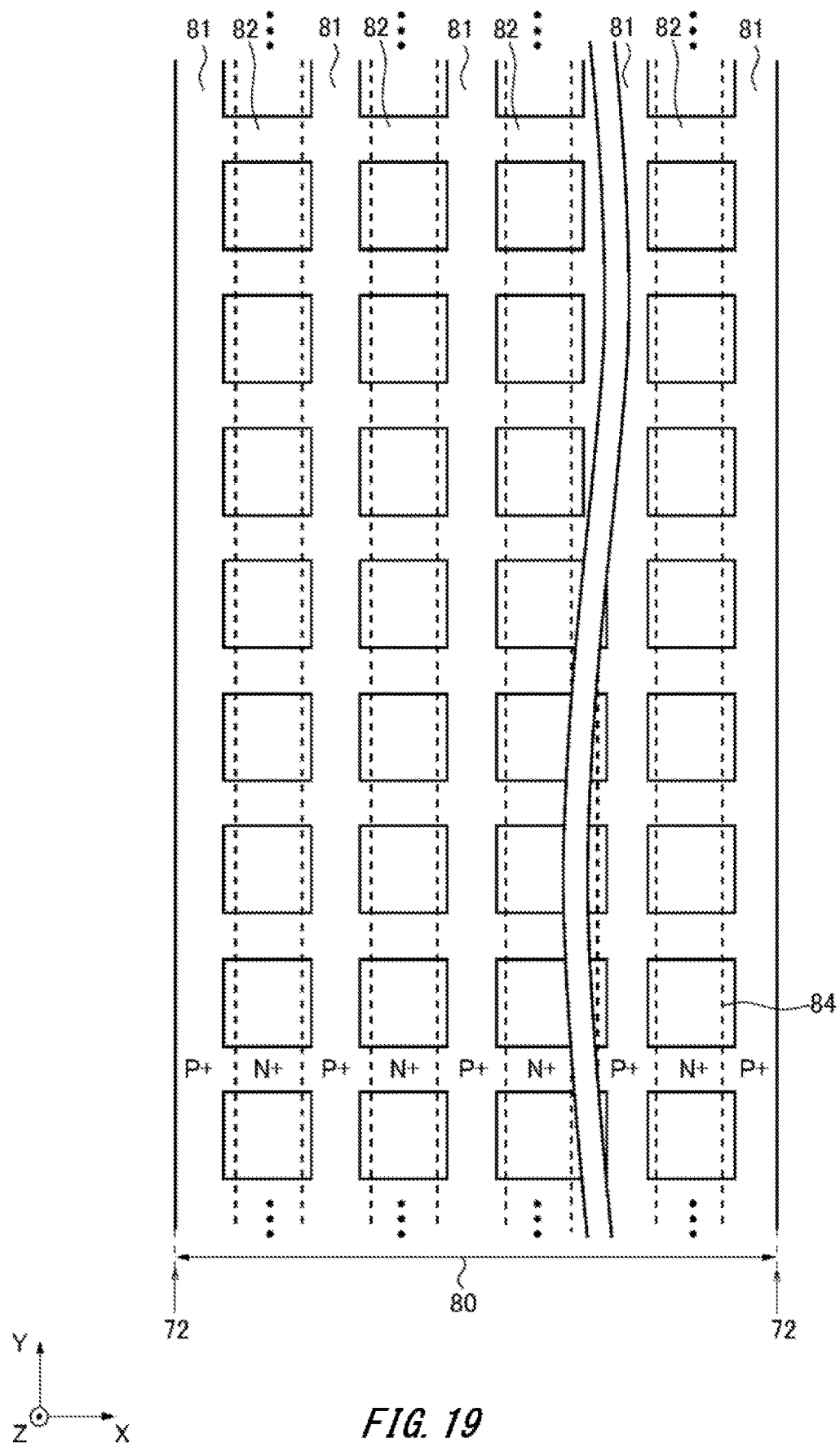
FIG. 19 shows a top view of the FWD region 80 according to a second modification example of the fourth embodiment.

FIG. 19 is a top view of the FWD region 80 according to a second modification example of the fourth embodiment. The FWD region 80 of the present example is different from that of the examples described in FIG. 14 to FIG. 18 in that the cathode region 82 and the inter-cathode region 81 are alternately arranged along the X-axis direction. The other structures of the FWD region 80 of the present example are similar to those of the examples described in FIG. 14 to FIG. 18.

In FIG. 19, the floating region 84 is arranged overlapping all over the cathode region 82 in the X-axis direction and overlapping a partial region of the inter-cathode region 81 in the X-axis direction. In another example, the floating region 84 may also be arranged overlapping all over the inter-cathode region 81 in the X-axis direction and overlapping a partial region of the cathode region 82 in the X-axis direction. According to the present example as well, the electron injection amount from the cathode region 82 of the FWD region 80 can be controlled with high accuracy.

Figure 20:
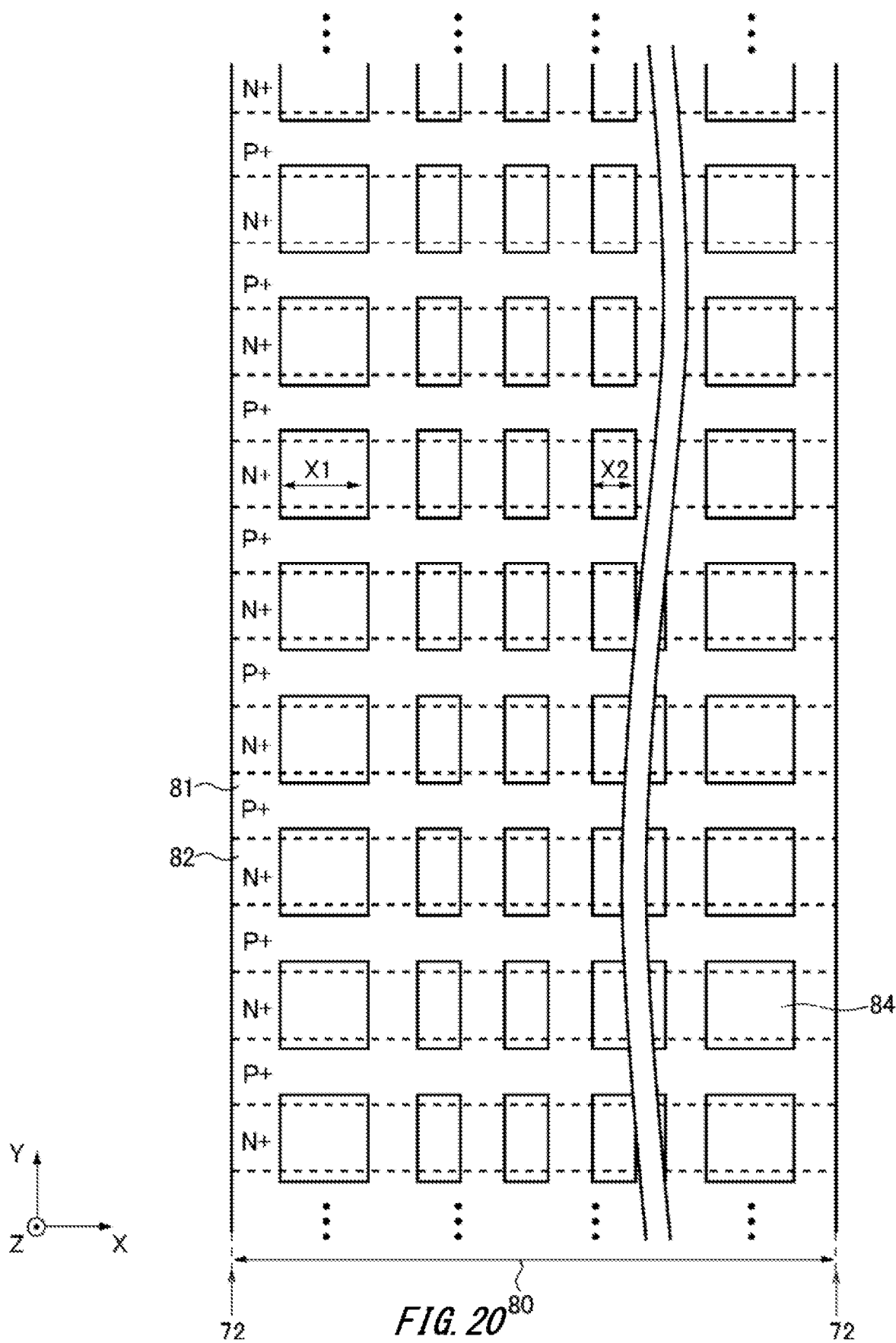
FIG. 20 shows a top view of the FWD region 80 according to a third modification example of the fourth embodiment.

FIG. 20 is a top view of the FWD region 80 according to a third modification example of the fourth embodiment. The FWD region 80 of the present example is different from that of the examples described in FIG. 14 to FIG. 19 in the arrangement of the floating region 84. The other structures of the FWD region 80 of the present example are similar to those of the examples described in FIG. 14 to FIG. 19.

In the present example, a width of the floating region 84 in the X-axis direction arranged closest to the boundary 72 with the IGBT region 70 is set as X1. Also, a width of the floating region 84 in the X-axis direction arranged on a center of the FWD region 80 in the X-axis direction is set as X2. The width X1 of the present example may be larger than the width X2. The width X1 may be 1.5 times as much as the width X2 or more, and may also be twice as much as the width X2 or more. Accordingly, electron injection amount from the cathode region 82 in the vicinity of the boundary 72 with the IGBT region 70 can be suppressed. For this reason, the carriers flowing from the FWD region 80 to the IGBT region 70 can be reduced. The floating region 84 arranged closest to the boundary 72 with the IGBT region 70 may have the largest width in the X-axis direction among a plurality of the floating regions 84.

Also, in another example, the width X1 may also be smaller than the width X2. The width X2 may be 1.5 times as much as the width X1 or more and may also be twice as much as the width X1 or more. The floating region 84 arranged closest to the boundary 72 with the IGBT region 70 may have the smallest width in the X-axis direction among a plurality of the floating regions 84.

Figure 21:
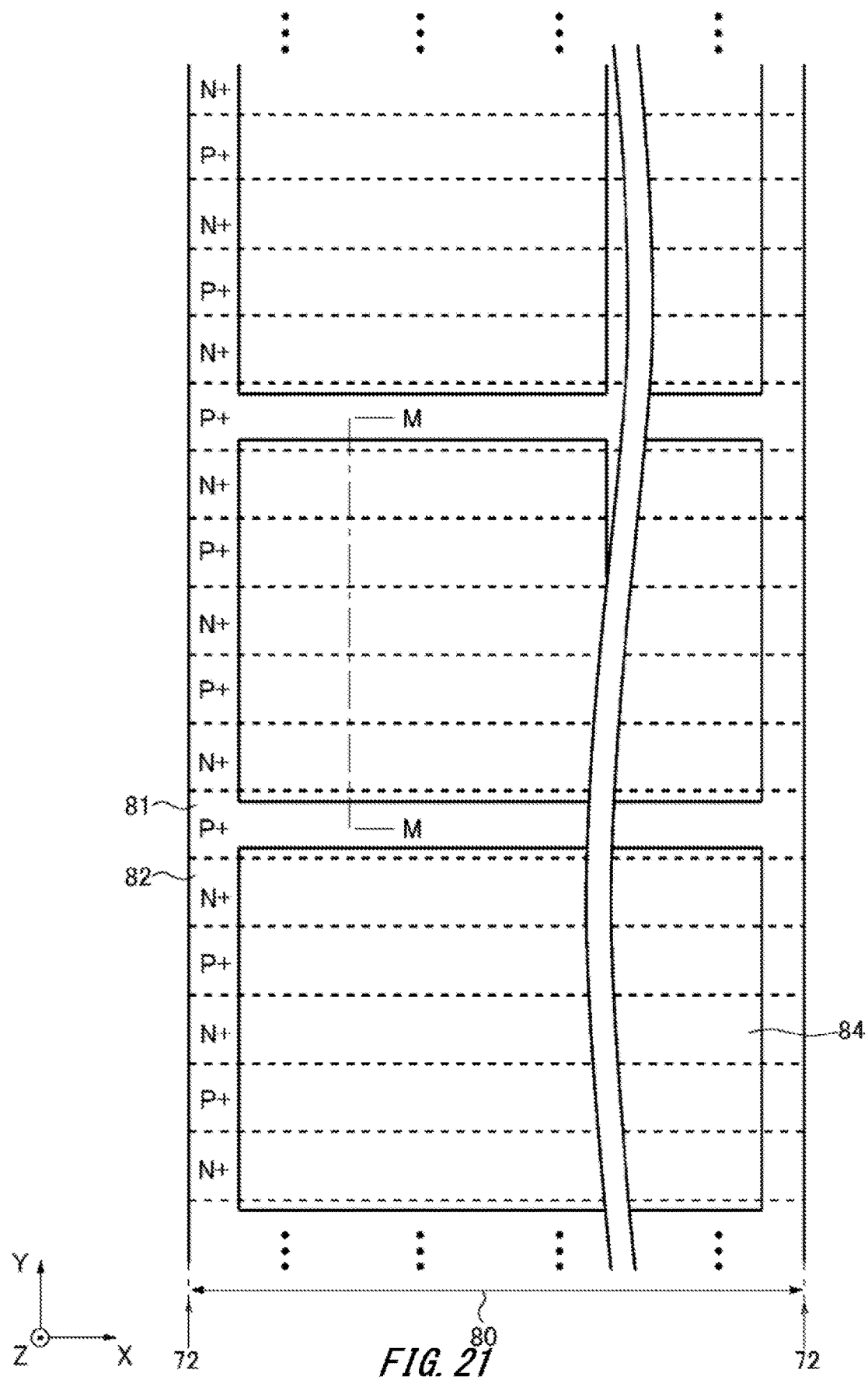
FIG. 21 shows a top view of the FWD region 80 according to a fourth modification example of the fourth embodiment.

FIG. 21 is a top view of the FWD region 80 according to a fourth modification example of the fourth embodiment. The FWD region 80 of the present example is different from that of the examples described in FIG. 14 to FIG. 20 in the arrangement of the floating region 84. The other structures of the FWD region 80 of the present example are similar to those of the examples described in FIG. 14 to FIG. 20.

The floating region 84 of the present example is continuously provided across the one or more entire cathode regions 82 and the one or more entire inter-cathode regions 81 in the Y-axis direction. The floating region 84 may also be continuously provided across a plurality of cathode regions 82 and a plurality of inter-cathode regions 81.

Figure 22:
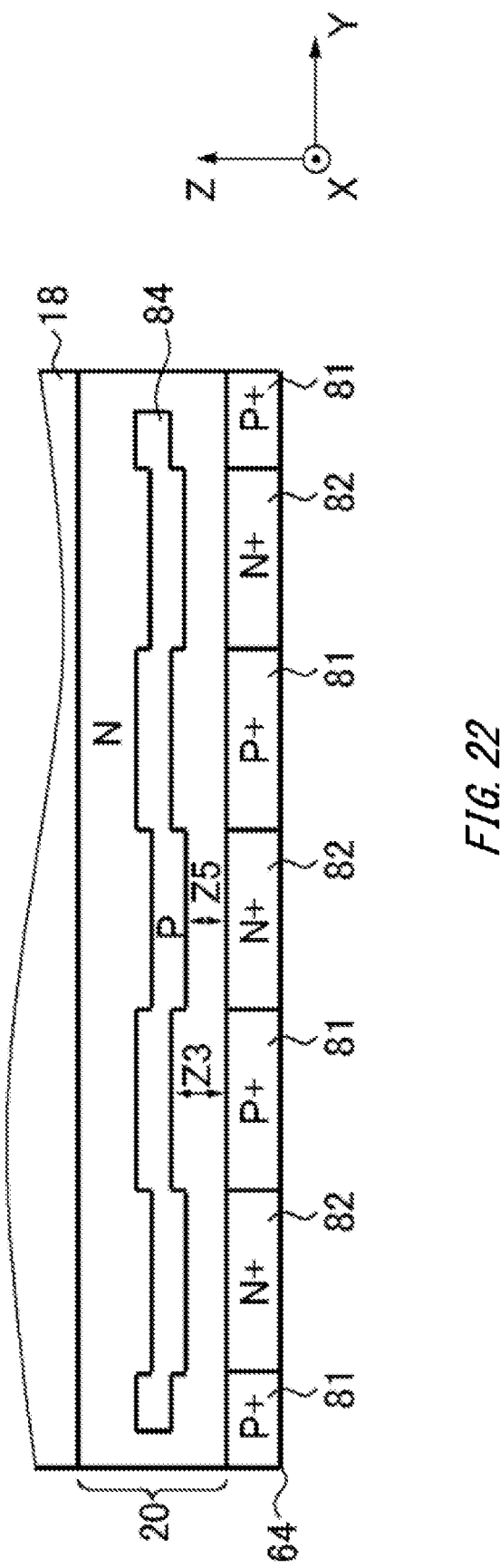
FIG. 22 shows one example of an M-M cross section in FIG. 21.

FIG. 22 is a drawing showing one example of an M-M cross section in FIG. 21. In FIG. 22, a cross section in the vicinity of the lower surface 64 of the semiconductor substrate 10 is shown. In the present example, a distance from the upper end portion of the cathode region 82 to the lower end portion of the floating region 84 in the depth direction (the Z-axis direction) is set as Z5. Also, a distance from the upper end portion of the inter-cathode region 81 to the lower end portion of the floating region 84 in the depth direction (the Z-axis direction) is set as Z3.

Each distance in the depth direction may be measured on a center of the cathode region 82 in the Y-axis direction and a center of the inter-cathode region 81. Also, an average value of the distance between the cathode region 82 and the floating region 84 may also be set as the distance Z5. Also, an average value of the distance between the inter-cathode region 81 and the floating region 84 may also be set as the distance Z3.

The distance Z5 may be smaller than the distance Z3. Accordingly, by setting the distance between the cathode region 82 in which electrons are injected and the floating region 84 small, the electron injection is easily suppressed. Also, by setting the distance Z3 larger than the distance Z5, the floating region 84 can be suppressed from contacting with the inter-cathode region 81. The distance Z3 may be 1.1 times as much as the distance Z5 or more, and may be 1.2 times as much as the distance Z5 or more, and may also be 1.5 times as much as the distance Z5 or more. Also, the distance Z5 may be zero and the distance Z3 may be larger than zero.

Although in the present example, the shape of the floating region 84 is described by using the example shown in FIG. 21, the floating region 84 in the examples shown in FIG. 14 to FIG. 20 may also have the similar shape. If the floating region 84 is formed by implanting P type dopants from the lower surface 64 side after forming both of the cathode region 82 and the inter-cathode region 81, the distance Z5 is smaller than the distance Z3 in the examples shown in FIG. 14 to FIG. 20 as well. The shape of such a floating region 84 is not limited to a case in which the floating region 84 is formed across the plurality of cathode regions 82 and the plurality of inter-cathode region 81 as shown in FIG. 21 and FIG. 22. Also, although on the cross section, the shape of the floating region 84 is a step-like shape in the vicinity of the boundary 72, the shape of the floating region 84 in another example may also be a curved shape in the vicinity of the boundary 72.

Figure 23:
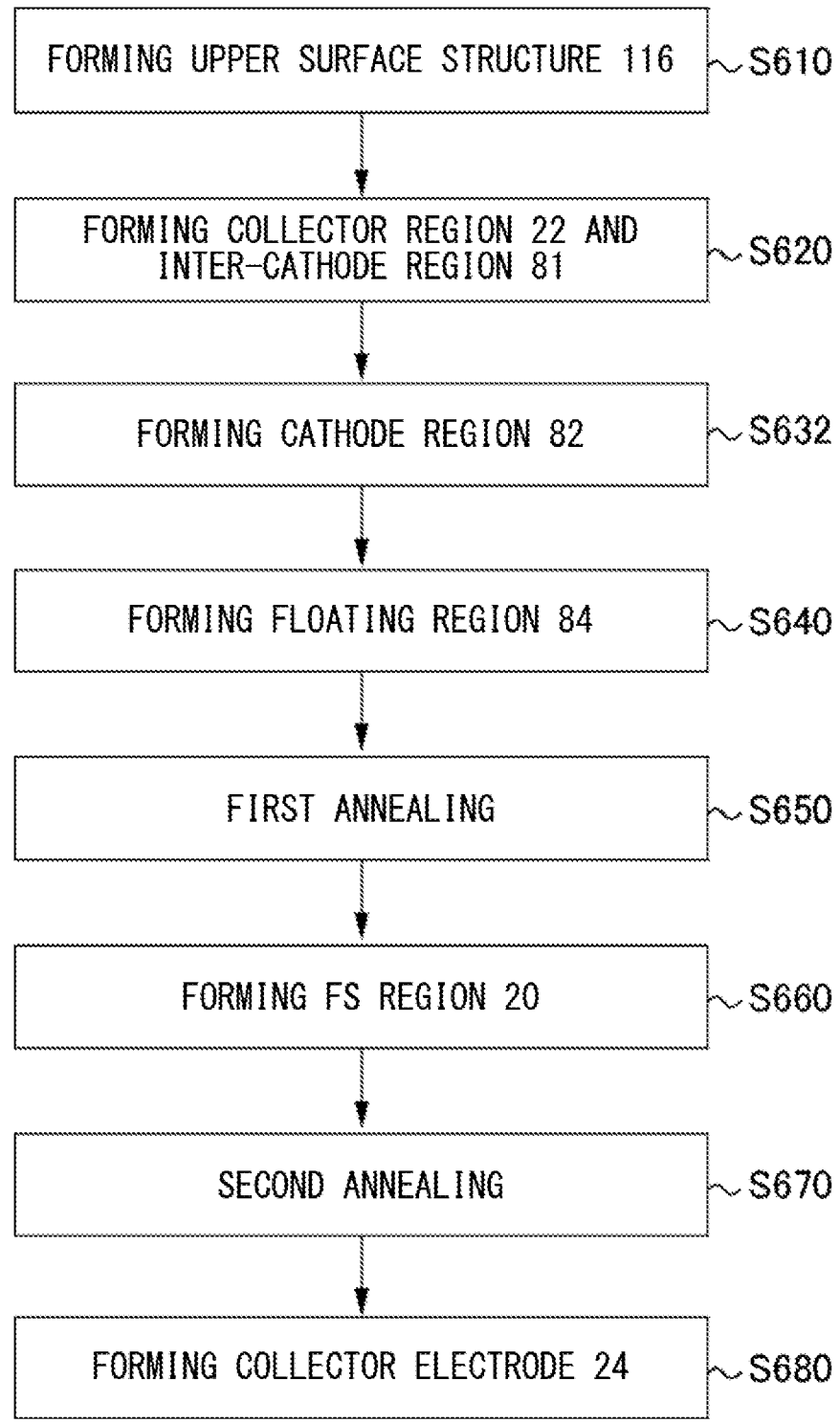
FIG. 23 shows a flow diagram of one example of a method of manufacturing the semiconductor device according to the fourth embodiment.

FIG. 23 is a flow diagram showing one example of the method of manufacturing the semiconductor device according to the fourth embodiment. In the present example, the method of manufacturing the semiconductor device having the FWD region 80 shown in FIG. 22 is shown. Steps S610 and S650 to S680 of the present example are the same as the steps S510 and S550 to S580 in FIG. 13A.

Figure 24:
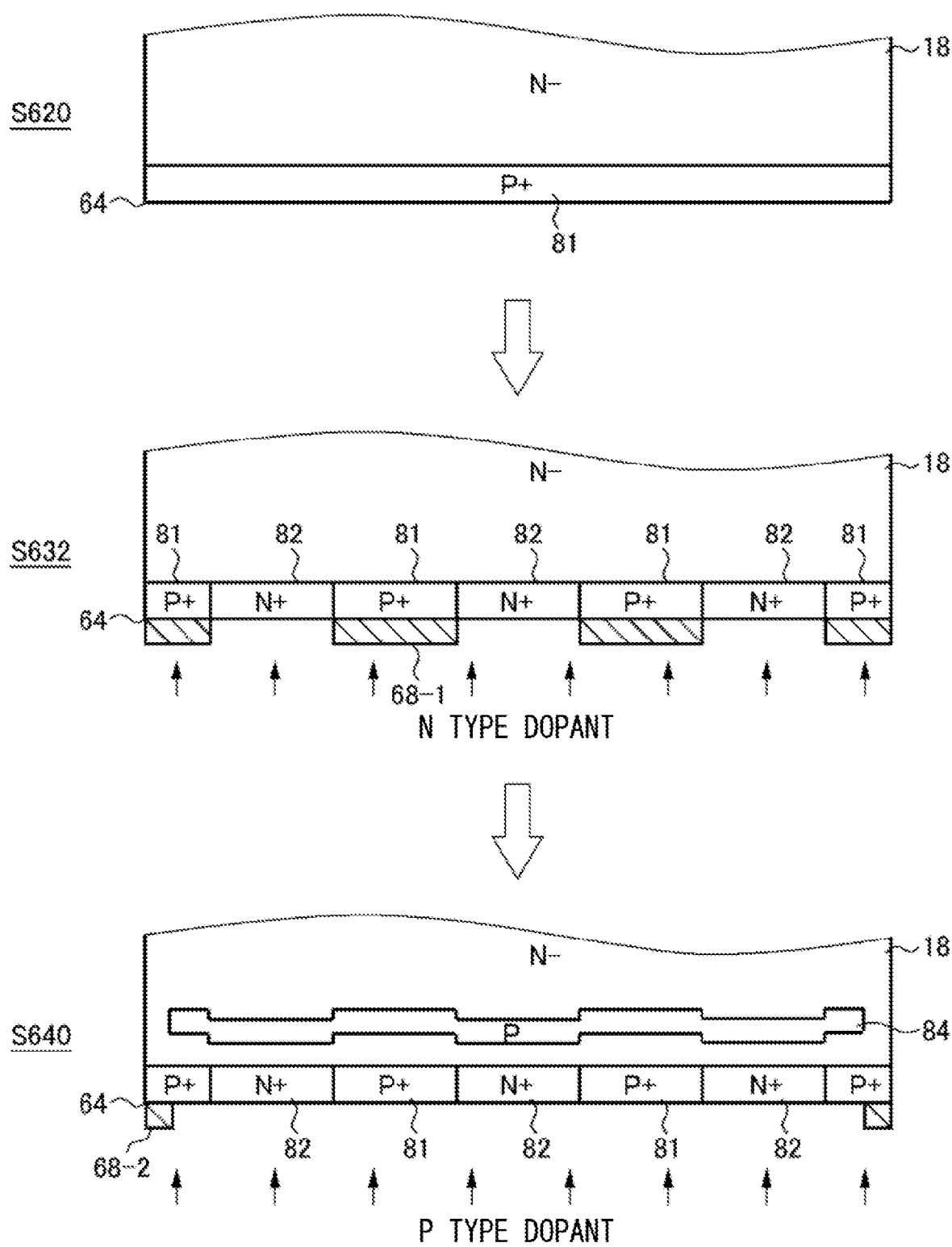
FIG. 24 shows a drawing for describing the implantation step S620 for the collector region, an implantation step S632 for the cathode region and an implantation step S640 for the floating region in FIG. 23.

FIG. 24 is a drawing for describing the P type dopant implantation step S620 in FIG. 23, implantation step S632 for the cathode region and implantation step S640 for the floating region. Although only the FWD region 80 is shown in FIG. 24, the semiconductor device may have the similar IGBT region 70 to that in the first to the third embodiments.

In the step S620, a P+ type collector region 22 and a P+ type inter-cathode region 81 are formed. The collector region 22 may be formed on the entire lower surface of the IGBT region 70. The inter-cathode region 81 may be formed on the entire lower surface of the FWD region 80. The collector region 22 and the inter-cathode region 81 may be formed in the same process. Next, in the step S632, selective counter doping of N type dopants is made into the inter-cathode region 81 of the FWD region 80 from the lower surface 64 of the semiconductor substrate 10. Accordingly, a partial region of the inter-cathode region 81 of the FWD region 80 is reversed to N+ type. In the inter-cathode region 81 of the FWD region 80, the region reversed to N+ type becomes the cathode region 82 and the region remained as P+ type remains as the inter-cathode region 81. In the step S632, implantation of N type dopants is selectively performed so that the cathode region 82 and the inter-cathode region 81 are alternately arranged in a predetermined direction. In the step S632, a region into which N type dopants are to be implanted may be selected using the mask 68-1.

Next, in the step S640, implantation of P type dopants for forming the floating region 84 is performed from the lower surface 64 of the semiconductor substrate 10. Before the implantation of P type dopants, the mask 68-1 may be removed and a new mask 68-2 may be provided on the lower surface 64 of the semiconductor substrate 10. The cathode region 82 includes both of P type dopants for forming the inter-cathode region 81 and N type dopants for forming the cathode region 82. For this reason, in the step S640, P type dopants passing through the cathode region 82 are more easily implanted, compared to P type dopants passing through the inter-cathode region 81, into a position on which a distance from the lower surface 64 is short.

Therefore, by implanting P type dopants into the cathode region 82 and the inter-cathode region 81 under the same condition, the floating region 84 in the shape described in FIG. 22 can be formed. In another example, the implantation of P type dopants may also be performed after selectively providing, on the lower surface of the cathode region 82, a mask and the like for making a range of P type dopants short.

Also, because the cathode region 82 is formed before forming the floating region 84, a possibility of generation or adhesion of the particles 86 described in FIG. 4B can be reduced. For this reason, influences such as junction leakage, withstand voltage failure, and lowered switching characteristics can be suppressed.

Figure 25:
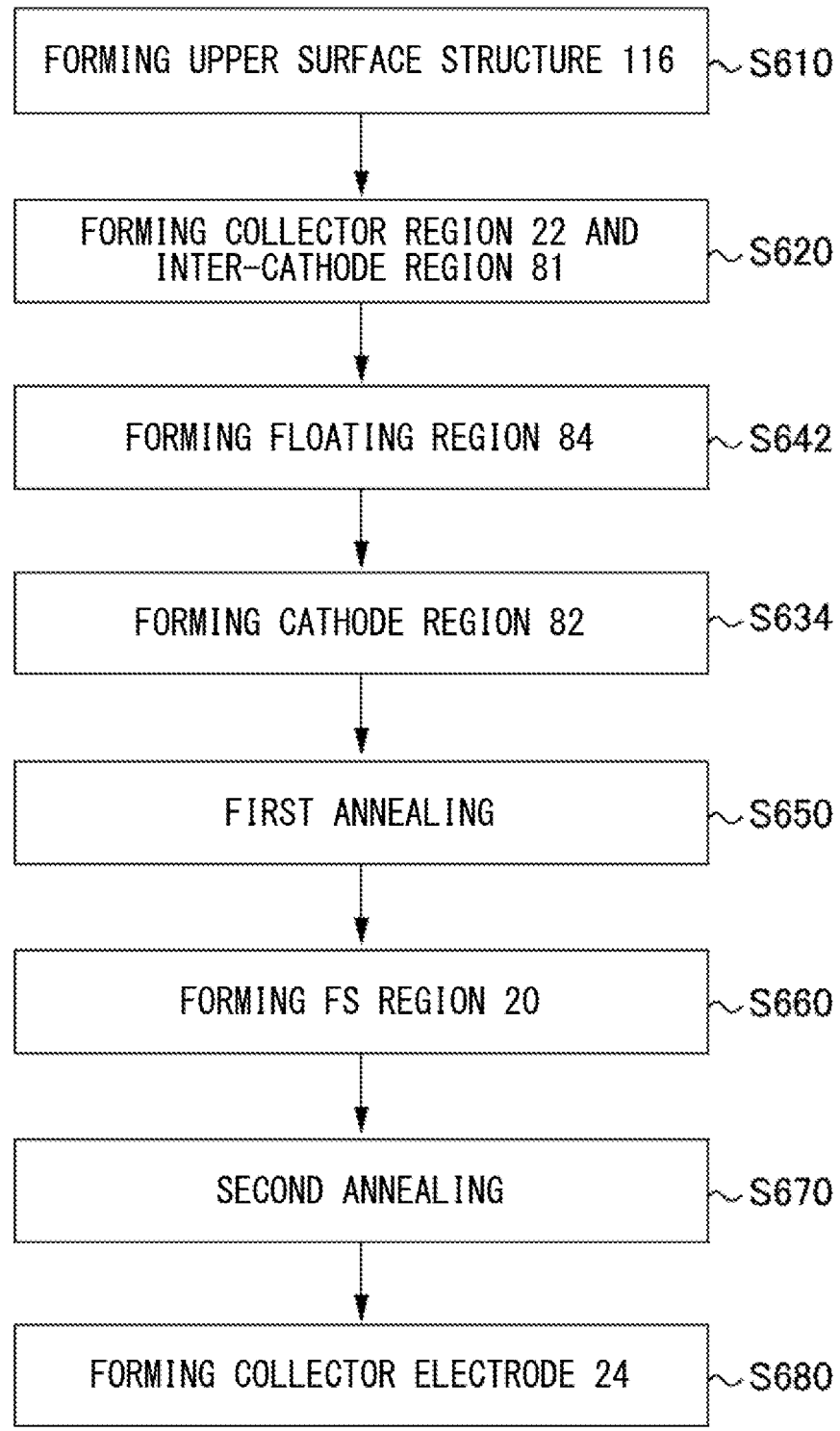
FIG. 25 shows a flow diagram of another example of the method of manufacturing the semiconductor device according to the fourth embodiment.

FIG. 25 is a flow diagram showing another example of the method of manufacturing the semiconductor device according to the fourth embodiment. Steps S610 and S650 to S680 in the present example are the same as the steps S510 and S550 to S580 in FIG. 13A. Also, when comparing the manufacturing method of the present example and the manufacturing method shown in FIG. 23 and FIG. 24, the sequential order of the implantation step for the floating region is swapped with the implantation step for the cathode region.

Figure 26:
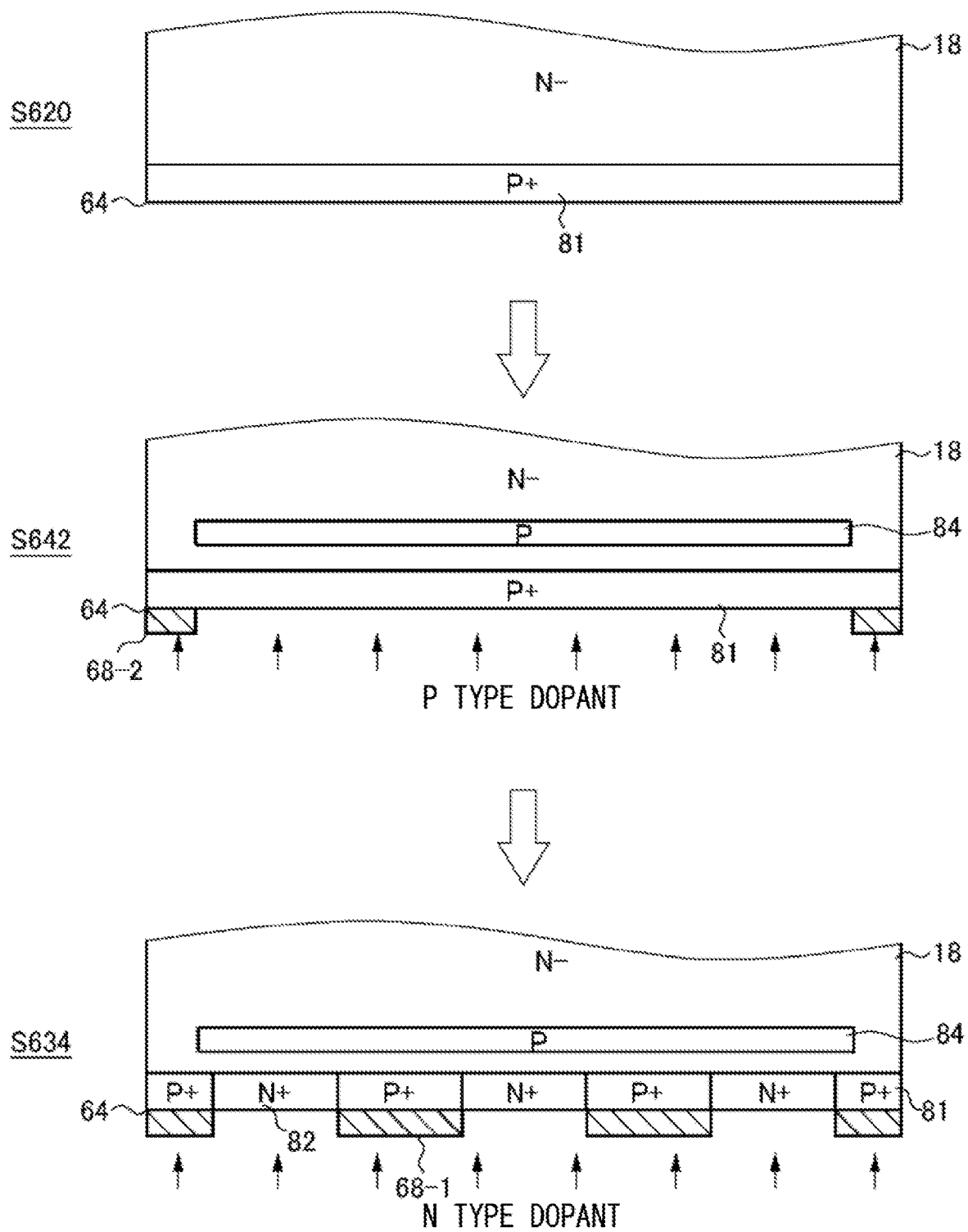
FIG. 26 shows a drawing for describing the implantation step S620 for the collector region, an implantation step S642 for the floating region and an implantation step S634 for the cathode region in FIG. 25.

FIG. 26 is a drawing for describing the P type dopant implantation step S620 in FIG. 25, an implantation step S642 for the floating region and an implantation step S634 for the cathode region. Although only the FWD region 80 is shown in FIG. 26, the semiconductor device may have the similar IGBT region 70 to that in the first to the third embodiments.

In the step S620, a P+ type inter-cathode region 81 is formed. The step S620 is the same as the step S620 in FIG. 23 and FIG. 24. Next, in the step S642, implantation of P type dopants for forming the floating region 84 is performed from the lower surface 64 of the semiconductor substrate 10. The mask 68-2 may be provided on the lower surface 64 of the semiconductor substrate 10 before the implantation of P type dopants.

Next, in the step S634, selective counter doping of N type dopants is made into the inter-cathode region 81 of the FWD region 80 from the lower surface 64 of the semiconductor substrate 10. Accordingly, a partial region of the inter-cathode region 81 is reversed to N+ type. In the inter-cathode region 81 of the FWD region 80, the region reversed to N+ type becomes the cathode region 82 and the region remained as P+ type remains as the inter-cathode region 81. The step S634 is similar to the step S632 in FIG. 23 and FIG. 24.

In the present example, the implantation of P type dopants for forming the floating region 84 is performed before forming the cathode region 82. For this reason, the floating region 84 is formed on a certain depth position. That is, the floating region 84 can be easily formed on a predetermined depth position. For example, when the floating region 84 is formed to the drift region 18 having a relatively low doping concentration, a region to be reversed to P type easily expands and it may be difficult to control the depth position of the floating region 84. According to the present example, because the entire floating region 84 can be easily formed within the FS region 20 having a relatively high doping concentration, the position of the floating region 84 can be easily controlled.

Figure 27A:
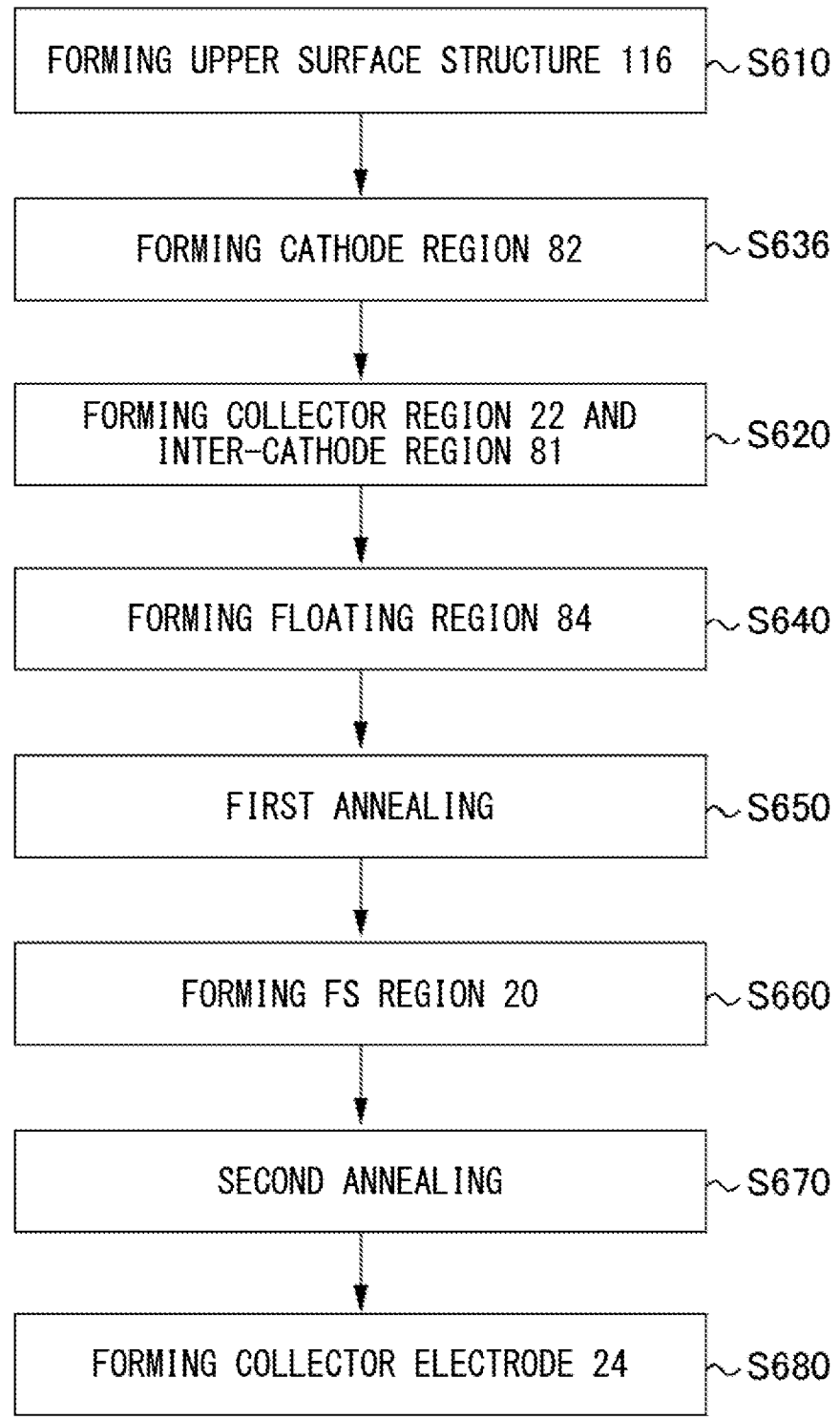
FIG. 27A shows a flow diagram of another example of the method of manufacturing the semiconductor device according to the fourth embodiment.

FIG. 27A is a flow diagram showing another example of the method of manufacturing the semiconductor device according to the fourth embodiment. Steps S610 and S620 to S680 of the present example are the same as the steps S610 and S620 to S680 in FIG. 23. Also, when comparing the manufacturing method of the present example and the manufacturing method shown in FIG. 23 and FIG. 24, the sequential order of the implantation step for the cathode region is swapped with the implantation step for the collector region and the inter-cathode region.

In the present example, an implantation step S636 for the cathode region is performed after the step S610. In the step S636, the implantation of N type dopants is selectively performed, using the mask 68-1 as shown in the step S632 in FIG. 24 and the like, into a region in which the cathode region 82 is to be formed. The mask 68-1 is provided covering a region in which the inter-cathode region 81 is to be formed on the entire lower surface of the IGBT region 70 and the FWD region 80.

Next, in the step S620, the implantation of P type dopants is performed from the lower surface 64 of the semiconductor substrate 10 to form the collector region 22 and the inter-cathode region 81. In the step S620, the implantation of P type dopants may be performed into the entire lower surface 64 of the semiconductor substrate 10. That is, in the step S636, the implantation of P type dopants may also be performed into the cathode region 82 into which N type dopants have been implanted in the step S636. In this case, even if P type dopants have been implanted in the step S620, the implantation of N type dopants is performed in a concentration so that the cathode region 82 can be maintained as N+ type in the step S636.

After the step S620, the floating region 84 is formed. In the present example as well, similar to the examples in FIG. 23 and FIG. 24, the floating region 84 in the shape described in FIG. 22 can be formed. Also, because the cathode region 82 is formed before forming the floating region 84, a possibility of generation or adhesion of the particles 86 described in FIG. 4B can be reduced. For this reason, influences such as junction leakage, withstand voltage failure, and lowered switching characteristics can be suppressed.

Figure 27B:
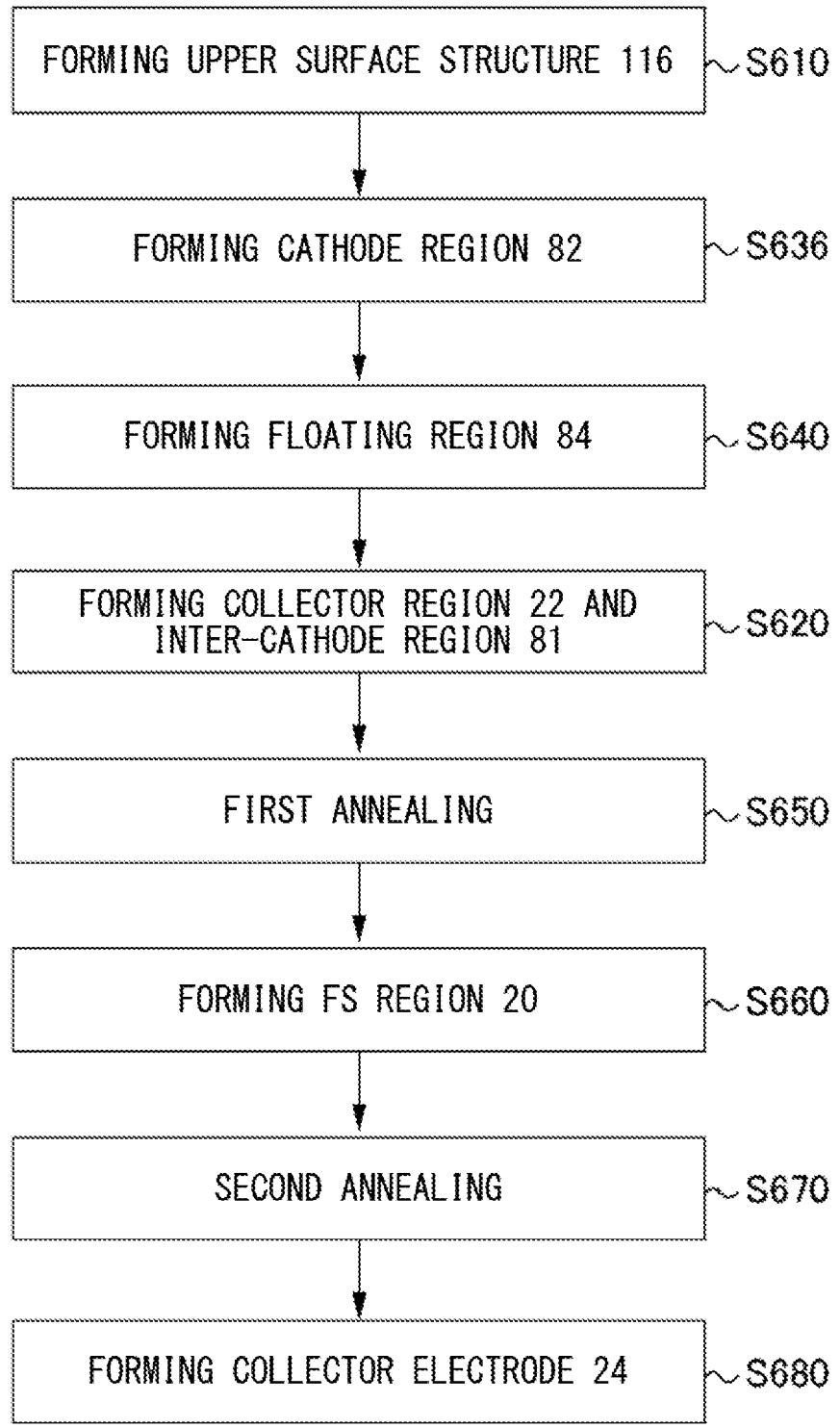
FIG. 27B shows a flow diagram of another example of the method of manufacturing the semiconductor device according to the fourth embodiment.

FIG. 27B is a flow diagram showing another example of the method of manufacturing the semiconductor device according to the fourth embodiment. The manufacturing method of the present example is different from the manufacturing method described in FIG. 27A in that the sequential order of the step S620 is swapped with the step S640. The other steps of the manufacturing method of the present example are the same as those in the example of FIG. 27A.

In the present example, an implantation step S640 for the floating region is performed after the step S636. In the step S640, as shown in FIG. 24 and the like, the implantation of P type dopants may be performed using the mask 68-2. After the step S640, in the step S620, the implantation of P type dopants is performed from the lower surface 64 of the semiconductor substrate 10 to form the collector region 22 and the inter-cathode region 81. The step S620 is similar to the step S620 in FIG. 27A. In the present example as well, because the floating region 84 is formed after selectively forming the cathode region 82, the floating region 84 in the shape described in FIG. 22 can be formed.

Figure 28A:
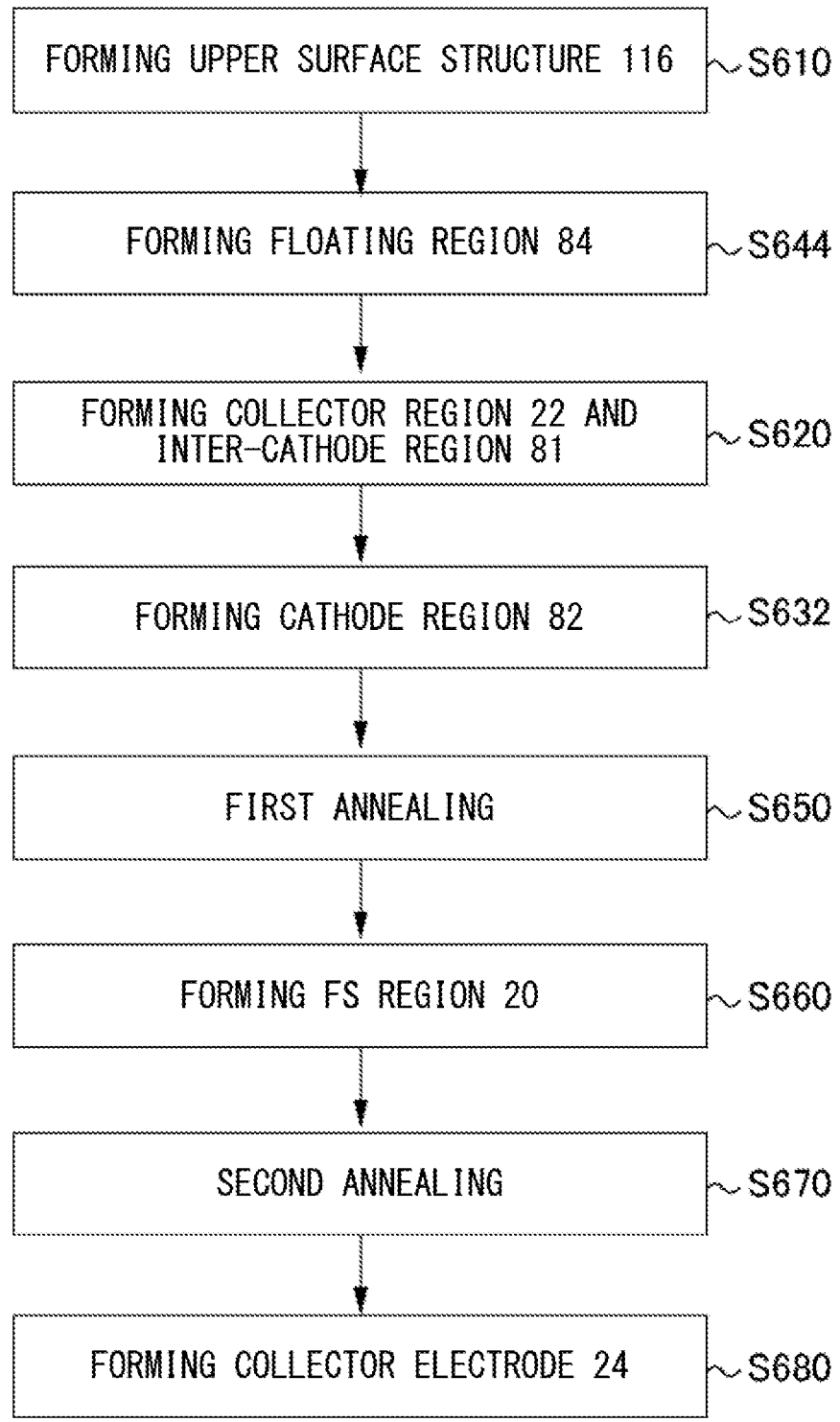
FIG. 28A shows a flow diagram of another example of the method of manufacturing the semiconductor device according to the fourth embodiment.

FIG. 28A is a flow diagram showing another example of the method of manufacturing the semiconductor device according to the fourth embodiment. Steps S610 and S620 to S680 of the present example are the same as the steps S610 and S620 to S680 in FIG. 23. Also, when comparing the manufacturing method of the present example and the manufacturing method shown in FIG. 23 and FIG. 24, the sequential orders of the implantation step for the floating region, the implantation step for the cathode region and the implantation step for the collector region and the inter-cathode region are swapped.

In the present example, an implantation step S644 for the floating region is performed after the step S610. In the step S644, the implantation of P type dopants is selectively performed, using the mask 68-2 as shown in the step S642 in FIG. 26 and the like, into a region in which the floating region 84 is to be formed.

Next, in the step S620, the implantation of P type dopants is performed from the lower surface 64 of the semiconductor substrate 10 to form the collector region 22 and the inter-cathode region 81. In the step S620, the implantation of P type dopants may be performed into the entire lower surface 64 of the semiconductor substrate 10.

Next, in the step S632, selective counter doping of N type dopants is made into the inter-cathode region 81 of the FWD region 80 from the lower surface 64 of the semiconductor substrate 10. Accordingly, a part of the inter-cathode region 81 is reversed to an N+ type region to form the cathode region 82.

In the present example as well, similar to the examples in FIG. 25 and FIG. 26, the floating region 84 is formed on a certain depth position. That is, the floating region 84 can be easily formed on a predetermined depth position.

Figure 28B:
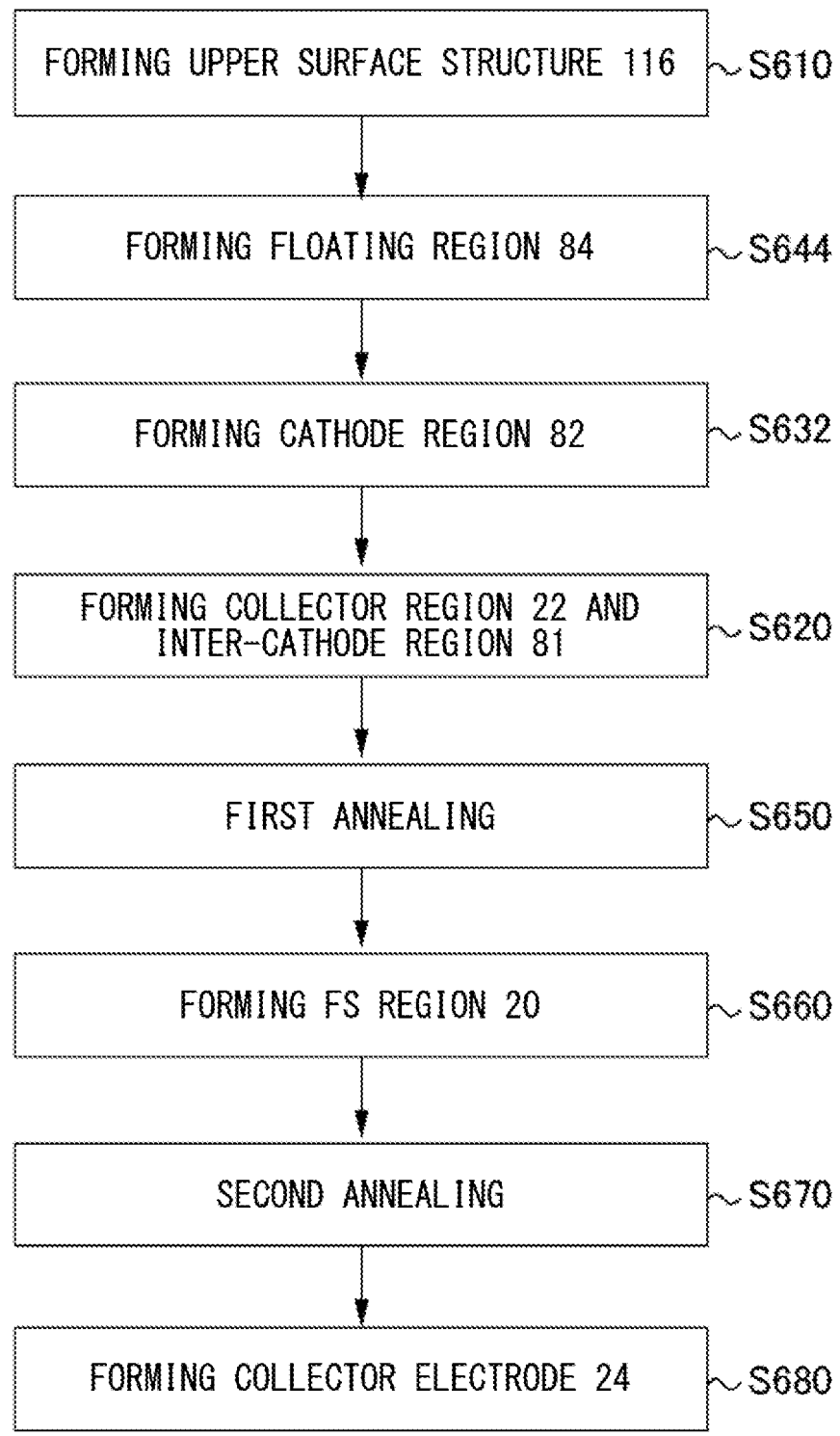
FIG. 28B shows a flow diagram of another example of the method of manufacturing the semiconductor device according to the fourth embodiment.

FIG. 28B is a flow diagram showing another example of the method of manufacturing the semiconductor device according to the fourth embodiment. The manufacturing method of the present example is different from the manufacturing method described in FIG. 28A in that the sequential order of the step S620 is swapped with the step S632. The other steps of the manufacturing method of the present example are the same as those in the example of FIG. 28A.

In the present example, the step S620 and the step S632 are performed after the step S644. The step S620 and the step S632 are similar to the step S620 and the step S636 of FIG. 27A.

In the present example as well, similar to the examples of FIG. 25 and FIG. 26, the floating region 84 is form on a certain depth position. That is, the floating region 84 can be easily formed on a predetermined depth position.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising a diode region provided in a semiconductor substrate, the diode region comprising:
   a base region of a first conductivity type that is provided to be exposed on an upper surface of the semiconductor substrate;

a cathode region of a second conductivity type that is provided to be exposed on a lower surface of the semiconductor substrate;

an inter-cathode region of the first conductivity type that is provided to be exposed on the lower surface of the semiconductor substrate and that is alternately arranged with the cathode region in a predetermined direction such that the inter-cathode region is sandwiched between first and second portions of the cathode region; and a floating region of the first conductivity type that is provided directly above the cathode region, wherein the floating region includes first and second portions, each of the first and second portions of the floating region disposed directly above a respective one of the first and second portions of the cathode region and overlapping the inter-cathode region.

2. The semiconductor device according to claim 1 further comprising a transistor region that is provided in the semiconductor substrate and that is arranged next to the diode region in a top view of the semiconductor substrate.

3. The semiconductor device according to claim 1, wherein the inter-cathode region and the floating regions are arranged apart from each other in a depth direction of the semiconductor substrate.

4. The semiconductor device according to claim 1, wherein the diode region further comprises a dummy trench portion that is provided extending in an extending direction on the upper surface of the semiconductor substrate.

5. The semiconductor device according to claim 1, wherein the cathode regions is thicker, in a depth direction of the semiconductor substrate, than the inter-cathode region in the diode region.

6. The semiconductor device according to claim 1, wherein in a depth direction of the semiconductor substrate, a distance between an upper end portion of the cathode region and a lower end portion of the floating region is shorter than a distance between an upper end portion of the inter-cathode region and the lower end portion of the floating region.

7. The semiconductor device of claim 1, wherein an area of the floating region provided in the diode region is larger than an area of the cathode region in a top view of the semiconductor device.

8. The semiconductor device according to claim 1, wherein an area of the inter-cathode region provided in the diode region is larger than an area of the cathode region in a top view of the semiconductor substrate.

* * * * *